US010818601B1

(12) United States Patent
Deguchi et al.

(10) Patent No.: US 10,818,601 B1
(45) Date of Patent: Oct. 27, 2020

(54) SEMICONDUCTOR DEVICE AND METHOD OF MANUFACTURING THE SAME

(71) Applicant: Renesas Electronics Corporation, Tokyo (JP)

(72) Inventors: Yoshinori Deguchi, Gunma (JP); Akinobu Watanabe, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/911,852

(22) Filed: Jun. 25, 2020

Related U.S. Application Data

(63) Continuation of application No. 15/774,664, filed as application No. PCT/JP2016/055198 on Feb. 23, 2016.

(51) Int. Cl.
*H01L 23/535* (2006.01)
*H01L 23/522* (2006.01)
(Continued)

(52) U.S. Cl.
CPC ........ *H01L 23/535* (2013.01); *H01L 21/3205* (2013.01); *H01L 21/768* (2013.01); (Continued)

(58) Field of Classification Search
CPC ..................................................... H01L 23/535
(Continued)

(56) References Cited

U.S. PATENT DOCUMENTS 6,087,716 A * 7/2000 Ikeda ................ H01L 23/49572 257/676
2003/0218245 A1 11/2003 Matsuzawa et al.
(Continued)

FOREIGN PATENT DOCUMENTS

JP 2003-338519 A 11/2003
JP 2005-243907 A 9/2005
(Continued)

OTHER PUBLICATIONS

International Search Report from International Patent Application No. PCT/JP2016/055198, dated May 31, 2016.
(Continued)

*Primary Examiner* — Jami Valentine Miller
(74) *Attorney, Agent, or Firm* — SGPatents PLLC

(57) ABSTRACT

A semiconductor device includes a semiconductor substrate SB and a wiring structure formed on a main surface of the semiconductor substrate SB. The uppermost first wiring layer among a plurality of wiring layers included in the wiring structure includes a pad PD, and the pad PD has a first region for bonding a copper wire and a second region for bringing a probe into contact with the pad. A second wiring layer that is lower by one layer than the first wiring layer among the plurality of wiring layers included in the wiring structure includes a wiring line M6 arranged immediately below the pad PD, the wiring line M6 is arranged immediately below a region other than the first region of the pad PD, and no conductor pattern in the same layer as a layer of the wiring line M6 belong is formed immediately below the first region of the pad PD.

17 Claims, 25 Drawing Sheets

(51) Int. Cl.

| | |
|---|---|
| ***H01L 21/768*** | (2006.01) |
| ***H01L 21/66*** | (2006.01) |
| ***H01L 23/538*** | (2006.01) |
| ***H01L 23/00*** | (2006.01) |
| ***H01L 23/58*** | (2006.01) |
| ***H01L 21/3205*** | (2006.01) |

(52) U.S. Cl.

CPC ............ *H01L 22/32* (2013.01); *H01L 23/522* (2013.01); *H01L 23/5226* (2013.01); *H01L 23/5384* (2013.01); *H01L 23/562* (2013.01); *H01L 23/585* (2013.01); *H01L 24/03* (2013.01); *H01L 24/05* (2013.01); *H01L 24/06* (2013.01); *H01L 24/48* (2013.01); *H01L 24/45* (2013.01); *H01L 2224/05* (2013.01); *H01L 2224/05013* (2013.01); *H01L 2224/05624* (2013.01); *H01L 2224/32014* (2013.01); *H01L 2224/32225* (2013.01); *H01L 2224/32245* (2013.01); *H01L 2224/45147* (2013.01); *H01L 2224/45565* (2013.01); *H01L 2224/45664* (2013.01); *H01L 2224/48227* (2013.01); *H01L 2224/48247* (2013.01); *H01L 2224/48463* (2013.01); *H01L 2224/73265* (2013.01); *H01L 2924/15311* (2013.01); *H01L 2924/181* (2013.01)

(58) Field of Classification Search

USPC .......................................................... 257/758

See application file for complete search history.

(56) References Cited

U.S. PATENT DOCUMENTS

| | | | |
|---|---|---|---|
| 2005/0121805 A1 | 6/2005 | Matsuzawa et al. | |
| 2006/0279001 A1 | 12/2006 | Nishida | |
| 2007/0182001 A1 | 8/2007 | Kanzaki et al. | |
| 2008/0062239 A1* | 3/2008 | Yokoyama | H05B 3/10 347/202 |
| 2009/0184424 A1 | 7/2009 | Furusawa et al. | |
| 2010/0155960 A1 | 6/2010 | Kanzaki et al. | |
| 2010/0314620 A1 | 12/2010 | Furusawa et al. | |
| 2011/0074019 A1* | 3/2011 | Yasunaga | H01L 24/43 257/737 |
| 2012/0153444 A1* | 6/2012 | Haga | H01L 23/4334 257/666 |
| 2012/0273973 A1 | 11/2012 | Tomoda et al. | |
| 2013/0102093 A1* | 4/2013 | Ogawa | H01L 24/97 438/15 |
| 2013/0241067 A1 | 9/2013 | Furusawa et al. | |
| 2013/0256906 A1 | 10/2013 | Mori et al. | |
| 2015/0035156 A1* | 2/2015 | Ichinose | H01L 21/76879 257/758 |
| 2015/0076709 A1 | 3/2015 | Mori et al. | |
| 2015/0206934 A1* | 7/2015 | Funaya | H01L 21/78 438/3 |
| 2016/0027731 A1 | 1/2016 | Mori et al. | |
| 2018/0374795 A1 | 12/2018 | Deguchi et al. | |

FOREIGN PATENT DOCUMENTS

| | | |
|---|---|---|
| JP | 2009-170763 A | 7/2009 |
| JP | 2013-206905 A | 10/2013 |
| JP | 2014-143236 A | 8/2014 |

OTHER PUBLICATIONS

Extended European Search Report and Search Opinion dated Jan. 9, 2020, in European Patent Application No. 16891415.8.

Office Action dated Dec. 4, 2018, in Japanese Patent Application No. 2018-501443.

* cited by examiner

SEMICONDUCTOR DEVICE AND METHOD OF MANUFACTURING THE SAME

TECHNICAL FIELD

The present invention relates to a semiconductor device and a method of manufacturing the same, and is preferably used for, for example, a semiconductor device to which a copper wire is connected and a method of manufacturing the semiconductor device.

BACKGROUND ART

A wire is connected to a pad of a semiconductor chip. While a gold wire is cited as the wire connected to the pad, usage of a copper wire has been recently studied.

Japanese Patent Application Laid-open Publication No. 2014-143236 (Patent Document 1) describes a technique related to a semiconductor device applicable to copper wire bonding.

RELATED ART DOCUMENT

Patent Document

Patent Document 1: Japanese Patent Application Laid-open Publication No. 2014-143236

SUMMARY OF THE INVENTION

Problems to be Solved by the Invention

In the semiconductor device to which the copper wire is connected, improvement in the reliability has been desired.

Other objects and novel characteristics will be apparent from the description of the present specification and the accompanying drawings.

Means for Solving the Problems

According to one embodiment, a semiconductor device includes: a semiconductor chip having a pad; a copper wire electrically connected to the pad of the semiconductor chip; and a resin sealing portion sealing the semiconductor chip and the copper wire. In the semiconductor chip, the pad has a first region for bonding of the copper wire and a second region for bringing a probe into contact with the pad. In the semiconductor chip, a wiring layer that is lower by one layer than the pad includes a first wiring line arranged immediately below the pad. The first wiring line is arranged immediately below a region other than the first region of the pad, and no conductor pattern in the same layer as the layer of a first wiring line is formed immediately below the first region of the pad.

According to one embodiment, a semiconductor device includes: a semiconductor substrate; and a wiring structure formed on a main surface of the semiconductor substrate. The uppermost first wiring layer among a plurality of wiring layers included in the wiring structure includes a pad, and the pad has a first region for bonding a copper wire and a second region for bringing a probe into contact with the pad. A second wiring layer that is lower by one layer than the first wiring layer among the plurality of wiring layers included in the wiring structure includes a first wiring line arranged immediately below the pad, the first wiring line is arranged immediately below a region other than the first region of the pad, and no conductor pattern in the same layer as a layer of the first wiring line is formed immediately below the first region of the pad.

According to one embodiment, a process of manufacturing a semiconductor device includes: (a) a step of preparing a semiconductor substrate; (b) a step of forming a wiring structure on a main surface of the semiconductor substrate; (c) a step of performing a probing check to that a probe is brought into contact with a pad included in the uppermost first wiring layer among a plurality of wiring layers included in the wiring structure; and (d) a step of electrically connecting a copper wire to the pad. The pad has a first region for bonding the copper wire and a second region for bringing the probe into contact with the pad. A second wiring layer that is lower by one layer than the first wiring layer among the plurality of wiring layers includes a first wiring line arranged immediately below the pad, the first wiring line is arranged immediately below a region other than the first region of the pad, and no conductor pattern in the same layer as a layer of the first wiring line is formed immediately below the first region of the pad.

Effects of the Invention

According to one embodiment, the reliability of the semiconductor device can be improved.

BRIEF DESCRIPTIONS OF THE DRAWINGS

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments will be described in detail based on the accompanying drawings. Note that components having the same function are denoted by the same reference symbols throughout all the drawings for describing the embodiments, and the repetitive description thereof will be omitted. Also, in the embodiments described below, description of the same or similar parts is not repeated in principle unless otherwise particularly required.

Also, in some drawings used in the embodiments, hatching is omitted even in a cross-sectional view so as to make the drawings easy to see. And, hatching is used even in a plan view so as to make the drawings easy to see.

Embodiment

<Overall Structure of Semiconductor Chip>

A semiconductor device according to the present embodiment will be described with reference to drawings.

Figure 1:
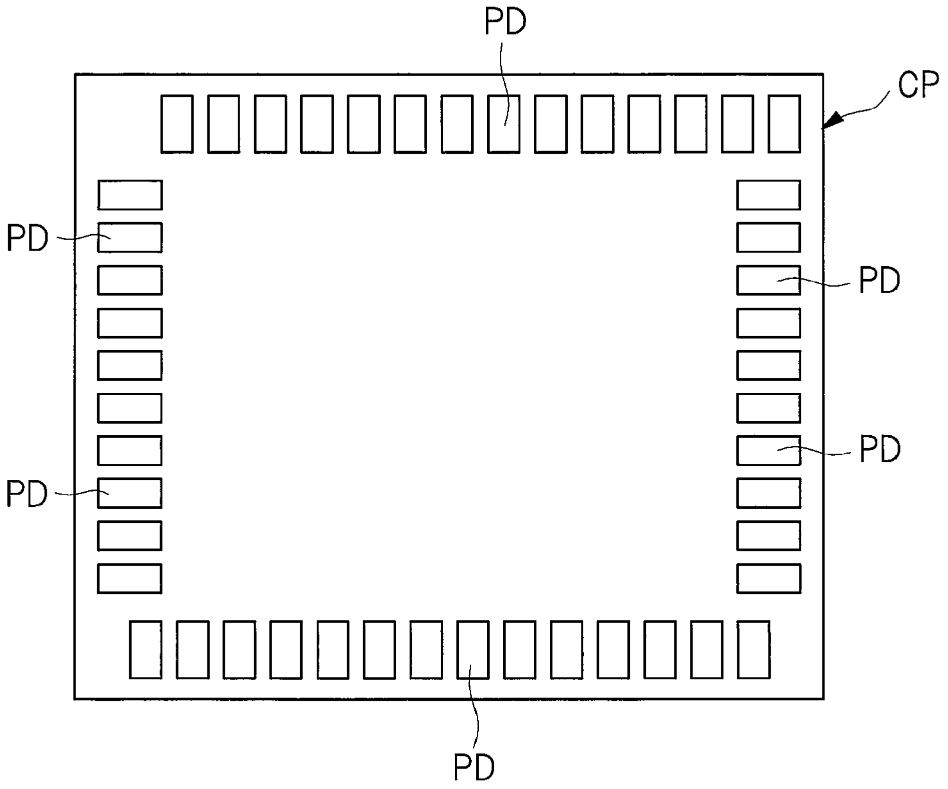
FIG. 1 is an overall plan view of a semiconductor device according to one embodiment.

FIG. 1 is an overall plan view of a semiconductor device (semiconductor chip) CP according to the present embodiment, and FIG. 1 shows an overall plan view of an upper surface side of the semiconductor device CP.

The semiconductor device (semiconductor chip) CP of the present embodiment has an upper surface which is one main surface, and a back surface (lower surface) which is the other main surface opposite to the upper surface, and FIG. 1 shows the upper surface of the semiconductor device CP. In the semiconductor device CP, note that the main surface on which the pad PD is formed is referred to as upper surface of the semiconductor device CP, and the main surface opposite to the main surface (that is, the upper surface) on which the pad PD is formed is referred to as back surface of the semiconductor device CP.

As shown in FIG. 1, the semiconductor device CP includes a plurality of pads (a pad electrode, an electrode pad, and a bonding pad) PD on its upper surface. The pad PD functions as an external connection terminal of the semiconductor device CP. The pad PD is a pad for the wire bonding. When a semiconductor package or others is manufactured by using the semiconductor device CP, a wire (corresponding to a wire BW described later) is electrically connected to the pad PD.

A plane shape of the semiconductor device CP is quadrangular, more specifically rectangular. However, a corner of the rectangle may be rounded. As shown in FIG. 1, the plurality of pads PD are arranged side by side along the periphery of the upper surface of the semiconductor device CP. In the case of FIG. 1, the plurality of pads PD are arranged (arrayed) along four sides of the upper surface of the semiconductor device CP. However, the arrangement is not limited to this case, and the plurality of pads PD may be arranged (arrayed) along three sides, two sides, or one side in some cases. In the case of FIG. 1, the pads are arrayed in one row. However, the array is not limited to this case, and the pads may be arrayed in, for example, two rows, or a so-called staggered arrangement. The number of the pads PD included in the semiconductor device CP may be changed if needed.

<Semiconductor Package Structure>

Figure 2:
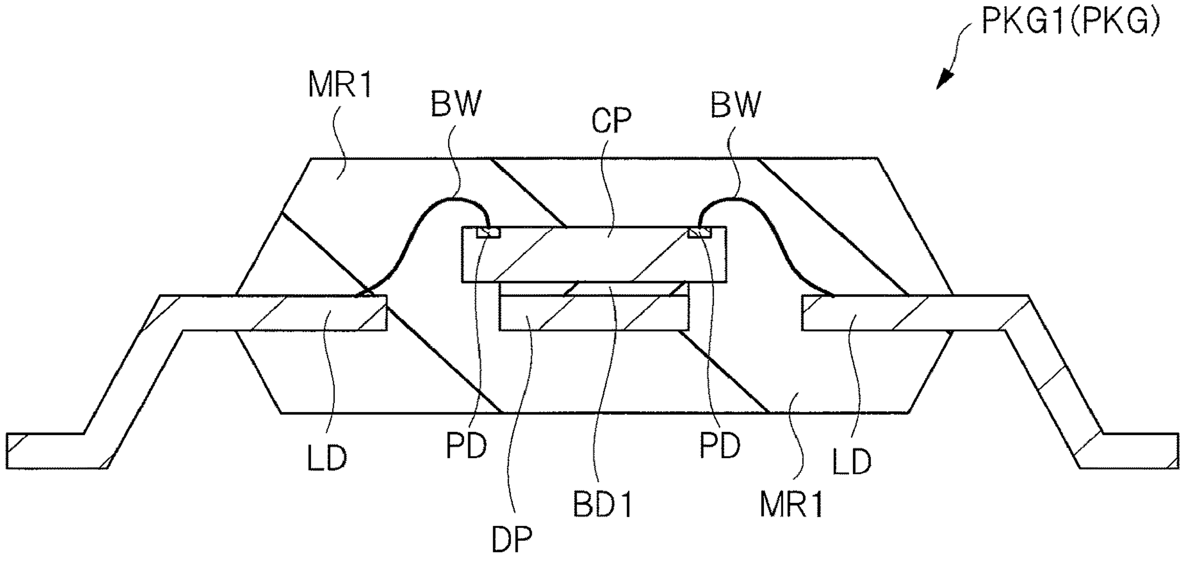
FIG. 2 is a cross-sectional view showing an example of a semiconductor device (semiconductor package) obtained by packaging the semiconductor device (semiconductor chip) of FIG. 1.
Figure 3:
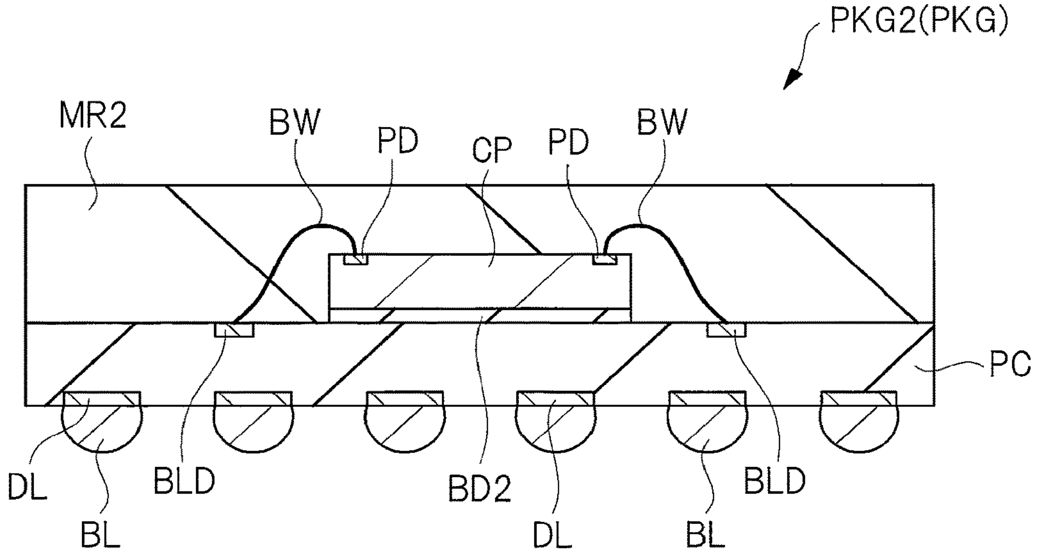
FIG. 3 is a cross-sectional view showing another example of the semiconductor device (semiconductor package) obtained by packaging the semiconductor device (semiconductor chip) of FIG. 1.

FIG. 2 is a cross-sectional view schematically showing an example of a semiconductor device (semiconductor package) PKG obtained by packaging the semiconductor device (semiconductor chip) CP of the present embodiment, and FIG. 3 is a cross-sectional view showing another example. Note that the semiconductor device PKG shown in FIG. 2 is referred to as semiconductor device PKG1 by adding a reference symbol PKG1 while the semiconductor device PKG shown in FIG. 3 is referred to as semiconductor device PKG2 by adding a reference symbol PKG2.

The semiconductor device (semiconductor package) PKG1 shown in FIG. 2 is a semiconductor package having been manufactured by using a lead frame. The semiconductor device PKG1 includes the semiconductor device (semiconductor chip) CP, a die pad (chip mounting portion) DP on which the semiconductor device CP is supported or mounted, a plurality of leads LD, a plurality of wires (bonding wires) BW electrically connecting the plurality of leads LD respectively to the plurality of pads PD on the upper surface of the semiconductor device CP, and a sealing portion MR1 sealing the semiconductor device CP, die pad DP, leads LD, and wires BW.

The sealing portion (sealing resin portion) MR1 is a sealing resin portion made of, for example, a resin material such as thermosetting resin, and may contain a filler or others. The semiconductor device CP, the plurality of leads LD, and the plurality of wires BW are sealed by the sealing portion MR1, and are therefore electrically and mechanically protected.

The semiconductor device CP is mounted (arranged) on the upper surface of the die pad DP so that the upper surface of the semiconductor device CP faces upward and so that the back surface of the semiconductor device CP is bonded and fixed to the upper surface of the die pad DP via a bonding material (die bond, adhesive) BD1. The semiconductor device CP is sealed inside the sealing portion MR1, and is therefore not exposed from the sealing portion MR1.

Each lead (lead portion) LD is made of a conductor, preferably made of a metal material such as copper (Cu) or copper alloy. Each lead LD is made up of an inner lead portion which is a part of lead LD arranged inside the sealing portion MR1, and an outer lead portion which is a part of the lead LD arranged outside the sealing portion MR1. The outer lead portion protrudes from a side surface of the sealing portion MR1 to outside of the sealing portion MR1.

The outer lead portion of each lead LD is bent so that a lower surface of vicinity of an end of the outer lead portion is slightly lower than a lower surface of the sealing portion MR1. The outer lead portion of the lead LD functions as an external terminal of the semiconductor device PKG1.

Each pad PD on the upper surface of the semiconductor device CP is electrically connected to the inner lead portion of each lead LD via a wire (bonding wire) BW which is a conductive connecting member. In other words, one end of both ends of each wire BW is connected to each pad PD of the semiconductor device CP while the other end thereof is connected to the upper surface of the inner lead portion of each lead LD. The wire BW has conductivity, and is specifically a copper (Cu) wire containing copper (Cu) as a main component. The wire BW is sealed inside the sealing portion MR1, and is not exposed from the sealing portion MR1.

Note that the description here is about a case of a QFP (Quad Flat Package) type semiconductor package as the semiconductor device PKG1. However, the semiconductor device PKG1 is not limited to this type, and can be variously changed in a type. For example, a different package structure such as a QFN (Quad Flat Non-leaded Package) structure and a SOP (Small Out-Line Package) structure may be applicable.

The semiconductor device (semiconductor package) PKG2 shown in FIG. 3 is a semiconductor package having been manufactured by using a wiring board. The semiconductor device PKG2 includes: the semiconductor device (semiconductor chip) CP; a wiring board PC on which the semiconductor device CP is mounted (supported); a plurality of wires BW electrically connecting the plurality of pads PD on the upper surface of the semiconductor device CP to a plurality of connection terminals BLD of the wiring board PC in one-to-one correspondence; and a sealing portion MR2 covering the upper surface of the wiring board PC so as to cover the semiconductor device CP and the wires BW. The semiconductor device PKG2 further includes a plurality of solder balls BL as external terminals which are arranged in an area array on the lower surface of the wiring board PC.

The wiring board PC has an upper surface and a lower surface which are main surfaces opposite to each other. The semiconductor device CP is mounted (arranged) on the upper surface of the wiring board PC so that the upper surface of the semiconductor device CP faces upward and so that the back surface of the semiconductor device CP is bonded and fixed to the upper surface of the wiring board PC via a bonding material (die bond, adhesive) BD2. The semiconductor device CP is sealed inside the sealing portion MR2, and is not exposed from the sealing portion MR2.

A plurality of connection terminals (bonding leads) BLD are formed on the upper surface of the wiring board PC, and a plurality of conductive lands DL are formed on the lower surface of the wiring board PC. The plurality of connection terminals BLD on the upper surface of the wiring board PC are electrically connected to the plurality of conductive lands DL on the lower surface of the wiring board PC, respectively, via wiring lines of the wiring board PC. The wiring lines of the wiring board PC are wiring lines on the upper surface of the wiring board PC, via wiring lines of the wiring board PC, internal wiring lines of the wiring board PC, wiring lines on the lower surface of the wiring board PC and others. Onto each conductive land DL, a solder ball BL is connected (formed) as a protruding electrode. Therefore, a plurality of solder balls BL are arranged in an array pattern on the lower surface of the wiring board PC, and the plurality of solder balls BL can function as external terminals of the semiconductor device PKG2.

Each pad PD on the upper surface of the semiconductor device CP is electrically connected to each connection terminal BLD on the upper surface of the wiring board PC via a wire (bonding wire) BW which is a conductive connecting member. In other words, one end of both ends of each wire BW is connected to each pad PD of the semiconductor device CP while the other end thereof is connected to each connection terminal BLD. As described above, the wire BW is a copper (Cu) wire containing copper (Cu) as a main component. The wire BW is sealed inside the sealing portion MR2, and is not exposed from the sealing portion MR2.

As similar to the above-described sealing portion MR1, the sealing portion (sealing resin portion) MR2 is a sealing resin portion which is made of, for example, a resin material such as thermosetting resin, and may contain a filler. The semiconductor device CP and the plurality of wires BW are sealed by the sealing portion MR2, and are therefore electrically and mechanically protected.

Note that the description here is about a case of a BGA (Ball Grid Array) type semiconductor package as the semiconductor device PKG2. However, the semiconductor device PKG2 is not limited to this type, and can be variously changed in a type. For example, a different package structure such as an LGA (Land Grid Array) structure may be applicable.

Figure 4:
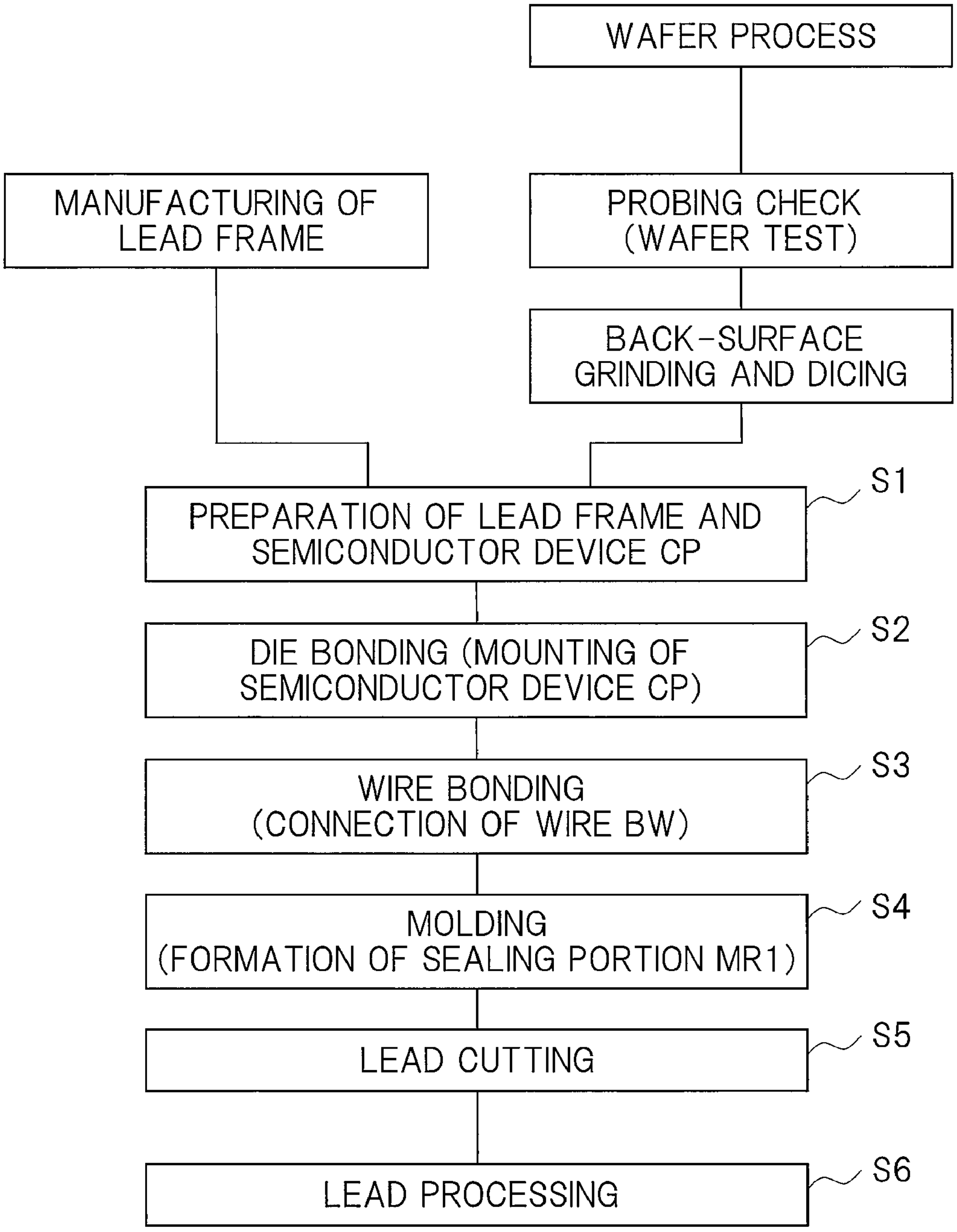
FIG. 4 is a process flowchart showing a process of manufacturing the semiconductor device shown in FIG. 2.
Figure 5:
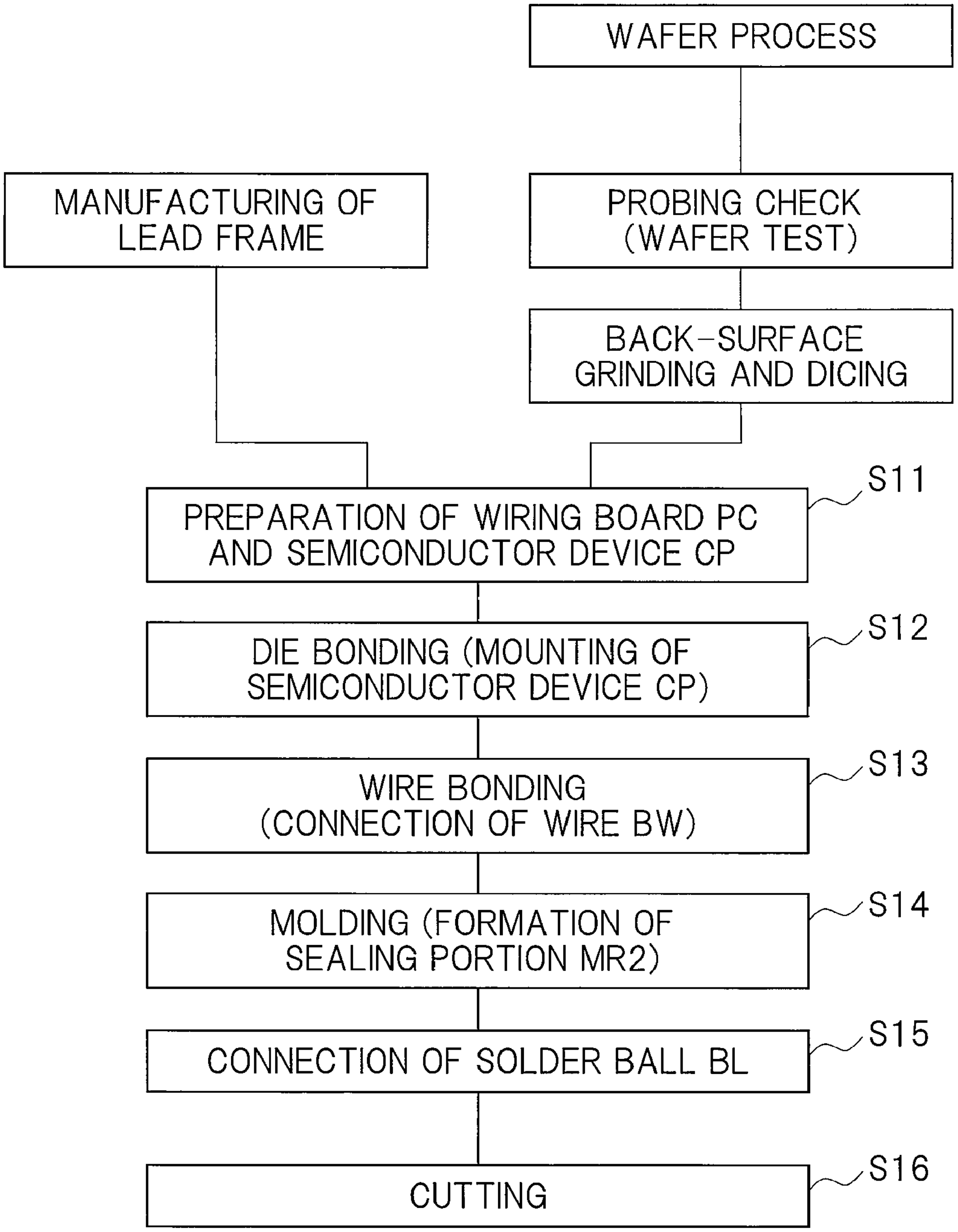
FIG. 5 is a process flowchart showing a process of manufacturing the semiconductor device shown in FIG. 3.

Next, a process of manufacturing the semiconductor device PKG1 shown in FIG. 2 and a process of manufacturing the semiconductor device PKG2 shown in FIG. 3 will be described. FIG. 4 is a process flowchart showing the process of manufacturing the semiconductor device PKG1 shown in FIG. 2, and FIG. 5 is a process flowchart showing the process of manufacturing the semiconductor device PKG2 shown in FIG. 3.

First, the process of manufacturing the semiconductor device PKG1 shown in FIG. 2 will be described with reference to FIGS. 2 and 4.

In an attempt to manufacture the semiconductor device PKG1, a lead frame and the semiconductor device (semiconductor chip) CP are prepared first (step S1 in FIG. 4). The lead frame has a framework, a plurality of leads LD connected to the framework, and the die pad DP connected to the framework via a plurality of suspension leads so that they are integrally formed. At the step S1, the lead frame and then the semiconductor device CP may be prepared in this order or the semiconductor device CP and then the lead frame may be prepared in this order, or the lead frame and the semiconductor device CP may be prepared simultaneously.

As shown in FIG. 4, note that the lead frame can be prepared by fabricating (manufacturing) the lead frame, and the semiconductor device CP can be prepared by fabricating (manufacturing) the semiconductor device CP. As the process of manufacturing the semiconductor device PC, a wafer process, a probe check (wafer test) process continued from the wafer process, and back polishing (back grinding) and dicing processes continued from the probe check process are performed. The details of the processes will be described later with reference to FIGS. 12 to 19. Note that the dicing process is performed after the back polishing process. However, the dicing process may be performed without the back polishing process.

Subsequently, a die bonding process is executed to mount and bond the semiconductor device CP onto the die pad DP of the lead frame via the bonding material BD1 (step S2 in FIG. 4).

Subsequently, a wire bonding process is executed to electrically connect the plurality of pads PD of the semiconductor device CP to (inner lead portions of) the plurality of leads LD of the lead frame via the plurality of wires BW, respectively (step S3 in FIG. 4). One end of each wire BW is connected to each pad PD of the semiconductor device CP, and the other end thereof is connected to the upper surface of the inner lead portion of each lead LD. During the wire bonding process, the semiconductor device CP is heated to a predetermined temperature.

Subsequently, resin sealing based on a molding process (resin molding process) is executed to seal the semiconductor device CP and the plurality of wires BW connected thereto with the sealing portion (sealing resin portion) MR1 (step S4 in FIG. 4). By this molding process at the step S4, the sealing portion MR1 that seals the semiconductor device CP, the die pad DP, the inner lead portions of the plurality of leads LD, the plurality of wires BW, and the suspension leads is formed.

Subsequently, after outer lead portions of the leads LD, the outer lead portions being exposed from the sealing portion MR1, are subjected to a plating process if needed, the leads LD and the suspension leads are cut at predetermined positions outside the sealing portion MR1 to separate them from the framework of the lead frame (step S5 in FIG. 4).

Subsequently, the outer lead portions of the leads LD, the outer lead portions protruding out of the sealing portion MR1, are subjected to a bending process (lead process, lead forming) (step S6 in FIG. 4).

In this manner, the semiconductor device PKG1 shown in FIG. 2 is manufactured.

Next, the process of manufacturing the semiconductor device PKG2 shown in FIG. 3 will be described with reference to FIGS. 3 and 5.

In an attempt to manufacture the semiconductor device PKG2, the wiring board PC and the semiconductor device (semiconductor chip) CP are prepared first (step S11 in FIG. 5). At this stage, a plurality of the wiring boards PC may be integrally connected together in an array form. At step S11, the wiring board PC and then the semiconductor device CP may be prepared in this order or the semiconductor device CP and then the wiring board PC may be prepared in this order, or the wiring board PC and the semiconductor device CP may be simultaneously prepared.

Subsequently, the die bonding process is executed to mount and bond the semiconductor device (semiconductor chip) CP onto the wiring board PC via the bonding material BD2 (step S12 in FIG. 5).

Subsequently, the wire bonding process is executed to electrically connect the plurality of pads PD of the semiconductor device CP to the plurality of connection terminals BLD of the wiring board PC on which the semiconductor device CP is mounted via the plurality of wires BW, respectively (step S13 in FIG. 5). One end of each wire BW is connected to each pad PD of the semiconductor device CP, and the other end thereof is connected to each connection terminal BLD. During the wire bonding process, the semiconductor device CP is heated to a predetermined temperature.

Subsequently, the resin sealing based on the molding process (resin molding process) is executed to form the sealing portion (sealing resin portion) MR2 on the upper surface of the wiring board PC so as to cover the semiconductor device CP and the wires BW, thus, the semiconductor device CP and the wires BW are sealed with the sealing portion MR2 (step S14 in FIG. 5).

Subsequently, a solder ball BL is connected to each conductive land DL on the lower surface of the wiring board PC (step S15 in FIG. 5).

Then, if the plurality of wiring boards PC are integrally connected together in the array form, the wiring boards PC are divided into individual wiring boards PC by cutting (dicing) a wiring board base in which the plurality of wiring boards PC are integrally connected together in the array form (step S16 in FIG. 5). At this step, the sealing portion MR2 may also be cut together with the wiring board base.

In this manner, the semiconductor device PKG2 shown in FIG. 3 is manufactured.

<Internal Structure of Semiconductor Chip>

Figure 6:
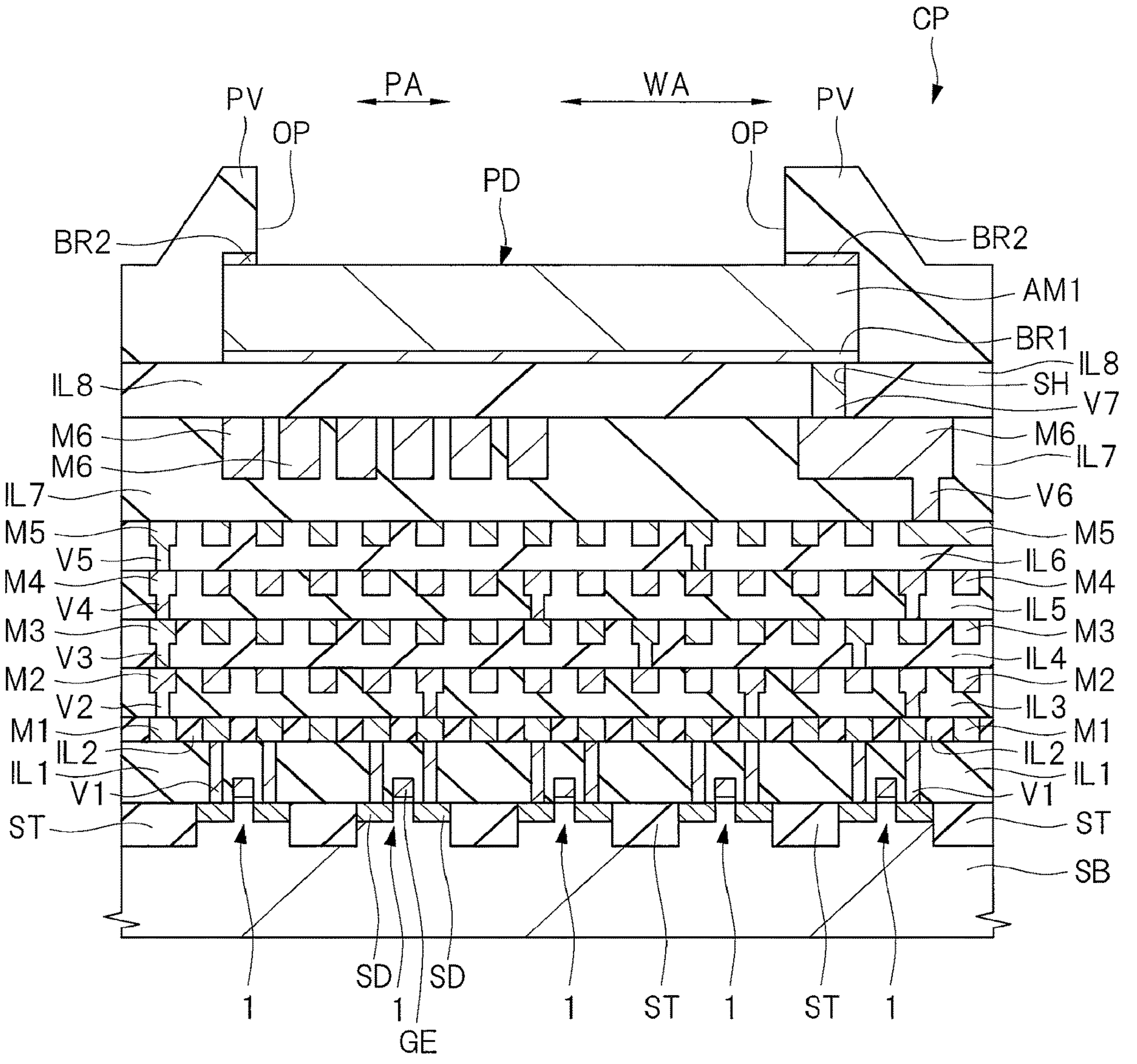
FIG. 6 is a cross-sectional view of a principle part of the semiconductor device according to one embodiment.
Figure 7:
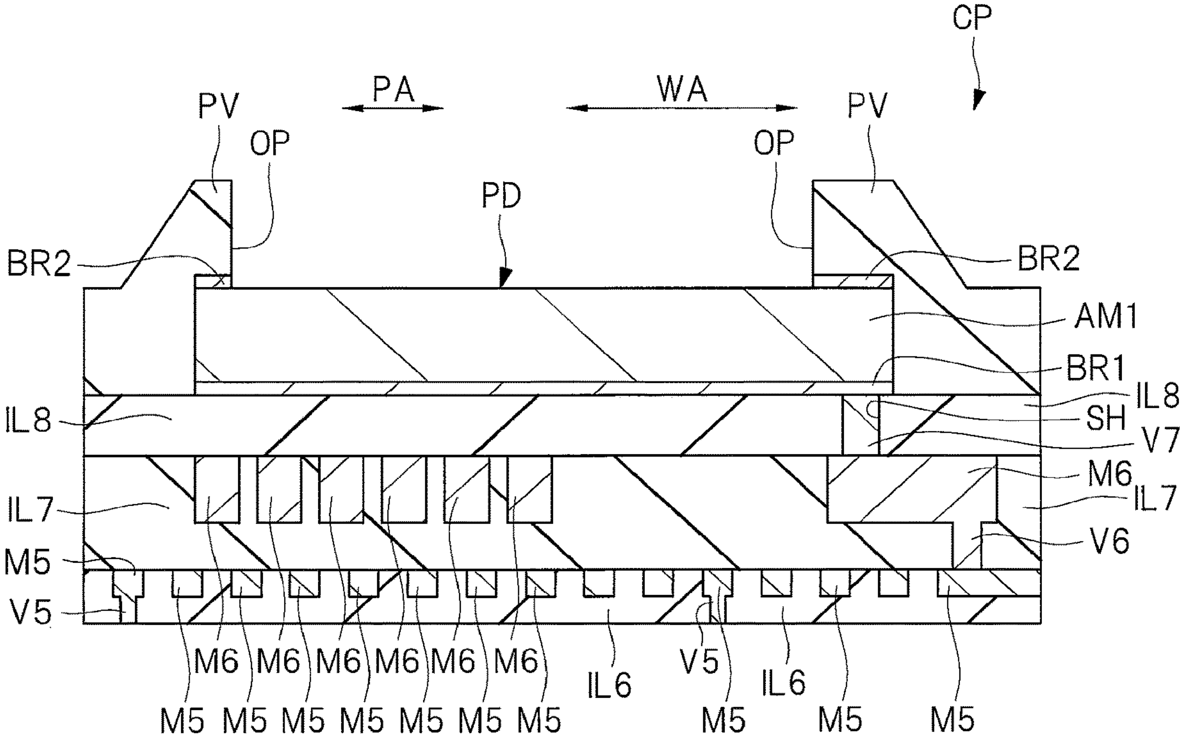
FIG. 7 is a cross-sectional view of the principle part of the semiconductor device according to one embodiment.

FIG. 6 is a cross-sectional view of a principle part of the semiconductor device (semiconductor chip) CP according to the present embodiment. FIG. 7 is a cross-sectional view of the principle part of the semiconductor device CP according to the present embodiment. Although FIG. 7 shows the same cross section as that of FIG. 6, illustration of a structure lower than an interlayer insulating film IL6 is omitted in FIG. 7.

In the semiconductor device CP of the present embodiment, semiconductor elements such as MISFETs are formed on a main surface of a semiconductor substrate SB, and a multilayer wiring structure including a plurality of wiring layers is formed on the semiconductor substrate SB. A configuration example of the semiconductor device of the present embodiment will specifically be described below.

As shown in FIG. 6, semiconductor elements such as MISFETs (Metal Insulator Semiconductor Field Effect Transistor) are formed on the semiconductor substrate SB made of single-crystal silicon, etc., the semiconductor substrate SB making up the semiconductor device of the present embodiment.

On the main surface of the semiconductor substrate SB, element isolation regions ST are formed by an STI (Shallow Trench Isolation) method, etc. An MISFET1 is formed in an active region of the semiconductor substrate SB, the active region being defined by these element isolation regions ST. The element isolation region ST is formed of an insulating film embedded in a trench formed in the semiconductor substrate SB.

The MISFET1 has a gate electrode GE formed on the main surface of the semiconductor substrate SB via a gate insulating film, and source/drain regions (semiconductor regions each for a source or a drain) SD formed inside the semiconductor substrate SB on both sides of the gate electrode GE. The source/drain regions SD may take an LDD (Lightly Doped Drain) structure. In this case, a sidewall insulating film (not illustrated) which is referred to also as sidewall spacer is formed on a side wall of the gate electrode GE. As the MISFET1, either an n-channel type MISFET or a p-channel type MISFET or both the n-channel type MISFET and the p-channel type MISFET can be formed. Note that the source/drain regions SD of the n-channel type MISFET are formed inside a p-type well (not illustrated) in the semiconductor substrate SB, and the source/drain regions SD of the p-channel type MISFET are formed inside an n-type well (not illustrated) in the semiconductor substrate SB.

Note that the MISFET is described as an example of the semiconductor element formed on the semiconductor substrate SB. Meanwhile, in addition to the MISFET, a capacitive element, a resistance element, a memory element, a transistor different in a structure or others may also be formed.

A single-crystal silicon substrate is described here as an example of the semiconductor substrate SB. Meanwhile, as another aspect, an SOI (Silicon on Insulator) substrate or others may be also used as the semiconductor substrate SB.

On the semiconductor substrate SB, a wiring structure (multilayer wiring structure) including a plurality of insulating films (interlayer insulating films) and a plurality of wiring layers is formed.

That is, on the semiconductor substrate SB, a plurality of interlayer insulating films (insulating films) IL1, IL2, IL3, IL4, IL5, IL6, and IL7 are formed, and a plug V1, vias V2, V3, V4, V5, and V6, and wiring lines M1, M2, M3, M4, M5, and M6 are formed in these interlayer insulating films IL1, IL2, IL3, IL4, IL5, IL6, and IL7. An interlayer insulating film IL8 is formed on the inter-layer insulating film IL7, and the pad PD is formed on this interlayer insulating film IL8. Note that a wiring line (not illustrated) in the same layer as that of the pad PD can be formed on the interlayer insulating film IL8.

Specifically, the interlayer insulating film IL1 is formed on the semiconductor substrate SB so as to cover the MISFET1, the conductive plug V1 is buried in the interlayer insulating film IL1, the interlayer insulating film IL2 is formed on the interlayer insulating film IL1 in which the plug V1 is buried, and the wiring line M1 is buried in this interlayer insulating film IL2. The interlayer insulating film IL3 is formed on the interlayer insulating film IL2 in which the wiring line M1 is buried, the wiring line M2 is buried in this interlayer insulating film IL3, the interlayer insulating film IL4 is formed on the interlayer insulating film IL3 in which the wiring line M2 is buried, and the wiring line M3 is buried in this interlayer insulating film IL4. The interlayer insulating film IL5 is formed on the interlayer insulating film IL4 in which the wiring line M3 is buried, the wiring line M4 is buried in this interlayer insulating film IL5, the interlayer insulating film IL6 is formed on the interlayer insulating film IL5 in which the wiring line M4 is buried, and the wiring line M5 is buried in this interlayer insulating film IL6. The interlayer insulating film IL7 is formed on the interlayer insulating film IL6 in which the wiring line M5 is buried, the wiring line M6 is buried in this interlayer insulating film IL7, the interlayer insulating film IL8 is formed on the interlayer insulating film IL7 in which the wiring line M6 is buried, and the pad PD is formed on this interlayer insulating film IL8. Each of the interlayer insulating films IL1 to IL8 is structured as a single-layer insulating film (e.g., silicon oxide film) or a stacked film of a plurality of insulating films. An insulating film PV is formed on the interlayer insulating film IL8 so as to cover the pad PD, and an opening OP at which a part of the pad PD is exposed in the insulating film PV.

Each plug V1 is made of a conductor and is arranged below the wiring line M1. The plug V1 electrically connects the wiring line M1 to various semiconductor regions (e.g., the source/drain regions SD) formed in the semiconductor substrate SB, the gate electrodes GE, etc.

The via V2 is made of a conductor, is integrally formed with the wiring line M2, and is arranged between the wiring line M2 and the wiring line M1 to electrically connect the wiring line M2 to the wiring line M1. In other words, the wiring line M2 and the via V2 formed integrally with the wiring line M2 are buried in the interlayer insulating film IL3 by a dual damascene wiring method. As another aspect, the via V2 and the wiring line M2 can be separately formed by a single damascene wiring method. This can be also said for the vias V3, V4, V5, V6, and V7.

The via V3 is made of a conductor, is integrally formed with the wiring line M3, and is arranged between the wiring line M3 and the wiring line M2 to electrically connect the wiring line M3 to the wiring line M2. In other words, the wiring line M3 and the via V3 formed integrally with the wiring line M3 are buried in the interlayer insulating film IL4 by a dual damascene wiring method.

The via V4 is made of a conductor, is integrally formed with the wiring line M4, and is arranged between the wiring line M4 and the wiring line M3 to electrically connect the wiring line M4 to the wiring line M3. In other words, the wiring line M4 and the via V4 formed integrally with the wiring line M4 are buried in the interlayer insulating film IL5 by a dual damascene wiring method.

The via V5 is made of a conductor, is integrally formed with the wiring line M5, and is arranged between the wiring line M5 and the wiring line M4 to electrically connect the wiring line M5 to the wiring line M4. In other words, the wiring line M5 and the via V5 formed integrally with the wiring line M5 are buried in the interlayer insulating film IL6 by a dual damascene wiring method.

The via V6 is made of a conductor, is integrally formed with the wiring line M6, and is arranged between the wiring line M6 and the wiring line M5 to electrically connect the wiring line M6 to the wiring line M5. In other words, the wiring line M6 and the via V6 formed integrally with the wiring line M6 are buried in the interlayer insulating film IL7 by a dual damascene wiring method.

The wiring lines M1, M2, M3, M4, M5, and M6 are illustrated and descried as damascene wiring lines (buried wiring lines) formed by the damascene wiring method. However, these wiring lines are not limited to the damascene wirings, can be also formed by patterning a conductive film for wiring, and can be, for example, aluminum wiring liens.

As shown in FIGS. 6 and 7, in the interlayer insulating film IL8, an opening (through-hole) SH is formed at a position overlapping the pad PD in a plan view. In the opening SH, the via V7 is formed (buried). The via V7 is made of a conductor, and is arranged between the pad PD and the wiring line 6 to electrically connect the pad PD to the wiring line M6. In other words, the via V7 is buried in the interlayer insulating film IL6 by the single damascene wiring method.

According to the present embodiment, note that the via V7 and the pad PD are separately formed. Meanwhile, as another aspect, the via V7 and the pad PD can be also integrally formed together. When the via V7 and the pad PD are integrally formed together, the via V7 is formed by burying a part of the pad PD into the opening SH of the interlayer insulating film IL8.

The wiring structure (multilayer wiring structure) including the plurality of insulating films (interlayer insulating films) and the plurality of wiring layers is formed on the semiconductor substrate SB, and the wiring line M1 is a wiring lines in the lowermost wiring layer among the plurality of wiring layers included in the wiring structure formed on the semiconductor substrate SB. The wiring line M2 is a wiring line in a wiring layer that is upper by one layer than the lowermost wiring layer among the plurality of wiring layers included in the wiring structure. The wiring line M3 is a wiring line in a wiring layer that is upper by two layers than the lowermost wiring layer among the plurality of wiring layers included in the wiring structure. The wiring line M4 is a wiring line in a wiring layer that is upper by three layers than the lowermost wiring layer among the plurality of wiring layers included in the wiring structure. The wiring line M5 is a wiring line in a wiring layer that is upper by four layers than the lowermost wiring layer among the plurality of wiring layers included in the wiring structure. The wiring line M6 is a wiring line in the wiring layer that is upper by five layers than the lowermost wiring layer among the plurality of wiring layers included in the wiring structure. The pad PD is formed in a wiring layer that is upper by six layers than the lowermost wiring layer (that is, in the uppermost wiring layer) among the plurality of wiring layers included in the wiring structure.

To put it in another way, the pad PD is included in the uppermost wiring layer among the plurality of wiring layers included in the wiring structure formed on the semiconductor substrate SB. The wiring line M6 is a wiring line in a wiring layer that is lower by one layer than the uppermost wiring layer among the plurality of wiring layers included in the wiring structure. The wiring line M5 is a wiring line in a wiring layer that is lower by two layers than the uppermost wiring layer among the plurality of wiring layers included in the wiring structure. The wiring line M4 is a wiring line in a wiring layer that is lower by three layers than the uppermost wiring layer among the plurality of wiring layers included in the wiring structure. The wiring line M3 is a wiring line in a wiring layer that is lower by four layers than the uppermost wiring layer among the plurality of wiring layers included in the wiring structure. The wiring line M2 is a wiring line in a wiring layer that is lower by five layers than the uppermost wiring layer among the plurality of wiring layers included in the wiring structure. The wiring line M1 is a wiring line in a wiring layer that is lower by six layers than the uppermost wiring layer (that is, in the lowermost layer) among the plurality of wiring layers included in the wiring structure.

A thickness of the wiring line M6 is larger than respective thicknesses of the wiring lines M1, M2, M3, M4, and M5. A thickness of the pad PD is larger than the thickness of the wiring line M6. A width of the wiring line M6 is larger than respective widths of the wiring lines M1, M2, M3, M4, and M5. A width of the pad PD is larger than the width of the wiring line M6. Note that a width of a wiring line corresponds to a width (dimension) in a direction substantially parallel with the main surface of the semiconductor substrate SB and substantially perpendicular to the direction of extension of the wiring line. The width of the pad PD corresponds to a dimension of the pad PD in a short-side direction (a vertical dimension in FIG. 9). Each thickness of the interlayer insulating films IL7 and IL8 is larger than each thickness of the interlayer insulating films IL2, IL3, IL4, IL5, and IL6.

Although an example of thickness is described as follows, the thickness is not limited to this. The thickness of the pad PD (mainly a thickness of an Al-content conductive film AM1) is, for example, about 1000 nm to 2000 nm, the thickness of the wiring line M6 is, for example, about 500 nm to 1000 nm, and each thickness of the wiring lines M1, M2, M3, M4, and M5 is, for example, about 50 nm to 200 nm. The thickness of the interlayer insulating film IL8 is, for example, about 500 nm to 1000 nm, the thickness of the interlayer insulating film IL7 is, for example, about 1000 nm to 2000 nm, each thickness of the interlayer insulating films IL3, IL4, IL5 and IL6 is, for example, about 100 nm to 400 nm, and the thickness of the interlayer insulating film IL2 is, for example, about 50 nm to 200 nm. The thickness of the interlayer insulating film IL1 is, for example, about 100 nm to 500 nm.

Note that the explanation here has been made about a case of total seven layers including the wiring layer in which the pad PD is formed, as the number of the wiring layers included in the wiring structure formed on the semiconductor substrate SB. However, the number is not limited to this. The number of the wiring layers included in the wiring structure formed on the semiconductor substrate SB may be variously changed. However, a plurality of wiring layers are included in the wiring structure formed on the semiconductor substrate SB, and the pad PD is included in the uppermost wiring layer of the plurality of wiring layers.

Figure 8:
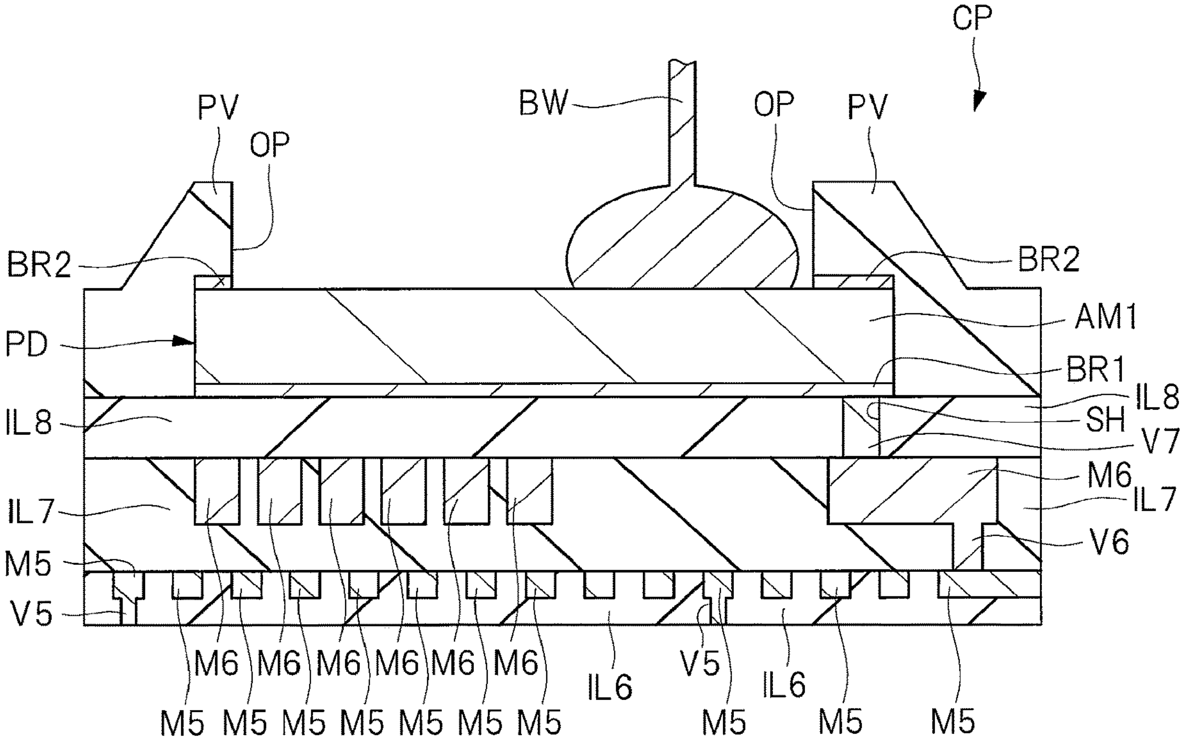
FIG. 8 is a cross-sectional view showing a state in which a wire is electrically connected to a pad shown in FIG. 7.

FIG. 8 is a cross-sectional view showing a state in which a wire (bonding wire) BW is electrically connected to the pad PD so as to show the cross section corresponding to FIG. 7. As similarly seen in FIG. 7, illustration of a structure lower than the interlayer insulating film IL6 is omitted also in FIG. 8. In the semiconductor devices PKG1 and PKG2 of FIGS. 2 and 3, the wire BW is electrically connected to the pad PD as shown in FIG. 8. However, in FIG. 8, illustration of the sealing resin (corresponding to the sealing portions MR1 and MR2) is omitted.

As shown in FIG. 8, the wire BW serving as a connection member is electrically connected to the pad PD. The wire BW is a copper (Cu) wire containing copper (Cu) as a main component. Not only the copper (Cu) wire entirely made of copper (Cu) but also a copper (Cu) wire whose surface is coated with a palladium (Pd) film or others can be used as the wire BW. The wire BW is bonded and electrically connected to the pad PD exposed at the opening OP of the insulating film PV. Note that the wire BW is bonded to a wire bonding region WA of the pad PD (see FIGS. 6 and 7).

The wire BW is the copper (Cu) wire which is a hard material. Therefore, by applying a mechanical pressure so that the wire BW is pressure bonded to the pad PD, high bonding strength can be obtained. In addition, the copper (Cu) wire is cheaper than a gold (Au) wire, and therefore, has an advantage of cost reduction.

<Configuration of Pad>

A configuration of the pad PD will further be described with reference to FIGS. 7, 8, and 9 to 11.

Figure 9:
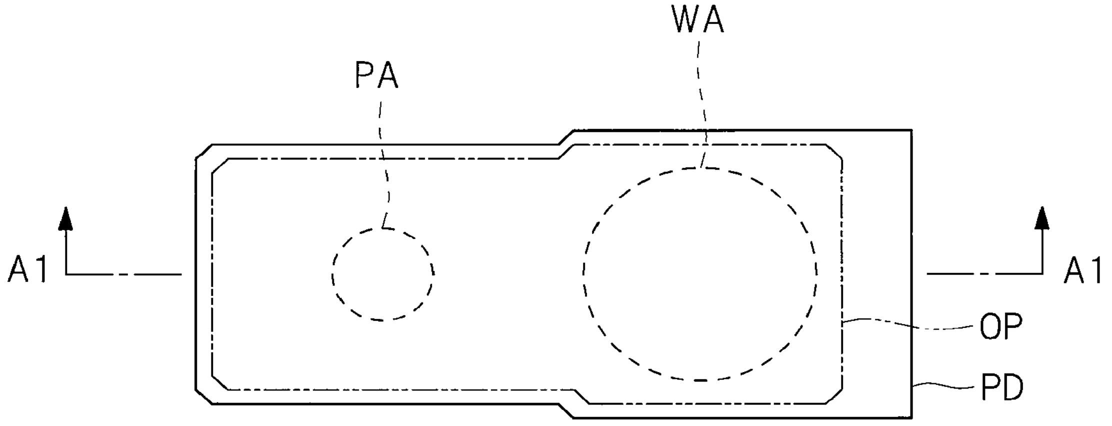
FIG. 9 is a plan view of the principle part of the semiconductor device according to one embodiment.
Figure 10:
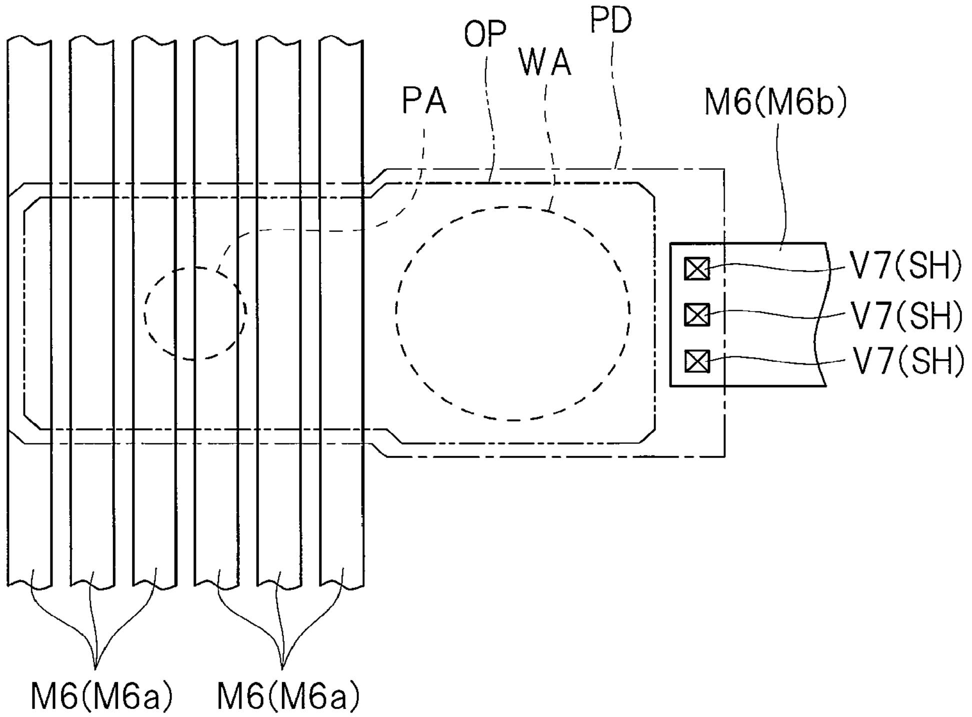
FIG. 10 is a plan view of the principle part of the semiconductor device according to one embodiment.

Each of FIGS. 9 and 10 is a plan view of a principle part of the semiconductor device (semiconductor chip) CP according to the present embodiment so as to show a plan view of a pad PD formation region. The cross-sectional view of FIG. 7 substantially corresponds to a cross-sectional view taken along a line A1-A1 of FIG. 9.

Note that FIG. 9 shows the pad PD by a solid line, shows the opening OP of the insulating film PV by a two-dot chain line, and shows the wire bonding region WA and a probe contact region PA by dotted lines (broken lines). FIG. 9 does not show the wiring line M6. Meanwhile, while FIG. 10 shows the same plane region as shown in FIG. 9, FIG. 10 further shows the wiring lines M6 and the via V7 in addition to the configuration of FIG. 9. Specifically, FIG. 10 shows the wiring line M6 by a solid lines, shows the pad PD by a single-dot chain line, shows the opening OP of the insulating film PV by a two-dot chain line, shows the wire bonding region WA and the probe contact region PA by dotted lines (broken lines), and also illustrates a position at which the via V7 (opening SH) is formed.

Figure 11:
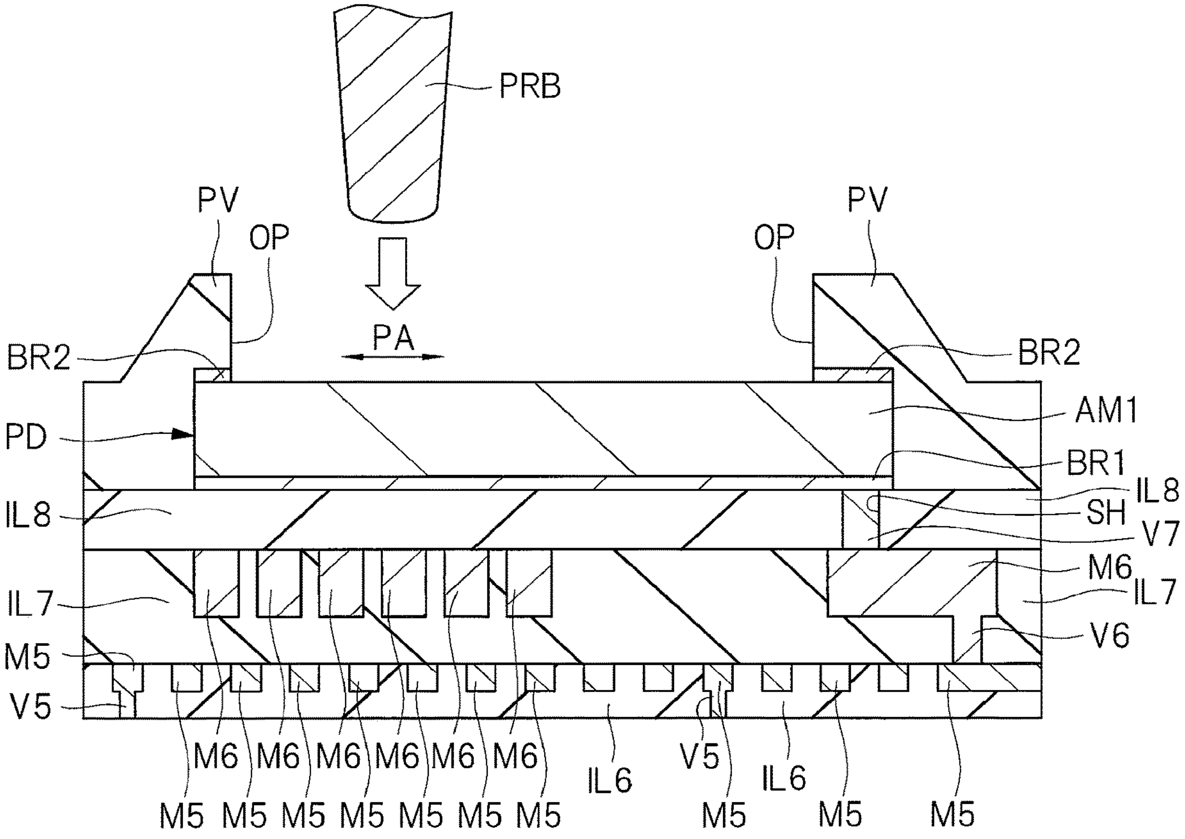
FIG. 11 is a cross-sectional view showing a situation in which a probe is brought into contact with the pad at a probing check.

FIG. 11 is a cross-sectional view showing a state in which a probe (probe needle) PRB is brought into contact with the pad PD at a probing check, and shows the cross section corresponding to FIG. 7. As similarly seen in FIG. 7, illustration of the structure lower than the interlayer insulating film IL6 is also omitted in FIG. 11.

As shown in FIG. 7, the pad PD is formed above the interlayer insulating film IL8, the insulating film PV is formed on the interlayer insulating film IL8 so as to cover a part of the pad PD, and another part of the pad PD is exposed at the opening OP formed on the insulating film PV. That is, as shown in FIGS. 7 and 9, the opening OP is formed as the opening for the pad PD so that the opening OP is inside the pad PD in a plan view. As a result, a plane direction (plane area) of the opening OP is smaller than a plane direction (plane area) of the pad PD, and the pad PD has the part exposed at the opening OP (i.e., part overlapping the opening OP in a plan view) and the part covered with the insulating film PV (i.e., part not overlapping the opening OP in a plan view). An outer periphery (that is a part not overlapping the opening OP in a plan view) of the upper surface of the pad PD is covered with the insulating film PV, while a central part (that is a part overlapping the opening OP in a plan view) of the same is not covered with the insulating film PV but is exposed.

The insulating film PV is a film that is the top layer of the semiconductor device (semiconductor chip) CP, and can function as a surface protective film. In other words, the insulating film PV is a passivation film. Each plane shape of the pad PD and the opening OP is, for example, quadrangular (more specifically rectangular). As the insulating film PV, a single-layer insulating film or a stacked insulating film formed by stacking a plurality of insulating films can be used. As another aspect, another insulating film can be further formed on the insulating film PV. Even in this case, a part of the pad PD is still exposed at the opening OP.

A region of the upper surface of the pad PD, the region being exposed at the opening OP, is a region where, for example, an external member such as a bonding wire (corresponding to the wire BW) and a probe can be brought into contact with the pad PD.

According to the present embodiment, a region of the upper surface of the pad PD is referred to as probe contact region PA, the region being exposed at the opening OP and being in contact with a probe (probe needle) at an electrical characteristics test (probing check) of the semiconductor chip (or chip region before the dicing process). At the probing check, the probe is brought into contact with the probe contact region PA of the pad PD, and thus, a probe mark is formed. For this reason, before the probing check, the probe contact region PA can be regarded as a region with which the probe is intended to be brought into contact at the probing check. During the probing check, the probe contact region PA can be also regarded as a region with which the probe is being brought into contact. After the probing check, the probe contact region PA can be also regarded as a region where the probe mark has been formed.

FIG. 11 shows a state in which the probe PRB is brought into contact with the pad PD at the probing check, and in which the probe PRB is brought into contact with the probe contact region PA (see FIGS. 6, 7, 9, and 10) of the upper surface of the pad PD to carry out the electrical characteristics test (probing check).

According to the present embodiment, a region of the upper surface of the pad PD, the region being exposed at the opening OP and being bonded (connected) to a wire (corresponding to the wire BW), is referred to as wire bonding region (wire connection region) WA. In the wire bonding process (corresponding to the steps S3 and S13) in manufacturing the semiconductor package, the wire (BW) is bonded (connected) to the wire bonding region WA of the pad PD so that the wire (BW) is bonded (connected) to the wire bonding region WA of the pad PD in the manufactured semiconductor package (corresponding to the semiconductor device PKG). For this reason, before the bonding of the wire to the pad PD, the wire bonding region WA can be regarded as a region to which the wire is intended to be bonded. After the bonding of the wire to the pad PD, the wire bonding region WA can be regarded as a region to which the wire has been bonded.

FIG. 8 shows a state in which the wire BW is electrically connected to the pad PD, and in which the wire BW is bonded and electrically connected to the wire bonding region WA (see FIGS. 6, 7, 9, and 10) of the upper surface of the pad PD.

The probe contact region PA and the wire bonding region WA are shown in FIGS. 6, 7, 9, and 10. The probe contact region PA and the wire bonding region WA are plane regions which are different from each other and do not overlap in a plan view. Because of this configuration, at the probing check, while the probe is brought into contact with the probe contact region PA of pad PD which results in the probe mark, the probe is not brought into contact with the wire bonding region WA of the pad PD which does not result in the probe mark. In the wire bonding process (corresponding to the steps S3 and S13), while the wire (corresponding to the wire BW) is bonded to the wire bonding region WA of the pad PD, the wire (corresponding to the wire BW) is not bonded to the probe contact region PA of the pad PD. A plane dimension (plane area) of the probe contact region PA is smaller than a plane dimension (plane area) of the opening OP, a plane dimension (plane area) of the wire bonding region WA is smaller than the plane dimension (plane area) of the opening OP, and the probe contact region PA and wire bonding region WA are inside the opening OP in a plan view.

Note that a reason why the probe contact region PA and the wire bonding region WA are formed as plane regions different from each other is as follows. That is, at the probing check, the probe (probe needle) is pressed against the probe contact region PA of the upper surface of the pad PD to perform an electrical test. Therefore, in this probing check, the probe mark is formed in the probe contact region PA of the pad PD. A region having the formed probe mark in the upper surface of the pad PD has low flatness. For this reason, when the wire (BW) is bonded to the region having the formed probe mark in the upper surface of the pad PD by the wire bonding process, there is a risk of reduction in the bonding strength of the wire (BW). Therefore, it is desirable to bond the wire (BW) to a region having no probe mark formed in the upper surface of the pad PD. In order to achieve this, according to the present embodiment, the probe contact region PA and the wire bonding region WA are provided as the plane regions different from each other. As a result, while the probe is brought into contact with the probe contact region PA of the pad PD so that the probe mark is formed at the probing check, the wire (BW) can be bonded to the wire contact region WA having no probe mark at the wire bonding process. Therefore, the bonding strength of the wire (BW) can be improved, and thus, the reliability of the connection of the wire (BW) can be improved, which results in improvement of the reliability of the semiconductor package.

The pad PD is an aluminum pad mainly made of aluminum (Al). Specifically, the pad PD is formed of a stacked film having a barrier conductor film (barrier conductive film) BR1, an Al (aluminum)-content conductive film AM1 formed on the barrier conductor film BR1, and a barrier conductor film (barrier conductive film) BR2 formed on the Al-content conductive film AM1. While the barrier conductor film BR2 is formed on the Al-content conductive film AM1 in a part of the pad PD, the part being covered with the insulating film PV (i.e., a part below the insulating film PV), no barrier conductor film BR2 is formed on the Al-content conductive film AM1 in a part of the pad PD, the part being not covered with the insulating film PV but exposed at the opening OP of the insulating film PV. This is because the barrier conductor film BR2 in the part exposed at the opening OP of the insulating film PV is removed.

The Al-content conductive film AM1 is a conductive film containing Al (aluminum), and more preferably a conductive material film (conductive material film exhibiting metallic conduction) containing aluminum (Al) as a main component (primary component). As the Al-content conductive film AM1, an aluminum film (pure aluminum film) can be used. However, this film is not limited to only the aluminum film, and a compound film or alloy film containing aluminum (Al) as a main component (primary component) can be also used. For example, a compound film or alloy film composed of Al (aluminum) and Si (silicon) or a compound film or alloy film composed of Al (aluminum) and Cu (copper) or a compound film or alloy film composed of Al (aluminum), Si (silicon), and Cu (copper) can be also preferably used as the Al-content conductive film AM1. The composition ratio (content) of the Al (aluminum) in the Al-content conductive film AM1 is larger than 50 atomic percent (that is, the film is an aluminum-rich film), more preferably equal to or larger than 98 atomic percent.

Both of the barrier conductor film BR1 and the barrier conductor film BR2 are conductive films (each of which is more preferably a conductive film exhibiting metallic conduction). The barrier conductor film BR1 of these films has a function that improves its adherence to a base (such as the interlayer insulating film IL8) to prevent its peeling off. Therefore, the barrier conductor film BR1 is desirably excellent in the adherence to the base (such as the interlayer insulating film IL8) and the adherence to the Al-content conductive film AM1 formed on the barrier conductor film BR1. As the barrier conductor film BR1, for example, a stacked film composed of a titanium (Ti) film, a titanium nitride (TiN) film, and a titanium (Ti) film stacked from bottom in this order can be preferably used. However, in addition to such a stacked film, for example, a single-layer titanium (Ti) film, a single-layer titanium nitride (TiN) film, a stacked-layer film composed of a titanium (Ti) film and a titanium nitride (TiN) film or others can be also used as the barrier conductor film BR1.

The barrier conductor film BR2 has a function that improves its adherence to the insulating film PV to prevent its peeling off. Therefore, the barrier conductor film BR2 is desirably excellent in the adherence to the Al-content conductive film AM1 that is the base and the adherence to the insulating film PV formed on the barrier conductor film BR2. The barrier conductor film BR2 can also function as a reflection preventive film in a photolithographic process. As the barrier conductor film BR2, a titanium nitride (TiN) film can be preferably used. However, in addition to such a film, for example, a titanium (Ti) film, a tantalum (Ta) film, a tantalum nitride (TaN) film, a tungsten (W) film, a tungsten nitride (WN) film, a titanium tungsten (TiW) film, or a tantalum tungsten (TaW) film can be also used as the barrier conductor film BR2.

The Al-content conductive film AM1 can function as a main conductor film of the pad PD. The thickness of the Al-content conductive film AM1 is larger (thicker) than respective thicknesses of the barrier conductor films BR1 and BR2. The pad PD is mainly composed of the Al-content conductive film AM1, and therefore, can be regarded as an aluminum pad.

In the case of FIG. 7, note that the Al-content conductive film AM1 of the pad PD is exposed at the opening OP of the insulating film PV. Therefore, when the wire BW is bonded to the pad PD, the wire BW is directly bonded to the Al-content conductive film AM1 of the pad PD as shown in FIG. 8.

As another aspect, a metal film (such as a palladium film) can be formed on the Al-content conductive film AM1 of the pad PD exposed at the opening OP of the insulating film PV. In this case, when the wire BW is bonded to the pad PD, the wire BW is bonded to the metal film (such as the palladium film) formed on the Al-content conductive film AM1 of the pad PD. In this case, the metal film is interposed between the wire BW and the Al-content conductive film AM1 of the pad PD, and therefore, the wire BW is connected electrically to the Al-content conductive film AM1 of the pad PD via this metal film. In this case, the metal film formed on the Al-content conductive film AM1 of the pad PD can be regarded as a part of the pad PD.

In either case, by the wire bonding process to the pad PD, the wire BW is electrically connected to the pad PD.

The pad PD is electrically connected through the via V7 to the wiring line M6 in the layer lower than the pad PD. While the via V7 overlaps the pad PD in a plan view, the via V7 is preferably formed in a location where the via V7 does not overlap the opening OP. That is, the via V7 is preferably arranged below a part of the pad PD, the part being covered with the insulating film PV.

As another aspect, a wiring line in the same layer as that of the pad PD can be integrally connected to the pad PD so that the wiring line is electrically connected to the wiring line M6 in the lower layer through a via (a conductive via buried in the interlayer insulating film IL8) in the same layer as that of the via V7. In this case, it is not required to form the via V7 below the pad PD, and the wiring line in the same layer as that of the pad PD, the wiring line being connected to the pad PD, may be integrally formed with the pad PD, and the via in the same layer as that of the via V7 may be arranged below the wiring line.

In the cases of FIGS. 9 and 10, each plane shape of the pad PD and of the opening OP is substantially rectangular. A plane dimension (plane area) of the opening OP is slightly smaller than a plane dimension (plane area) of the pad PD, the opening OP is inside the pad PD in a plan view, and the probe contact region PA and the wire bonding region WA are inside the opening OP in a plan view. The probe contact region PA and the wire bonding region WA are arranged side by side in a long-side direction of the pad PD (lateral direction in FIGS. 9 and 10). The long-side direction of the pad PD is a direction that is, for example, substantially parallel to the upper surface of the semiconductor device CP and substantially perpendicular to a chip side CH described later. Apart of pad PD, the part overlapping the opening OP in a plan view, in other words, the part being exposed at the opening OP, actually functions as the pad (pad electrode, bonding pad).

Although one example of the dimensions is described below, the dimensions are not limited to this example. The long side of the opening OP is, for example, 80 μm to 160 μm, and the short side of the opening OP is, for example, about 40 μm to 80 μm. In the pad PD in the cases of FIGS. 9 and 10, a width (a dimension in a longitudinal direction in FIG. 9) of a part having the wire bonding region WA arranged in the pad PD is slightly (for example, about 2 μm to 10 μm) larger than a width (a dimension in the longitudinal direction in FIG. 9) of a part having the probe contact region PA arranged in the pad PD. Similarly, in the opening OP in the cases of FIGS. 9 and 10, a width (a dimension in a longitudinal direction in FIG. 9) of a part having the wire bonding region WA arranged in the opening OP is slightly (for example, about 2 μm to 10 μm) larger than a width (a dimension in the longitudinal direction in FIG. 9) of a part having the probe contact region PA arranged in the opening OP. The wire bonding region WA is, for example, a substantially circular region with a diameter of 30 μm to 50 μm, while the probe contact region PA is, for example, a substantially circular region with a diameter of 8 μm to 15 μm. The plane shape of the probe contact region PA may be a non-circular shape, depending on the shape of the probe used for the probing check.

According to the present embodiment, the wiring line below the pad PD is contrived, and the wiring line will be described with reference to FIGS. 6, 7, 9, and 10.

The wiring structure formed on the semiconductor substrate SB includes the plurality of wiring layers, the pad PD is formed in the uppermost wiring layer of the plurality of wiring layers, and the wiring line M6 is formed in a layer that is lower by one layer than the uppermost wiring layer. That is, the wiring line M6 is the wiring line in the wiring layer that is lower by one layer than the wiring layer where the pad PD is formed. Therefore, there is no wiring line in an upper layer than the wiring line M6 and a lower layer than the pad PD.

According to the present embodiment, the wiring line M6 can be arranged in a location where the wiring line M6 overlaps the pad PD in a plan view, and the wiring line M6 can be arranged in a location where the wiring line M6 does not overlap the pad PD in a plan view. This means that the wiring lines M6 in the wiring layer that is lower by one layer than the wiring layer where the pad PD is formed may include the wiring line M6 arranged in the location where the wiring line M6 overlaps the pad PD in a plan view and the wiring line M6 arranged in the location where the wiring line M6 does not overlap the pad PD in a plan view.

However, the wiring line M6 cannot be arranged in every location. A region immediately below the wire bonding region WA of the pad PD, that is, a region overlapping the wire bonding region WA in a plan view is specified as an arrangement forbidden region for the wiring line M6 (a region where the arrangement of the wiring line M6 is forbidden). A region other than the region immediately below the wire bonding region WA of the pad PD, that is, a region not overlapping the wire bonding region WA in a plan view is specified as an arrangement allowed region for the wiring line M6 (a region where the arrangement of the wiring line M6 is allowed).

According to the present embodiment, a region immediately below the probe contact region PA of the pad PD, that is, a region overlapping the probe contact region PA in a plan view is also specified as the arrangement allowed region for the wiring line M6. That is, according to the present embodiment, while the region immediately below the wire bonding region WA in the region immediately below the pad PD is specified as the arrangement forbidden region for the wiring line M6, the region other than the region immediately below the wire bonding region WA is specified as the arrangement allowed region for the wiring line M6, and therefore, the region immediately below the probe contact region PA of the pad PD is also specified as the arrangement allowed region for the wiring line M6. In other words, while the region overlapping the wire bonding region WA in the region overlapping the pad PD in a plan view is specified as the arrangement forbidden region for the wiring line M6, the region not overlapping the wire bonding region WA is the arrangement allowed region for the wiring line M6, and the region overlapping the probe contact region PA is also specified as the arrangement allowed region for the wiring line M6.

Thus, according to the present embodiment, as shown in FIGS. 6,7, 9, and 10, the wiring line M6 is arranged immediately below the pad PD, and therefore, the wiring line M6 is arranged in the region overlapping the opening OP of the insulating film PV in a plan view, while the wiring line M6 immediately below the pad PD is arranged so as to avoid the wire bonding region WA. In other words, while the wiring line M6 is arranged so that the wiring line M6 overlaps the pad PD in a plan view, this wiring line M6 is arranged so that this wiring line M6 does not overlap the wire bonding region WA in a plan view. Hence no wiring line M6 is arranged immediately below the wire bonding region WA of the pad PD, in other words, no wiring line M6 is arranged in the region overlapping the wire bonding region WA of the pad PD in a plan view. Since no wiring line M6 is arranged immediately below the wire bonding region WA of the pad PD, no via V7 is arranged immediately below the wire bonding region WA of the pad PD, either. Since the region overlapping the probe contact region PA in a plan view is specified as the arrangement allowed region for the wiring line M6, the wiring line M6 is also arranged immediately below the probe contact region PA of the pad PD, in other words, the wiring line M6 is also arranged in the region overlapping the probe contact region PA of the pad PD in a plan view.

According to the present embodiment, note that no wiring line M6 is arranged immediately below the wire bonding region WA of the pad PD. In other words, no conductor pattern (metal pattern) in the same layer as that of the wiring line M6 is formed immediately below the wire bonding region WA of the pad PD.

The configuration shown in FIG. 10 will be more specifically described. In the case of FIG. 10, a plurality of wiring lines M6 (corresponding to wiring lines M6*a* denoted with a reference symbol M6*a* in FIG. 10) extending in a direction (a longitudinal direction in FIG. 10) substantially perpendicular to the direction of extension of the pad PD (a lateral direction in FIG. 10) pass (extend) below the pad PD. The extension direction of these wiring lines M6 is a direction, for example, along a chip side (corresponding to the chip side CH described later). Note that the chip side corresponds to one side of four sides making up the periphery of the upper surface of the semiconductor device CP.

The plurality of wiring lines M6*a* shown in FIG. 10 pass below the pad PD but do not pass through the region immediately below the wire bonding region WA, and are therefore arranged in a location where the wiring lines M6*a* do not overlap the wire bonding region WA in a plan view. In a plan view, the plurality of wiring lines M6*a* pass through a part of the region overlapping the region of pad PD, the part including not the wire contact region WA but the probe contact region PA. As a result, in a plan view, at least one wiring line M6*a* overlaps the probe contact region PA, in other words, at least one wiring line M6*a* passes through the region immediately below the probe contact region PA.

While the plurality of wiring lines M6*a* of FIG. 10 pass below the pad PD, no via V7 is arranged between the pad PD and the plurality of wiring lines M6*a*. Therefore, the pad PD and the wiring lines M6*a* passing below the pad PD shown in FIG. 10 are not electrically connected to each other. On the other hand, a wiring line M6*b* shown in FIG. 10 is electrically connected to the pad PD through the vias V7. The wiring line M6*b* and vias V7 are also arranged in a location where they do not overlap the wire bonding region WA in a plan view. Note that the wiring lines M6*a* and M6*b* are wiring lines (M6) in the wiring layer that is lower by one layer than the pad PD.

In the case of FIG. 10, six wiring lines M6*a* pass below the pad PD. However, the number of wiring lines M6*a* passing below the pad PD is not limited to six and can be variously changed. As the wiring lines M6*a* passing below the pad PD, for example, a power supply wiring line or a ground wiring line can be used. The plurality of wiring lines M6*a* passing below the pad PD may include both the power supply wiring line and the ground wiring line. Note that the power supply wiring line is a wiring line through which a power supply potential is supplied, and the ground wiring line is a wiring line through which a ground potential is supplied. The thickness of the wiring line M6 is larger than respective thicknesses of the wiring lines M1, M2, M3, M4, and M5, and therefore, the resistance of the wiring line M6 (wiring resistance) can be made lower than respective resistances (wiring resistances) of the wiring lines M1, M2, M3, M4, and M5. For this reason, by using the wiring line M6 as the power supply wiring line, the ground wiring line or both the power supply wiring line and the ground wiring line, the resistance (wiring resistance) of the power supply wiring line or the ground wiring line or the resistances of both the power supply wiring line and the ground wiring line can be reduced.

The damage on the interlayer insulating film IL8 sandwiched by the pad PD and the wiring lines (M6) caused when an external force is applied to the pad PD can be suppressed in a case of a plurality of relatively narrow wiring lines (M6) passing below the pad PD in the wiring layer that is lower by one layer than the pad PD more than a case of one wide wiring line (M6) passing below the pad PD. Therefore, this manner is more advantageous in improving the reliability of the semiconductor device. In FIG. 10, a single wiring line created by integrally connecting the plurality of wiring lines M6*a* can be used as a wider power supply wiring line or a wide ground wiring line. Or rather, it is more preferable to use the plurality of relatively narrow wiring lines M6*a* as the power supply wiring lines or the ground wiring lines.

<Processes of Manufacturing Semiconductor Device>

Processes of manufacturing the semiconductor device CP of the present embodiment will be described with reference to FIGS. 12 to 19. FIGS. 12 to 19 are cross-sectional views of the principle part of the semiconductor device CP of the present embodiment during manufacturing processes.

Figure 12:
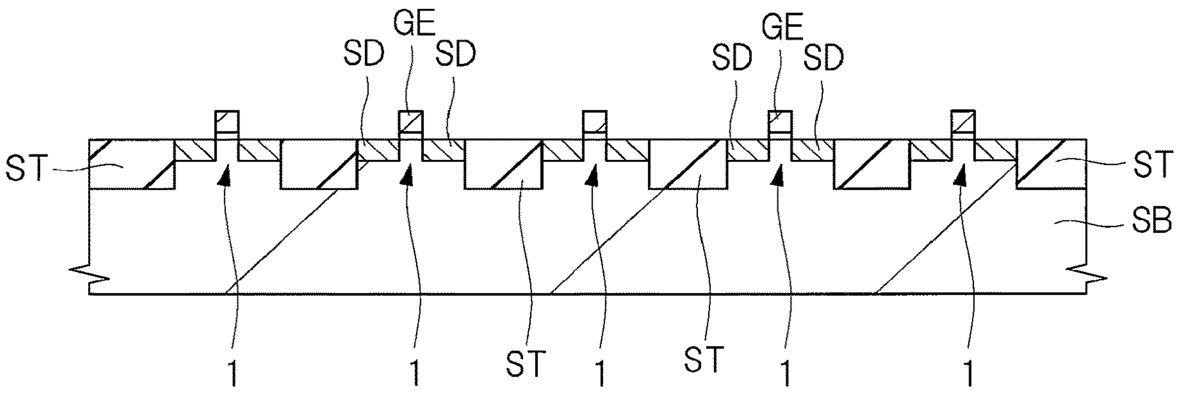
FIG. 12 is a cross-sectional view of the principle part of the semiconductor device of one embodiment during a manufacturing process.

First, the semiconductor substrate (semiconductor wafer) SB made of single-crystal silicon, etc., is prepared, and then, a semiconductor element such as a MISFET is formed on the semiconductor substrate SB by using a publicly-known semiconductor manufacturing technique. For example, as shown in FIG. 12, an element isolation region ST is formed in the semiconductor substrate SB by an STI method, a well region (not illustrated) is formed in the semiconductor substrate SB by an ion injection method, the gate electrode GE is formed on the semiconductor substrate SB (well region) via the gate insulating film, and the source/drain region SD is formed in the semiconductor substrate SB (well region) by an ion injection method. In this manner, a MISFET1 is formed on the semiconductor substrate SB.

Figure 13:
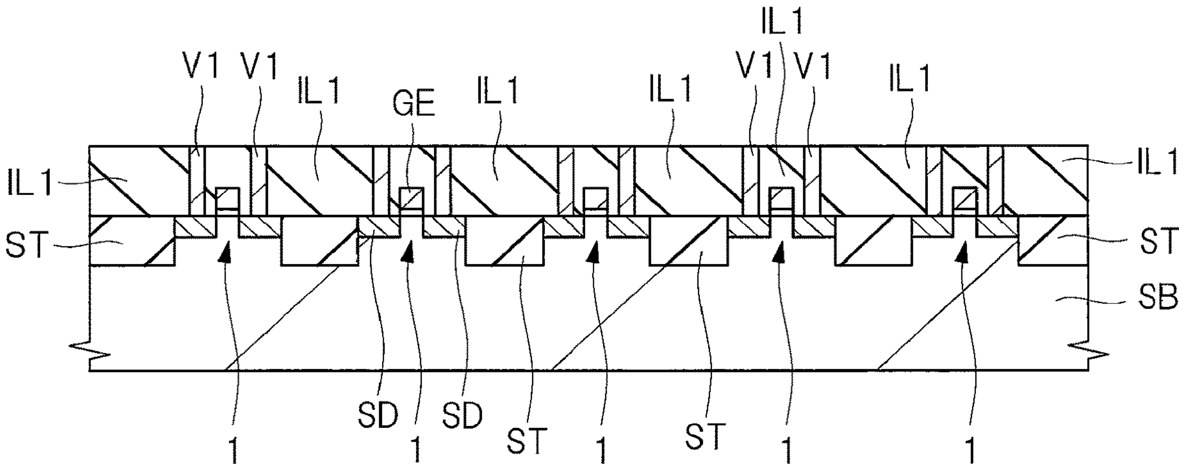
FIG. 13 is a cross-sectional view of the principle part of the semiconductor device during a manufacturing process continued from FIG. 12.

Subsequently, as shown in FIG. 13, the interlayer insulating film IL1 is formed on the semiconductor substrate SB so as to cover the MISFET1, a contact hole is formed in the interlayer insulating film IL1 by a photolithography technique and a dry etching technique, and a conductive film is buried in the contact hole, so that the plug V1 is formed.

Figure 14:
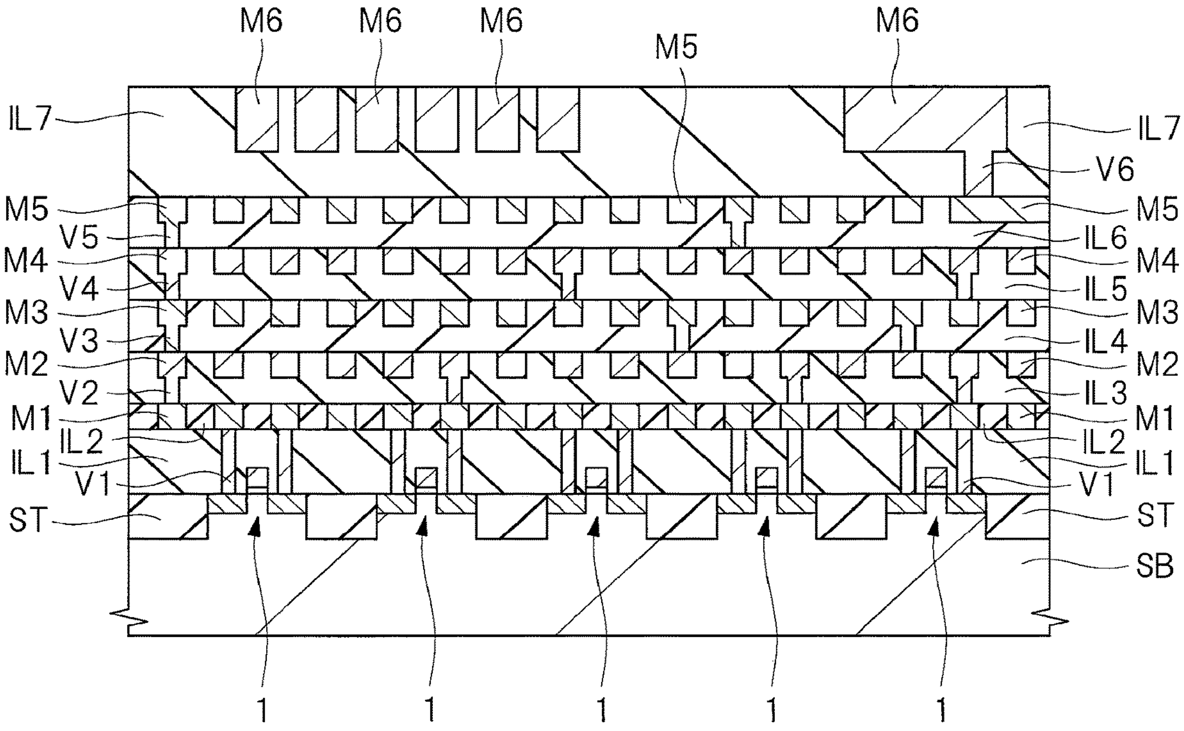
FIG. 14 is a cross-sectional view of the principle part of the semiconductor device during a manufacturing process continued from FIG. 13.

Subsequently, as shown in FIG. 14, the interlayer insulating film IL2 is formed on the interlayer insulating film IL1 in which the plug V1 is buried, and then, the wiring line M1 is buried in the interlayer insulating film IL2 by a single damascene technique. Then, the interlayer insulating film IL3 is formed on the interlayer insulating film IL2 in which the wiring line M1 is buried, and then, the wiring line M2 and the via V2 are buried in the interlayer insulating film IL3 by a dual damascene technique. Then, the interlayer insulating film IL4 is formed on the interlayer insulating film IL3 in which the wiring line M2 is buried, and then, the wiring line M3 and the via V3 are buried in the interlayer insulating film IL4 by a dual damascene technique. Then, the interlayer insulating film IL5 is formed on the interlayer insulating film IL4 in which the wiring line M3 is buried, and then, the wiring line M4 and the via V4 are buried in the interlayer insulating film IL5 by a dual damascene technique. Then, the interlayer insulating film IL6 is formed on the interlayer insulating film IL5 in which the wiring line M4 is buried, and then, the wiring line M5 and the via V5 are buried in the interlayer insulating film IL6 by a dual damascene technique. Then, the interlayer insulating film IL7 is formed on the interlayer insulating film IL6 in which the wiring line M5 is buried, and then, the wiring line M6 and the via V6 are buried in the interlayer insulating film IL7 by a dual damascene technique.

Figure 15:
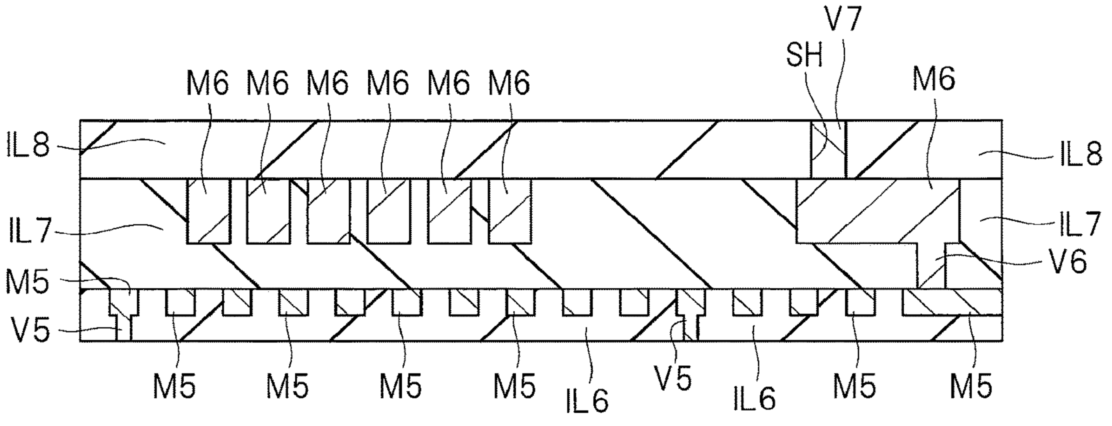
FIG. 15 is a cross-sectional view of the principle part of the semiconductor device during a manufacturing process continued from FIG. 14.

After the formation of the interlayer insulating film IL7 and the formation of the wiring line M6 and the via V6 buried in the interlayer insulating film IL7 by the dual damascene technique, the interlayer insulating film IL8 is formed on the interlayer insulating film IL7 in which the wiring line M6 is buried as shown in FIG. 15. In FIG. 15 and FIGS. 16 to 19 described later, illustration of the structure lower than the interlayer insulating film IL6 is omitted for simplifying the drawings.

Subsequently, an opening SH is formed in the interlayer insulating film IL8 by a photolithography technique and an etching technique. By the formation of the opening SH in the interlayer insulating film IL8, the upper surface of the wiring line M6 is exposed at the bottom of the opening SH.

Subsequently, a conductive film for the via V7 is formed on the interlayer insulating film IL8 so that the conductive film fills the opening SH, and then, the conductive film (the conductive film for the via V7) outside the opening SH is removed by a CMP (Chemical Mechanical Polishing) method or an etch-back method while the conductive film (the conductive film for the via V7) is left inside the opening SH. Thus, the via V7 can be formed of the conductive film (the conductive film for the via V7) buried in the opening SH.

As the interlayer insulating films IL2 to IL6, for example, a silicon oxide film or others can be used. However, usage of a low dielectric constant film (Low-k film) is more preferable because of being capable of reducing a parasitic capacitance between the wiring lines. The low dielectric constant film described here means an insulating film whose dielectric constant is lower than a dielectric constant (=3.8 to 4.3) of silicon oxide ($SiO^2$), and particularly means an insulating film whose dielectric constant is lower than 3.3. As a specific material of the low dielectric constant film, for example, an SiOC film (a carbon-content silicon oxide film), an SiOF film (a fluorine-content silicon oxide film), an SiCN film (a silicon carbonitride film) and others can be exemplified.

As the interlayer insulating films IL7 and IL8, for example, a silicon oxide film or others can be used. As the silicon oxide film, a TEOS (tetraethoxysilane) oxide film, a BPSG film, etc., can be used. A distance between the adjacent wiring lines in the wiring layer including the wiring line M6 is large than a distance between the adjacent wiring lines in a wring layer lower than the wiring layer including the wiring line M6, and respective thicknesses of the interlayer insulating films IL7 and IL8 are larger than respective thicknesses of the interlayer insulating films IL2, IL3, IL4, IL5, and IL6, and therefore, the parasitic capacitance is difficult to occur in the wiring line M6 more than the wiring lines M1, M2, M3, M4, and M5. For this reason, while the low dielectric constant film can be used as each of the interlayer insulating films IL7 and IL8, increase in the parasitic capacitance hardly occurs even if the low dielectric constant film is not used as each of the interlayer insulating films IL7 and IL8.

Figure 16:
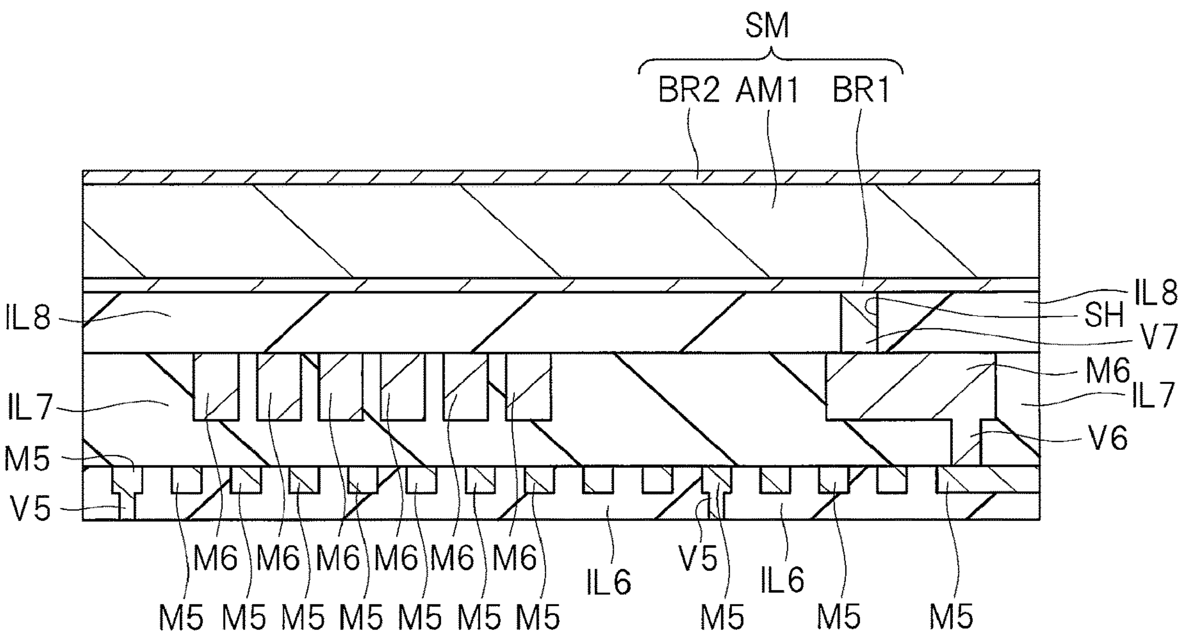
FIG. 16 is a cross-sectional view of the principle part of the semiconductor device during a manufacturing process continued from FIG. 15.

Subsequently, as shown in FIG. 16, the barrier conductor film BR1, the Al-content conductor film AM1, and the barrier conductor film BR2 are formed in this order on the interlayer insulating film IL8 in which the via V7 is buried, so that the stacked film SM composed of the barrier conductor film BR1, the Al-content conductor film AM1 formed on the barrier conductor film BR1, and the barrier conductor film BR2 formed on the Al-content conductor film AM1 is formed. Each of the barrier conductor film BR1, the Al-content conductor film AM1, and the barrier conductor film BR2 can be formed by a sputtering method or others.

Figure 17:
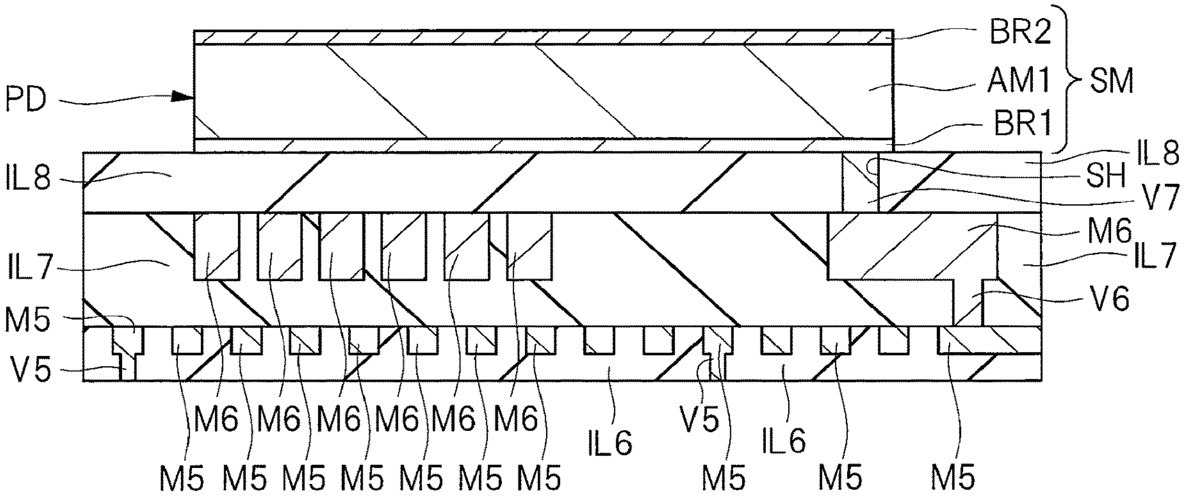
FIG. 17 is a cross-sectional view of the principle part of the semiconductor device during a manufacturing process continued from FIG. 16.

Subsequently, as shown in FIG. 17, the stacked film SM is patterned by a photolithography technique and an etching technique, so that the pad PD is formed. That is, a photoresist pattern (not illustrated) is formed on the stacked film SM by the photolithography technique, and then, the stacked film SM is etched while using the photoresist pattern as an etching mask, so that the stacked film SM is patterned to form the pad PD from the patterned stacked film SM. After that, the photoresist pattern is removed, and this stage is shown in FIG. 17. In this stage, the pad PD as a whole is the stacked film composed of the barrier conductor film BR1, the Al-content conductor film AM1 formed on the barrier conductor film BR1, and the barrier conductor film BR2 formed on the Al-content conductor film AM1. Note that not only the pad PD but also the wiring line in the same layer as that of the pad PD can be also formed when the stacked film SM is patterned at step S22. In this case, the wiring line in the same layer as that of the pad PD is formed on the interlayer insulating film IL8.

The case of the individual formation of the via V7 and the pad PD has been illustrated and described above. As another aspect, the via V7 can be formed integrally with the pad PD. In this case, the stacked film SM is formed on the interlayer insulating film IL8 including the opening SH while the via V7 is not formed yet, and then, the stacked film SM is patterned by using the photolithography technique and the etching technique, so that the pad PD is formed. By the stacked film SM patterned through this process, the pad PD and the via V7 are formed integrally with each other.

Figure 18:
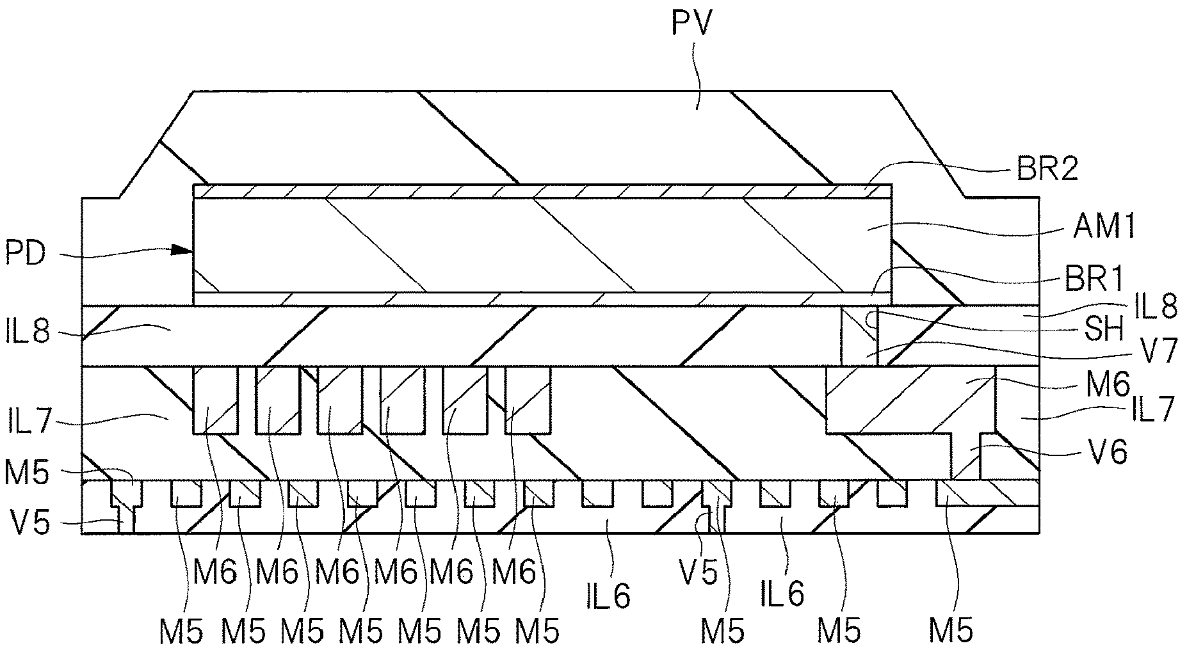
FIG. 18 is a cross-sectional view of the principle part of the semiconductor device during a manufacturing process continued from FIG. 17.

Subsequently, as shown in FIG. 18, the insulating film PV is formed on the interlayer insulating film IL8 so as to cover the pad PD. As the insulating film PV, a single-layer insulating film or a stacked insulating film obtained by stacking the insulating films can be used. For example, a silicon oxide film, a silicon nitride film or a stacked film composed of these films (e.g., a stacked film composed of a silicon oxide film and a silicon nitride film formed the silicon oxide film) can be used as the insulating film PV. A resin film (an organic-based insulating film) such as polyimide resin film can be also used as the insulating film PV.

Figure 19:
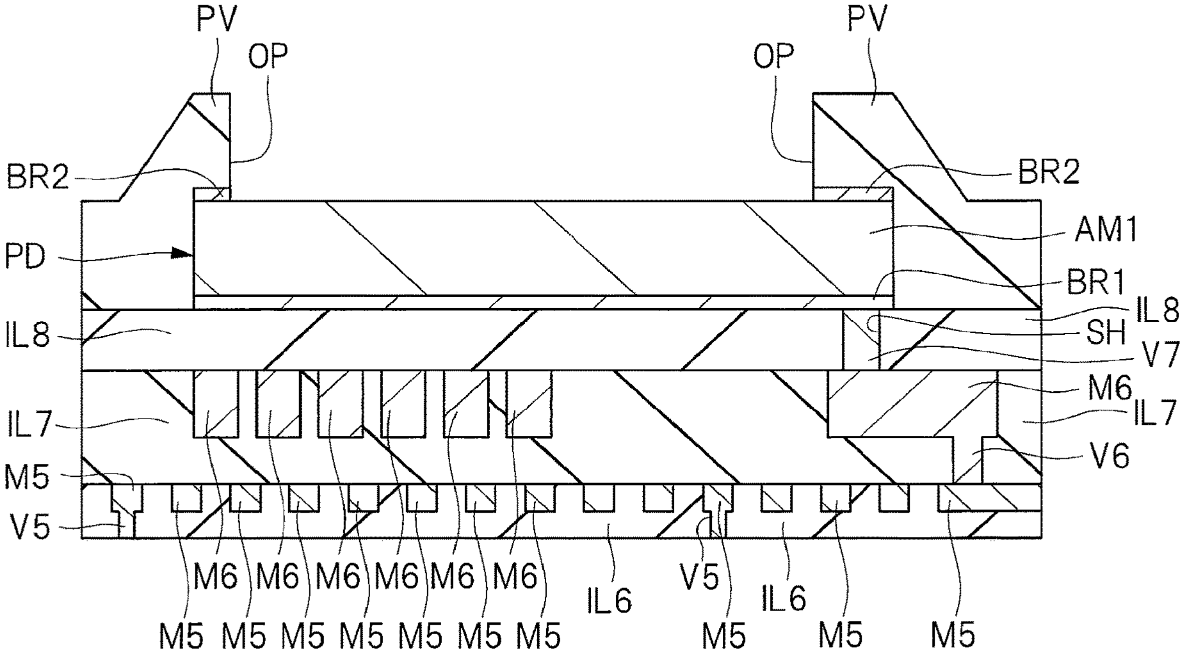
FIG. 19 is a cross-sectional view of the principle part of the semiconductor device during a manufacturing process continued from FIG. 18.

Subsequently, as shown in FIG. 19, the opening OP is formed in the insulating film PV. For example, a photoresist pattern (not illustrated) is formed on the insulating film PV by the photolithography technique, and then, the insulating film PV is etched while using the photoresist pattern as an etching mask, so that the opening OP can be formed in the insulating film PV. Then, the photoresist pattern is removed, and this stage is shown in FIG. 19.

In the etching process of forming the opening OP in the insulating film PV, the insulating film PV is etched to form the opening OP in the insulating film PV and to expose the barrier conductor film BR2 of the pad PD at the opening OP, and then, the barrier conductor film BR2 exposed at the opening OP is further etched and removed, so that the Al-content conductive film AM1 of the pad PD can be exposed at the opening OP. That is, in the region overlapping the opening OP in a plan view, not only the insulating film PV but also the barrier conductor film BR2 making up the pad PD are etched and removed, and therefore, the upper surface of the Al-content conductive film AM1 making up the pad PD is exposed. On the other hand, in the region covered with the insulating film PV even after the opening OP is formed, the barrier conductor film BR2 is not removed but left.

After that, a metal film (not illustrated) can be formed on the pad PD (the Al-content conductive film AM1) exposed at the opening OP if needed. As this metal film, for example, a palladium film or others can be used. For example, the metal film (e.g., palladium film) is formed on the insulating film PV including apart on the side wall of the opening OP and a part on the pad PD (the Al-content conductive film AM1) exposed at the opening OP, and then, this metal film is patterned by using the photolithography technique and the etching technique. By this process, a structure in which the metal film (e.g., palladium film) is formed on the pad PD (the Al-content conductive film AM1) exposed at the opening OP can be obtained.

In this manner, as described with reference to FIGS. 12 to 19, the semiconductor substrate SB is subjected to a wafer process. The wafer process is referred to also as pretreatment. This wafer process is generally described as a process forming various elements (MISFET, etc.), wiring layers (wiring lines M1 to M6), and pad electrodes (pads PD) on a main surface of a semiconductor wafer (semiconductor substrate SB), forming a surface protective film (insulating film PV), and causing a state in which an electrical test for each of a plurality of chip regions formed on the semiconductor wafer can be performed by using a probe or others. Each chip region of the semiconductor wafer corresponds to a region from which one semiconductor chip (the semiconductor device CP in this case) can be obtained.

Subsequently, the probing check (probing test, wafer test) is performed while using the pad PD exposed at the opening OP, so that the electrical test for each chip region of the semiconductor wafer (semiconductor substrate SB) is performed. Specifically, as shown in FIG. 11, in each chip region of the semiconductor wafer (semiconductor substrate SB), the electrical check (electrical test) is performed for each chip region while bring the check (test) probe PRB into contact with the probe contact region PA of the pad PD, which is exposed at the opening OP. It is determined whether each chip region of the semiconductor wafer (semiconductor substrate SB) is defective or non-defective based on the result of this probing check, or measurement result data of the probing check is fed back to each manufacturing process, so that the result is helpful for improving the yield or the product reliability. Note that each chip region of the semiconductor wafer corresponds to a region from which one semiconductor chip (a semiconductor chip corresponding to the semiconductor device CP) can be obtained.

After that, the back surface of the semiconductor substrate SB is ground or polished to reduce the thickness of the semiconductor substrate SB (back surface grinding process) if needed, and then, the semiconductor substrate SB is diced (cut) together with the stacked structure on the semiconductor substrate SB (dicing process). In this process, the semiconductor substrate SB and the stacked structure on the semiconductor substrate SB are diced (cut) along a scribing region. In this manner, the semiconductor substrate SB and stacked structure on the semiconductor substrate SB are (individually) divided into a plurality of semiconductor chips.

In this manner, the semiconductor device (semiconductor chip) CP can be manufactured.

Study Example

Figure 20:
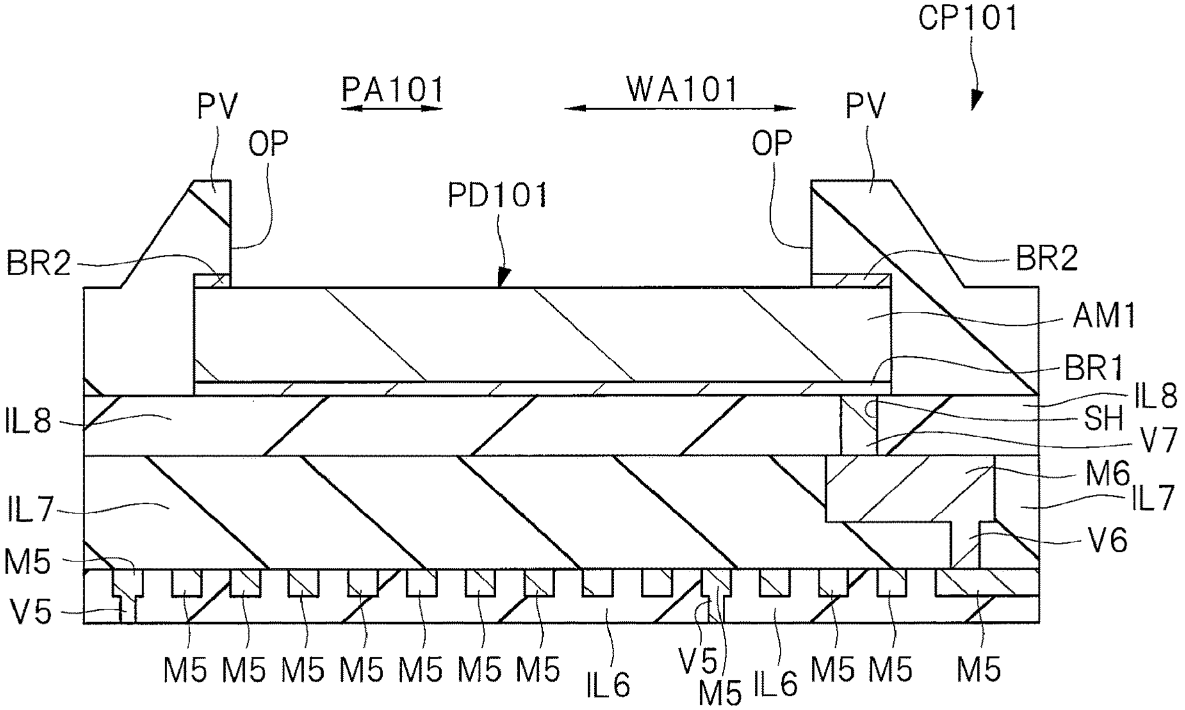
FIG. 20 is a cross-sectional view of a principle part of a semiconductor device of a first study example.
Figure 21:
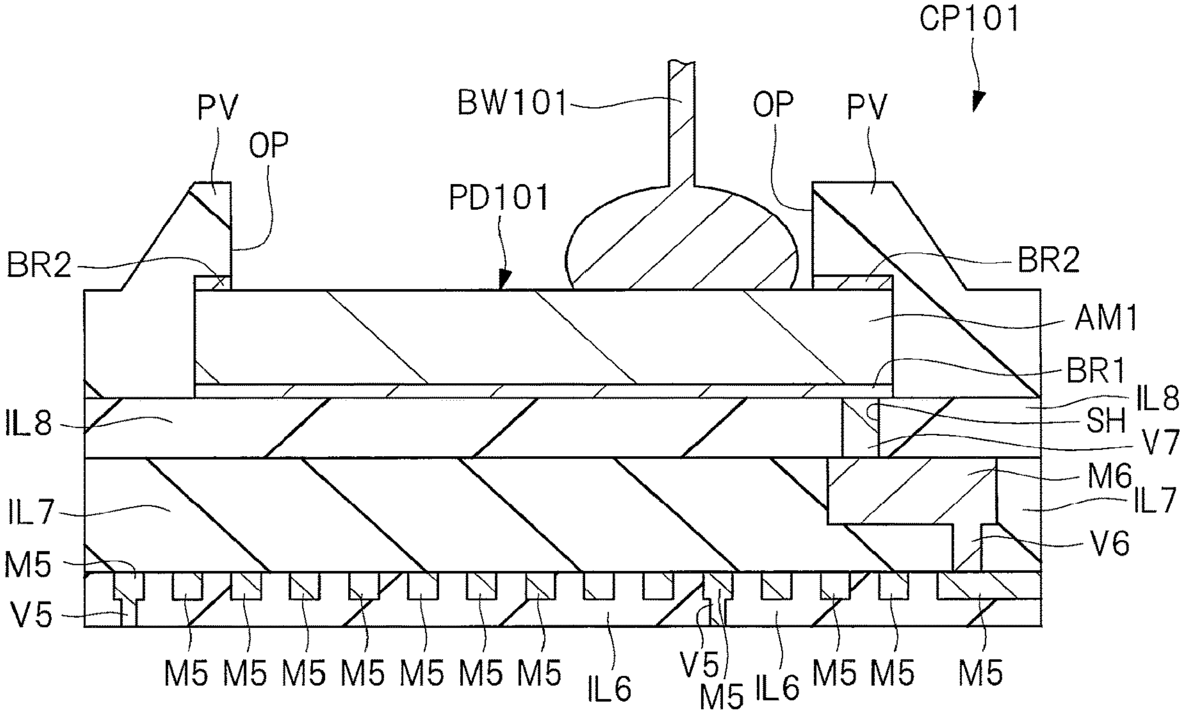
FIG. 21 is a cross-sectional view showing a state in which a copper wire is electrically connected to a pad shown in FIG. 20.

FIG. 20 is a cross-sectional view of a principle part of a semiconductor device (semiconductor chip) CP101 of a first study example studied by the present inventors, and corresponds to FIG. of the present embodiment described above. FIG. 21 is a cross-sectional view showing a state in which a copper wire BW101 is electrically connected to a pad PD101 of the semiconductor device CP101 of the first study example, and corresponds to FIG. 8 of the present embodiment described above.

In the semiconductor device CP101 of the first study example shown in FIGS. 20 and 21, almost the whole of the region immediately below the pad PD101 is specified as the arrangement prohibited region for the wiring line M6. In other words, the whole of the region overlapping the opening OP at which the pad PD101 is exposed in a plan view is specified as the arrangement prohibited region for the wiring line M6. Therefore, in the semiconductor device CP101 of the first study example, the wiring line M6 is not arranged in an almost whole part immediately below the pad PD101, and the wiring line M6 is arranged in neither a part immediately below a wire bonding region WA101 nor a part immediately below a probe contact region PA101. In this study example, the region corresponding to the probe contact region PA on the upper surface of the pad PD101 is referred to as probe contact region PA101, and the region corresponding to the wire bonding region WA thereon is referred to as wire bonding region WA101.

In the first study example shown in FIGS. 20 and 21, almost the whole of the region immediately below the pad PD101 is specified as the arrangement prohibited region for the wiring line M6, and therefore, a degree of freedom in laying out the wiring lines M6 is reduced, and it is difficult to design the wiring of the semiconductor device CP101. And, it is required to arrange the wiring line M6 so as to avoid the region immediately below the pad PD101, and therefore, this arrangement is disadvantageous for downsizing the semiconductor device CP101, thus leading to increase in a plane dimension of the semiconductor device CP101.

Figure 22:
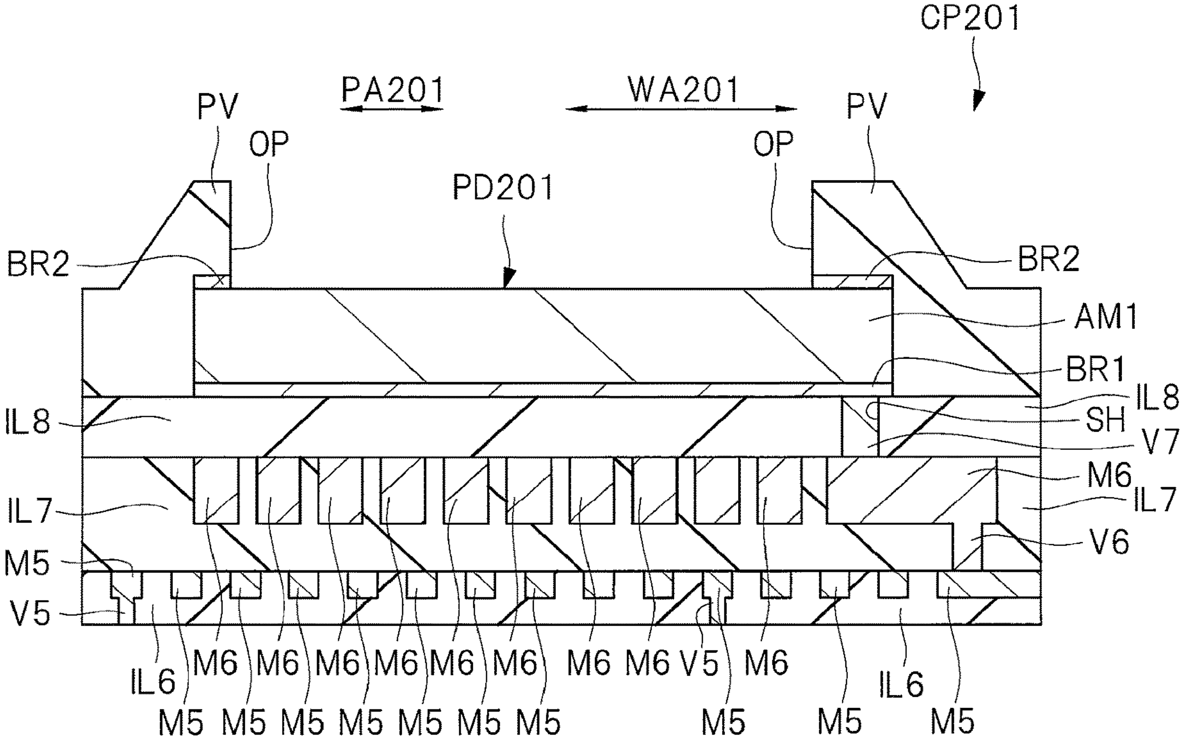
FIG. 22 is a cross-sectional view of a principle part of a semiconductor device of a second study example.
Figure 23:
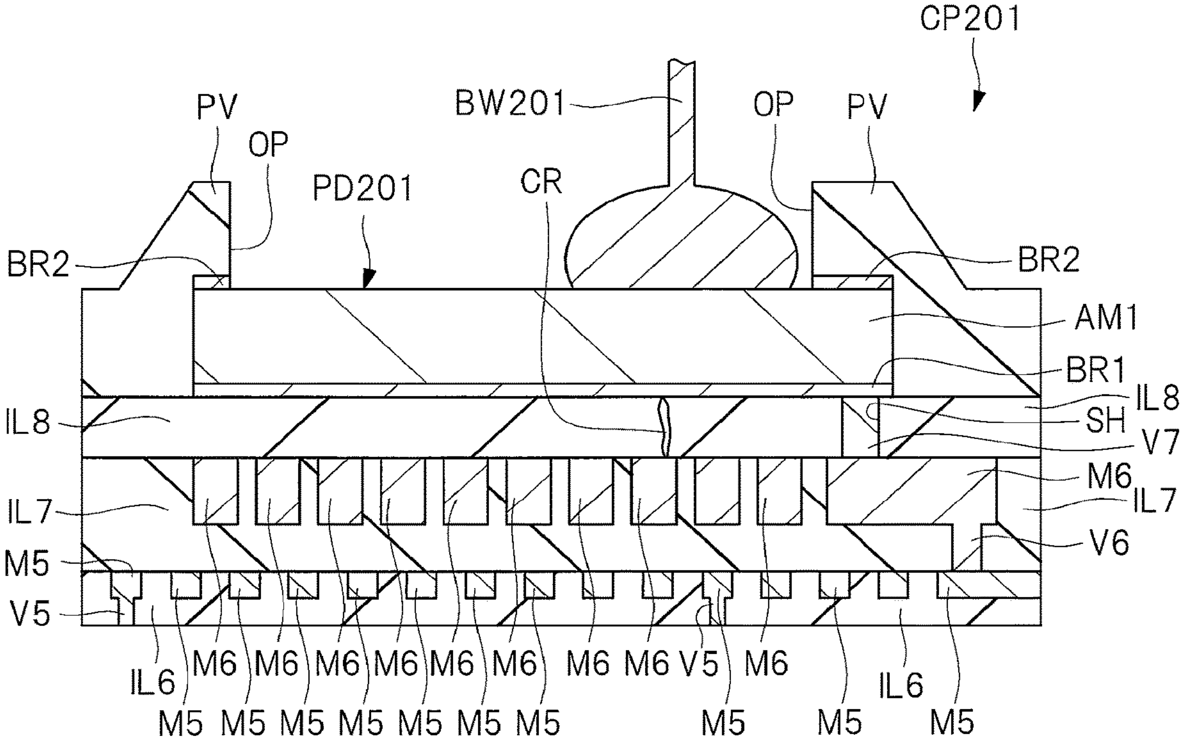
FIG. 23 is a cross-sectional view showing a state in which a copper wire is electrically connected to a pad shown in FIG. 22.

FIG. 22 is a cross-sectional view of a principle part of a semiconductor device (semiconductor chip) CP201 of a second study example studied by the present inventors, and corresponds to FIG. of the present embodiment described above. FIG. 23 is a cross-sectional view showing a state in which a copper wire BW201 is electrically connected to a pad PD201 of the semiconductor device CP201 of the second study example, and corresponds to FIG. 8 according to the present embodiment described above.

In the semiconductor device CP201 of the second study example shown in FIGS. 22 and 23, the whole of the region immediately below the pad PD101 is specified as the arrangement allowed region for the wiring line M6. Therefore, in the second study example shown in FIGS. 22 and 23, the wiring line M6 is arranged immediately below a probe contact region PA201, and the wiring line M6 is also arranged immediately below a wire bonding region WA201. In other words, in a plan view in the second study example, the wiring line M6 is arranged in a region overlapping the probe contact region PA201, and the wiring line M6 is also arranged in a region overlapping the wire bonding region WA201. In this study example, the region corresponding to the probe contact region PA on the upper surface of the pad PD201 is referred to as probe contact region PA201, and the region corresponding to the wire bonding region WA thereon is referred to as wire bonding region WA201.

The present inventors have studied the connection of the copper wire to the pad of the semiconductor chip, and have found that the second study example shown in FIGS. 22 and 23 has the following problems.

A copper (Cu) wire is material harder than a gold (Au) wire. Therefore, in the wire bonding process of connecting the copper wire to the pad of the semiconductor chip, a strong external force (pressure) is adversely applied to the wire bonding regions (WA, WA101, WA201) of the pad of the semiconductor chip. When the usage of the copper wire is compared with the usage of the gold wire, the external force (pressure) applied to the wire bonding regions (WA, WA101, WA201) of the pad of the semiconductor chip in the the wire bonding process is larger in the usage of the copper wire than the usage of the gold wire. In the wire bonding process, a ball on a tip of the copper wire is pressed against the pad of the semiconductor chip to be compressed and bonded thereto. When the copper wire is used, the hardness of the copper (Cu) is high, and therefore, the ball on the tip of the copper wire cannot be properly compressed and bonded to the pad of the semiconductor chip if the compressive-bonding pressure is not large enough. For this reason, in the wire bonding process using the copper wire, a large external force (compressive-bonding pressure) is adversely applied to the wire bonding regions (WA, WA101, WA201) of the pad of the semiconductor chip to which the copper wire is connected.

When the compressive-bonding pressure in the wire bonding process is large, the semiconductor device CP201 of the second study example shown in FIGS. 22 and 23 has a risk of occurrence of cracks in an insulating film (the interlayer insulating film IL8 in this case) below the pad PD201 because of the usage of the copper wire.

Specifically, when a strong external force is applied to the wire bonding region WA201 of the pad PD201 in the wire bonding process using the copper wire, a strong stress is applied to the insulating film (the interlayer insulating film IL8 in this case) that is sandwiched from above and below by the pad PD201 of the wire bonding region WA201 and the wiring line M6 below the wire bonding region WA201 to cause cracks CR (see FIG. 23).

Once the cracks CR are caused in the insulating film (the interlayer insulating film IL8 in this case) below the pad PD201, a risk of reduction in the reliability of the semiconductor device is caused since moisture, etc., infiltrates from the cracks CR. And, by heat stress caused when the semiconductor package is manufactured, the risk of reduction in the reliability of the semiconductor device is caused since the pad PD201, etc., is peeled off from the cracks CR. Therefore, in order to improve the reliability of the semiconductor device, it is desirable not to cause the cracks in the insulating film below the pad even in the wire bonding process using the copper wire.

<Major Features and Effects>

One of major features of the present embodiment is that, in the semiconductor device CP, the pad PD is used as the pad for copper wire connection, and that the wiring line M6 is arranged below the pad PD so that the wiring line M6 is arranged immediately below a region other than the wire bonding region WA of the pad PD but the conductor pattern in the same layer as that of the wiring line M6 is not arranged immediately below the wire bonding region WA of the pad PD.

When the wiring line M6 is arranged immediately below the wire bonding region WA as different from the present embodiment, that is, when the wiring line M6 is arranged in the region overlapping the wire bonding region WA in a plan view, there is the risk of occurrence of the cracks in the insulating film (the interlayer insulating film IL8) below the pad PD as described above in the first study example. This is because, by the application of the strong external force (compressive-bonding pressure) to the wire bonding region WA of the pad PD in the wire bonding process using the copper wire, the strong stress is applied to the insulating film (the interlayer insulating film IL8 in this case) that is sandwiched from above and below by the pad PD in the wire bonding region WA and the wiring line M6 below the wire bonding region WA to cause the cracks.

On the other hand, in the present embodiment, no wiring line M6 is arranged in the region overlapping the wire bonding region WA in a plan view, that is, no wiring line M6 is arranged immediately below the wire bonding region WA. In the wire bonding process, a place to which the strong external force (compressive-bonding pressure) is applied is the wire bonding region WA of the pad PD. Therefore, if no wiring line M6 is arranged immediately below the wire bonding region WA, it can be avoided to cause a state in which the insulating film (IL8) is sandwiched in the wire bonding process from above and below by the pad PD in the wire bonding region WA to which the strong external force is applied and the wiring line M6 below the pad PD, and therefore, the occurrence of the cracks in the insulating film (IL8) below the pad PD can be suppressed or prevented.

In other words, the arrangement of the wiring line M6 in the part below the pad PD causes the state (structure) in which the insulating film (the interlayer insulating film IL8 in this case) is sandwiched from above and below by the pad PD and the wiring line M6 below the pad PD. In this state, when the strong external force (compressive-bonding pressure in the wire bonding in this case) is applied to the upper surface of the pad PD, the strong stress because of the external force may be caused in the insulating film (IL8) that is sandwiched from above and below by the pad PD and the wiring line M6 below the pad PD, which results in the occurrence of the cracks in the insulating film (IL8). The cracks are caused by the application of the stress to the insulating film (IL8) that is sandwiched from above and below by a part of the pad PD to which the strong external force is applied and the wiring line M6 below the pad PD, the stress being caused by the external force applied to the pad PD. Therefore, in order to prevent the cracks in the insulating film (IL8) below the pad PD, it is effective not to arrange the wiring M6 in a part below the region of the pad PD to which the strong external force (the compressive-bonding pressure in the wire bonding in this case) is applied. That is, in order to prevent the cracks in the insulating film (IL8) below the pad PD, it is effective not to arrange the wiring M6 in the part below the wire bonding region WA of the pad PD to which the strong external force is applied in the wire bonding process as offered in the present embodiment. In this manner, even if the strong external force (the compressive-bonding pressure in the wire bonding) is applied to the upper surface of the pad PD, it can be avoided to cause the state in which the insulating film (IL8) is sandwiched by the pad PD in the part to which the strong external force is applied and the wiring line M6 below the pad PD because of no existence of the wiring line M6 below the part (the wire bonding region WA) to which the strong external force is applied, and therefore, the occurrence of the cracks in the insulating film (IL8) below the pad PD can be suppressed or prevented.

According to the present embodiment, note that no wiring line M6 is arranged immediately below the wire bonding region WA of the pad PD. In other words, no conductor pattern (wiring line) in the same layer as that of the wiring line M6 is formed immediately below the wire bonding region WA of the pad PD.

According to the present embodiment, although the whole of the region immediately below the pad PD is not specified as the arrangement prohibited region for the wiring line M6, the region immediately below the wire bonding region WA in the region below the pad PD is specified as the arrangement prohibited region for the wiring line M6. On the other hand, the region other than the region immediately below the wire bonding region WA in the region immediately below the pad PD is specified as the arrangement allowed region for the wiring line M6. Therefore, according to the present embodiment, the wiring line M6 is arranged in the region other than the region immediately below the wire bonding region WA in the region immediately below the pad PD. In other words, the wiring line M6 immediately below the pad PD is arranged immediately below the region other than the wire bonding region WA in the pad PD. That is, in a plan view, the wiring line M6 is arranged in the region overlapping the pad PD but not overlapping the wire bonding region WA. In this manner, according to the present embodiment, while the wiring line M6 is also arranged below the pad PD and the wiring line M6 is arranged in the region overlapping the opening OP of the insulating film PV in a plan view, the wiring line M6 is arranged so as to avoid the part immediately below the wire bonding region WA since the region immediately below the wire bonding region WA is specified as the arrangement prohibited region for the wiring line M6.

In the present embodiment, the wiring line M6 can be arranged in the part immediately below the pad PD, the part not including the wire bonding region WA, and therefore, the degree of freedom in laying out the wiring line M6 is larger than that in the above-described first study example, and it is easier to design the wiring line of the semiconductor device CP. Since the wiring line M6 can be arranged in the part immediately below the pad PD, the part not including the wire bonding region WA, this arrangement is advantageous for the downsizing of the semiconductor device CP, and the plane dimension (plane area) of the semiconductor device CP can be reduced.

Another one of the major features of the present embodiment is that, in the present embodiment, the region immediately below the wire bonding region WA is specified as the arrangement prohibited region for the wiring line M6 while the region immediately below the probe contact region PA is specified as the arrangement allowed region for the wiring line M6 so that the wiring line M6 is not arranged immediately below the wire bonding region WA while the wiring line M6 is arranged immediately below the probe contact region PA. That is, according to the present embodiment, while the wiring line M6 is not arranged in the region overlapping the wire bonding region WA in a plan view, the wiring line M6 is arranged in the region overlapping the probe contact region PA in a plan view.

To the upper surface of the pad PD, the external force (pressure) is applied in the probing check process and the wire bonding process. Therefore, regions which are on the upper surface of the pad PD and to which a relatively large external force is applied before completion of the semiconductor package are the probe contact region PA and the wire bonding region WA. When the external force is applied to the pad, if the external force is large, there is a possibility of the occurrence of the cracks in the insulating film (IL8) below the pad PD because of the external force, and the cracks tend to occur when the insulating film (IL8) is sandwiched by the part of the pad to which the external force is applied and the wiring line M6 below the pad. Therefore, when no wiring line M6 is arranged immediately below the wire bonding region WA to which the strong external force is applied in the wire bonding process as offered in the present embodiment, even if the strong external force is applied to the wire bonding region WA of the pad PD in the wire bonding process, the occurrence of the cracks in the insulating film (IL8) below the pad PD because of the external force can be suppressed or prevented. On the other hand, since an external force (external force in the probing check process) applied to the probe contact region PA is relatively smaller than an external force (external force in the wire bonding process) applied to the wire bonding region WA, a possibility (risk) of the occurrence of the cracks in the insulating film (IL8) in the probing check process is lower than a possibility (risk) of the occurrence of the cracks in the insulating film (IL8) in the wire bonding process.

therefore, according to the present embodiment, in the wire bonding process having a relatively high possibility (risk) of the occurrence of the cracks in the insulating film (IL8) below the pad PD, no wiring line M6 is arranged immediately below the wire bonding region WA of the pad PD to which the external force is applied in order to reduce the possibility. Meanwhile, since the probing check process has a relatively lower possibility (risk) of the occurrence of the cracks in the insulating film (IL8) below the pad PD than that of the wire bonding process, the wiring line M6 is arranged immediately below the probe contact region PA of the pad PD to which the external force is applied in the probing check process. Thus, according to the present embodiment, while the region immediately below the wire bonding region WA is specified as the arrangement prohibited region for the wiring line M6 so that no wiring line M6 is arranged immediately below the wire bonding region WA, the region immediately below the probe contact region PA is specified as the arrangement allowed region for the wiring line M6 so that the wiring line M6 is arranged immediately below the probe contact region PA.

A reason why the external force (the external force in the probing check process) applied to the probe contact region PA is relatively smaller than the external force (the external force in the wire bonding process) applied to the wire bonding region WA is that the wire (BW) connected to the pad PD is the copper (Cu) wire. The copper (Cu) wire requires a larger compressive-bonding pressure in the wire bonding than that of a gold (Au) wire, etc. Therefore, in the wire bonding process of connecting the copper wire (BW) to the pad PD of the semiconductor device CP, the strong external force is necessarily applied to the wire bonding region WA of the pad PD. On the other hand, to the probe contact region PA of the pad PD, the probe is pressed in the probing check, and therefore, the external force (pressure) caused by the probe is applied. However, since the large compressive-bonding pressure is required in the wire bonding when the copper wire is used as the wire BW connected to the pad PD, the external force applied to the wire bonding region WA of the pad PD in the wire bonding process becomes larger than the external force applied to the probe contact region PA of the pad PD in the probing check process. In other words, the external force applied to the probe contact region PA of the pad PD in the probing check process becomes smaller than the external force applied to the wire bonding region WA of the pad PD in the wire bonding process. Therefore, when the copper wire is used as the wire BW connected to the pad PD, the large compressive-bonding pressure is required in the wire bonding, and therefore, the external force (the external force in the probing check process) applied to the probe contact region PA becomes necessarily relatively smaller than the external force (the external force in the wire bonding process) applied to the wire bonding region WA.

For this reason, according to the present embodiment, the wiring line M6 is configured not to be arranged in the wire bonding region WA having the large applied external force by setting the region immediately below the wire bonding region WA as the arrangement prohibited region for the wiring line M6. And, the wiring line M6 is configured to be arranged in the probe contact region PA having the smaller applied external force than that of the wire bonding region WA by setting the region immediately below the probe contact region PA as the arrangement allowed region for the wiring line M6. By these configurations, the arrangement prohibited region for the wiring line M6 is limited to increase the arrangement allowed region for the wiring line M6 while the occurrence of the cracks in the insulating film (IL8) below the pad PD because of the external force applied to the pad is efficiently suppressed or prevented, and therefore, the degree of freedom in laying out the wiring line M6 increases, and it becomes easy to design the wiring line of the semiconductor device CP. In addition, these configurations are advantageous for the downsizing of the semiconductor device CP, and the plane dimension (plane area) of the semiconductor device CP can be reduced.

According to the present embodiment, the wiring line M6 is arranged immediately below the probe contact region PA. Therefore, when the probe is pressed against the probe contact region PA of the pad PD in the probing check process to apply the external force thereto, the stress is applied to the insulating film (the interlayer insulating film IL8 in this case) that is sandwiched from above and below by the probe contact region PA of the pad PD and the wiring line M6 below the probe contact region PA. However, as described above, the external force applied to the probe contact region PA of the pad PD in the probing check process is smaller than the external force applied to the wire bonding region WA of the pad PD in the wire bonding process. For this reason, the possibility of the occurrence of the cracks in the interlayer insulating film IL8 because of the external force applied to the pad PD in the probing check process in the present embodiment is lower than the possibility of the occurrence of the cracks in the interlayer insulating film IL8 because of the external force applied to the pad PD201 in the wire bonding process in the second study example. Therefore, the possibility of the occurrence of the cracks in the interlayer insulating film IL8 below the pad because of the external force applied to the pad is lower in the present embodiment than the second study example. In this manner, according to the present embodiment, the occurrence of the cracks in the interlayer insulating film IL8 below the pad can be suppressed or prevented, and therefore, the reliability of the semiconductor device can be improved. Also, the production yield of the semiconductor device can be improved.

As different from the present embodiment, it is assumed here to apply a structure in which the wiring line M6 is arranged immediately below the wire bonding region WA while the wiring line M6 is not arranged immediately below the probe contact region PA. This structure is effective for the case of the gold wire as the wire connected to the pad. On the other hand, the case of the copper wire as the wire connected to the pad has the risk of the occurrence of the cracks in the insulating film below the pad in the wire bonding process as similar to the second study example. A reason for this is as follows. That is, in the case of the gold wire as the wire connected to the pad, the external force applied to the pad in the wire bonding process is small, and therefore, the cracks are difficult to occur in the insulating film below the pad even if the wiring line M6 is arranged immediately below the wire bonding region WA. However, in the case of the copper wire as the wire connected to the pad, the external force applied to the pad in the wire bonding process is large, and therefore, the cracks are easy to occur in the insulating film below the pad when the wiring line M6 is arranged immediately below the wire bonding region WA. Therefore, as different from the present embodiment, the structure in which the wiring line M6 is arranged immediately below the wire bonding region WA while the wiring line M6 is not arranged immediately below the probe contact region PA has the risk of the occurrence of the cracks in the insulating film below the pad in the wire bonding process as similar to the second study example.

Thus, the structure in which the wiring line M6 is not arranged immediately below the wire bonding region WA while the wiring line M6 is arranged immediately below the probe contact region PA as offered in the present embodiment is the effective structure for the case of the copper wire as the wire (BW) connected to the pad PD. Therefore, it can be said that the structure in which the wiring line M6 is arranged immediately below not the wire bonding region WA but the probe contact region PA as offered in the present embodiment could have been made only because the present inventors have studied the application of the copper wire, and found that the cracks are easy to occur in the insulating film below the pad when the copper wire is used since the compressive-bonding pressure in the wire bonding is large.

According to the present embodiment, the wiring line M6 is arranged immediately below the probe contact region PA. Therefore, when the probe is pressed against the probe contact region PA of the pad PD to apply the external force (pressure) thereto in the probing check process, the stress is applied to the insulating film (IL8) that is sandwiched from above and below by the pad PD of the probe contact region PA and the wiring line M6 below the probe contact region PA. Therefore, in the probing check process, it is difficult to completely eliminate the possibility (risk) of the occurrence of the cracks in the insulating film (IL8) below the pad PD. Therefore, it is desirable not to cause the cracks in the insulating film (IL8) below the pad PD as much as possible even in the probing check process by improving the probing check process. From this point of view, in the probing check process, not a cantilever type probe card but a vertical type probe card (vertical probe card) is preferably used.

When the cantilever type probe card is used, the cantilever type probe is pressed against the prove contact region PA of the pad PD. In this case, the tip of the probe is pressed against the upper surface of the pad PD, and causes such an action (a force) as scratching the upper surface of the pad PD in a lateral direction (a direction substantially parallel to the upper surface of the pad PD).

FIG. 11 described above shows a case of the usage of the vertical type probe card, and a probe PRB shown in FIG. 11 corresponds to the probe of the vertical type probe card. In the case of the usage of the vertical type probe card, the probe PRB extending in a direction substantially perpendicular to the upper surface of the pad PD (a normal direction to the upper surface of the pad PD) is pressed against the probe contact region PA on the upper surface of the pad PD in the direction substantially perpendicular to the upper surface of the pad PD. At this time, when the tip of the probe PRB is pressed against the probe contact region PA of the pad PD, the tip of the probe PRB does not move in a lateral direction. Therefore, in the case of the usage of the vertical type probe card, even if the external force is applied to the upper surface of the pad PD in the direction substantially perpendicular thereto when the tip of the probe PRB is pressed against the upper surface of the pad PD, such an action (a force) as scratching the upper surface of the pad PD in the lateral direction (the direction substantially parallel to the upper surface of the pad PD) is not caused.

In the probing check process, the case of the usage of the cantilever type probe card is easy to cause the cracks in the insulating film (IL8) below the pad PD caused by the pressing of the probe against the probe contact region PA of the pad PD to apply the external force thereto. In contrast, the case of the usage of the vertical type probe card is difficult to cause the cracks in the insulating film (IL8) below the pad PD. This is because, if the external force applied to the probe contact region PA of the pad PD in the probing check process is only an external force component in a direction substantially perpendicular to the upper surface of the pad PD, the cracks are difficult to occur in the insulating film (IL8) even if the stress is applied to the insulating film (IL8) that is sandwiched from above and below by the pad PD of the probe contact region PA and the wiring line M6 below the probe contact region PA. Such a case corresponds to the case of the usage of the vertical type probe card.

On the other hand, the case of the usage of the cantilever type probe card generates such an action (force) as causing the tip of the probe to scratch the upper surface of the pad PD in the lateral direction. This action causes the stress that results in the cracks in the insulating film (IL8) that is sandwiched from above and below by the pad PD of the probe contact region PA and the wiring line M6 below the probe contact region PA, and thus, easily causes the cracks. That is, such an action (force) as causing the tip of the probe to scratch the upper surface of the pad PD in the lateral direction has a risk of the easiness of the occurrence of the cracks in the insulating film (IL8) below the pad PD. Therefore, in the probing check process, it is desirable not to cause such an action (force) as causing the tip of the probe to scratch the upper surface of the pad PD in the lateral direction.

Therefore, according to the present embodiment, it is preferable to use the vertical type probe card in the probing check process. In this manner, even if the wiring line M6 is arranged immediately below the probe contact region PA, the possibility of the occurrence of the cracks in the insulating film (IL8) below the pad PD can be further reduced, and the occurrence of the cracks in the insulating film (IL8) below the pad PD can be further reliably suppressed or prevented. Therefore, the reliability of the semiconductor device can be further improved.

In this manner, according to the present embodiment, the occurrence of the cracks in the insulating film (IL8) because of the external force applied to the pad by the probe can be difficult to occur by the preferable usage of the vertical type probe card in the probing check process, so that the wiring line M6 can be arranged immediately below the probe contact regions PA. Meanwhile, since it cannot be avoided to cause the large external force applied to the pad in the wire bonding because of the usage of the copper wire for the wire bonding, no wiring line M6 is arranged immediately below the wire bonding region WA so that the cracks caused by the external force applied to the pad in the wire bonding are difficult to occur in the insulating film (IL 8). In this manner, in the probing check process having the possibility of the application of the external force to the pad and the wire bonding process, the occurrence of the cracks in the insulating film (IL 8) because of the external force applied to the pad can be suppressed or prevented, and the reliability of the semiconductor device can be improved. And, since the wiring line M6 can be arranged immediately below the prove contact region PA, the degree of freedom in laying out the wiring line M6 can be increased, and thus, it can be easy to design the wiring line of the semiconductor device. And, this manner is advantageous for the downsizing of the semiconductor device, and thus, the plane dimension (plane area) of the semiconductor device can be reduced.

Subsequently, the wiring lines in the lower layers than the wiring line M6 will be described.

The wiring lines M1, M2, M3, M4, and M5 in the lower layers than the wiring line M6 can be arranged in the regions immediately below the pad PD. That is, the whole of the regions immediately below the pad PD is specified as arrangement allowed regions for the wiring lines M1, M2, M3, M4, and M5. Therefore, while the wiring line M6 cannot be arranged immediately below the wire bonding region WA, the wiring lines M1, M2, M3, M4, and M5 can be arranged immediately below the wire bonding region WA. In other words, while no wiring line M6 is arranged in the region overlapping the wire bonding region WA in a plan view, the wiring lines M1, M2, M3, M4, and M5 can be arranged even in the region overlapping the wire bonding region WA in a plan view. That is, the region immediately below the wire bonding region WA is the arrangement prohibited region for the wiring line M6 but the arrangement allowed region for the wiring lines M1, M2, M3, M4, and M5. The region immediately below the probe contact region PA is the arrangement allowed region for the wiring line M6, and besides, the arrangement allowed region for the wiring lines M1, M2, M3, M4, and M5. Thus, the wiring line M6 can be arranged immediately below the probe contact region PA, and the wiring lines M1, M2, M3, M4, and M5 can be also arranged immediately below the probe contact region PA. That is, the wiring line M6 cannot but the wiring lines M1, M2, M3, M4, and M5 in the lower layers than the wiring line M6 can be arranged immediately below the wire bonding region WA of the region immediately below the pad PD, and not only the wiring line M6 but also the wiring lines M1, M2, M3, M4, and M5 in the lower layers than the wiring line M6 can be arranged immediately below the probe contacting region WA of the same.

That is, in the wiring layer (the wiring layer including the wiring line M6) that is lower by one layer than the wiring layer where the pad PD is formed, the wiring line M6 is arranged immediately below the pad PD, and this wiring line M6 below the pad PD is arranged so as to avoid a part immediately below the wire bonding region WA and arranged also in the region immediately below the probe contact region PA. On the other hand, in the wiring layer (the wiring layer including the wiring line M5) that is lower by two layers than the wiring layer where the pad PD is formed, the wiring line M5 is arranged below the pad PD, and the wiring line M5 below the pad PD can be also arranged immediately below the wire bonding region WA, and besides, immediately below the region other than the wire bonding region WA, and therefore, can be arranged also in the region immediately below the probe contact region PA.

Therefore, in the case of FIGS. 6 and 7 shown above, the plurality of wiring lines M5 are arranged below the pad PD so that these wiring lines M5 arranged below the pad PD include a wiring line M5 arranged immediately below the wire bonding region WA of the pad PD and a wiring line M5 arranged immediately below the region other than the wire bonding region WA of the pad PD. The region immediately below the probe contact region PA is the arrangement allowed region for the wiring line M5, and therefore, the plurality of wiring lines M5 arranged below the pad PD in the case of FIGS. 6 and 7 include wiring line M5 arranged immediately below the prove contact region PA of the pad PD. In this manner, a degree of freedom in laying out the wiring line M5 can be increased, and thus, it can be easy to design the wiring line of the semiconductor device. And, this manner is advantageous for the downsizing of the semiconductor device, and thus, the plane dimension (plane area) of the semiconductor device can be reduced. The arrangements of the wiring lines M1, M2, M3, and M4 are the same as that of the wiring line 5.

Note that the whole of the region immediately below the pad PD is the arrangement allowed region for the wiring lines M1, M2, M3, M4, and M5, and therefore, any of the wiring lines M1, M2, M3, M4, and M5 can be arranged immediately below the pad PD. Therefore, in addition to a case of arranging all of the wiring lines M1, M2, M3, M4, and M5 immediately below the pad PD, a case of arranging any of the wiring lines M1, M2, M3, M4, and M5 immediately below the pad PD while arranging another of the wiring lines M1, M2, M3, M4, and M5 immediately below the pad PD may be applied. For example, a case of arranging all of the wiring lines M1, M2, M3, M4, and M5 immediately below the pad PD, a case of arranging the wiring lines M1, M3, and M5 but not arranging the wiring lines M2 and M4 immediately below the pad PD, or other cases may be applied. Therefore, while the case of arranging all of the wiring lines M1, M2, M3, M4, and M5 immediately below the wire bonding region WA may be applied, not only this case but also a case of arranging any of the wiring lines M1, M2, M3, M4, and M5 immediately below the wire bonding region WA but not arranging another of the wiring lines M1, M2, M3, M4, and M5 immediately below the wire bonding region WA may be applied. Similarly, while the case of arranging all of the wiring lines M1, M2, M3, M4, and M5 immediately below the probe contacting region PA may be applied, not only this case but also a case of arranging any of the wiring lines M1, M2, M3, M4, and M5 immediately below the probe contacting region PA but not arranging another of the wiring lines M1, M2, M3, M4, and M5 immediately below the probe contacting region PA may be applied.

A reason why the wiring line M6 cannot but the wiring line M5 can be arranged immediately below the wire bonding region WA is as follows.

If the wiring line M6 is arranged immediately below the wire bonding region WA, the strong external force is applied to the wire bonding region WA of the pad PD in the wire bonding process using the copper wire, and therefore, there is the risk of the occurrence of the cracks in the insulating film (IL8) because of the application of the strong stress to the insulating film (IL8) that is sandwiched from above and below by the pad PD of the wire bonding region WA and the wiring line M6 below the wire bonding region WA caused by the external force. Therefore, no wiring line M6 is arranged immediately below the wire bonding region WA. On the other hand, if the wiring line M5 is arranged immediately below the wire bonding region WA, the strong external force is applied to the wire bonding region WA of the pad PD in the wire bonding process using the copper wire, and therefore, the stress is applied to the insulating films (the interlayer insulating films IL7 and IL8 in this case) that are sandwiched from above and below by the pad PD of the wire bonding region WA and the wiring line M5 below the wire bonding region WA. However, a distance between the pad PD and the wiring line M5 is large, and therefore, influence of the stress is not so large even if the stress is applied to the insulating films (IL7 and IL8) that are sandwiched from above and below by the pad PD of the wire bonding region WA and the wiring line M5 below the wire bonding region WA in the wire bonding process, so that the occurrence of the cracks in the insulating films (IL7 and IL8) can be avoided. For this reason, even if the wiring line M5 is arranged immediately below the wire bonding region WA, the occurrence of the cracks in the insulating films (IL7 and IL8) in the wire bonding process caused by this arrangement can be avoided. Thus, by the arrangement of the wiring line M5 immediately below the wire bonding region WA, the degree of freedom in laying out the wiring line M5 can be increased while suppressing or preventing the occurrence of the cracks in the interlayer insulating films, and thus, it can be easy to design the wiring line of the semiconductor device. And, this manner is advantageous for the downsizing of the semiconductor device, and thus, the plane dimension (plane area) of the semiconductor device can be reduced.

A reason why the wiring lines M1, M2, M3, and M4 can be arranged immediately below the wire bonding region WA is almost the same as the reason why the wiring line M5 can be arranged immediately below the wire bonding region WA. That is, a distance between the pad PD and each of the wiring lines M1, M2, M3 and M4 is large, and therefore, influence of the stress is not so large even if the stress is applied to the insulating films that are sandwiched from above and below by the pad PD of the wire bonding region WA and each of the wiring lines M1, M2, M3 and M4 below the wire bonding region WA in the wire bonding process, so that the occurrence of the cracks in the insulating films can be avoided. Thus, by the arrangement of any of the wiring lines M1, M2, M3 and M4 immediately below the wire bonding region WA, the degree of freedom in laying out each of the wiring lines M1, M2, M3 and M4 can be increased while suppressing or preventing the occurrence of the cracks in the interlayer insulating films, and thus, it can be easy to design the wiring line of the semiconductor device. And, this manner is advantageous for the downsizing of the semiconductor device, and thus, the plane dimension (plane area) of the semiconductor device can be reduced.

In this manner, a distance between the pad PD and the uppermost wiring line M6 of the wiring lines M1, M2, M3, M4, M5, and M6 in the lower layers than the pad PD is small, and therefore, the wiring line M6 is not arranged immediately below the wire bonding region WA so as not to cause the cracks in the insulating layer (IL 8) that is sandwiched from above and below by the pad PD and the wiring line M6 in the wire bonding process. On the other hand, a distance between the pad PD and each of the wiring lines M1, M2, M3, M4, and M5 in the lower layers than the wiring line M6 is large, and therefore, the occurrence of the cracks in the insulating layers can be avoided even if any of the wiring lines M1, M2, M3, M4, and M5 is arranged immediately below the wire bonding region WA. Therefore, the region immediately below the wire bonding region WA is used as the arrangement allowed region for the wiring lines M1, M2, M3, M4 and M5, so that a degree of freedom in laying out each of the wiring lines M1, M2, M3, M4, and M5 can be increased, and thus, it can be easy to design the wiring line of the semiconductor device. And, this manner is advantageous for the downsizing of the semiconductor device, and thus, the plane dimension (plane area) of the semiconductor device can be reduced.

The semiconductor elements (e.g., MISFET1, etc.) formed on the semiconductor substrate SB are distant from the pad PD, and therefore, can be arranged immediately below the pad PD. That is, the semiconductor elements (e.g., MISFET1, etc.) formed on the semiconductor substrate SB cab be arranged immediately below the wire bonding region WA, and besides, immediately below the probe contact region PA. In this manner, a degree of freedom in laying out the semiconductor elements (e.g., MISFET1, etc.) formed on the semiconductor substrate SB can be increased, and thus, it can be easy to design the wiring line of the semiconductor device. And, this manner is advantageous for the downsizing of the semiconductor device, and thus, the plane dimension (plane area) of the semiconductor device can be reduced.

<Layout Example of Pad PD and Wring Line M6>

Subsequently, layout examples of the pad PD and the wiring line M6 will be described.

In all of a first layout example (FIGS. 24 and 25), a second layout example (FIGS. 26 and 27), a third layout example (FIGS. 28 and 29), and a fourth layout example (FIGS. 30 and 31), a plurality of pads PD are arranged along the chip side CH of the semiconductor device CP, and the wiring line M6 (M6*a*) extends below the plurality of pads PD.

First, the first layout example will be described with reference to FIGS. 24 and 25.

Figure 24:
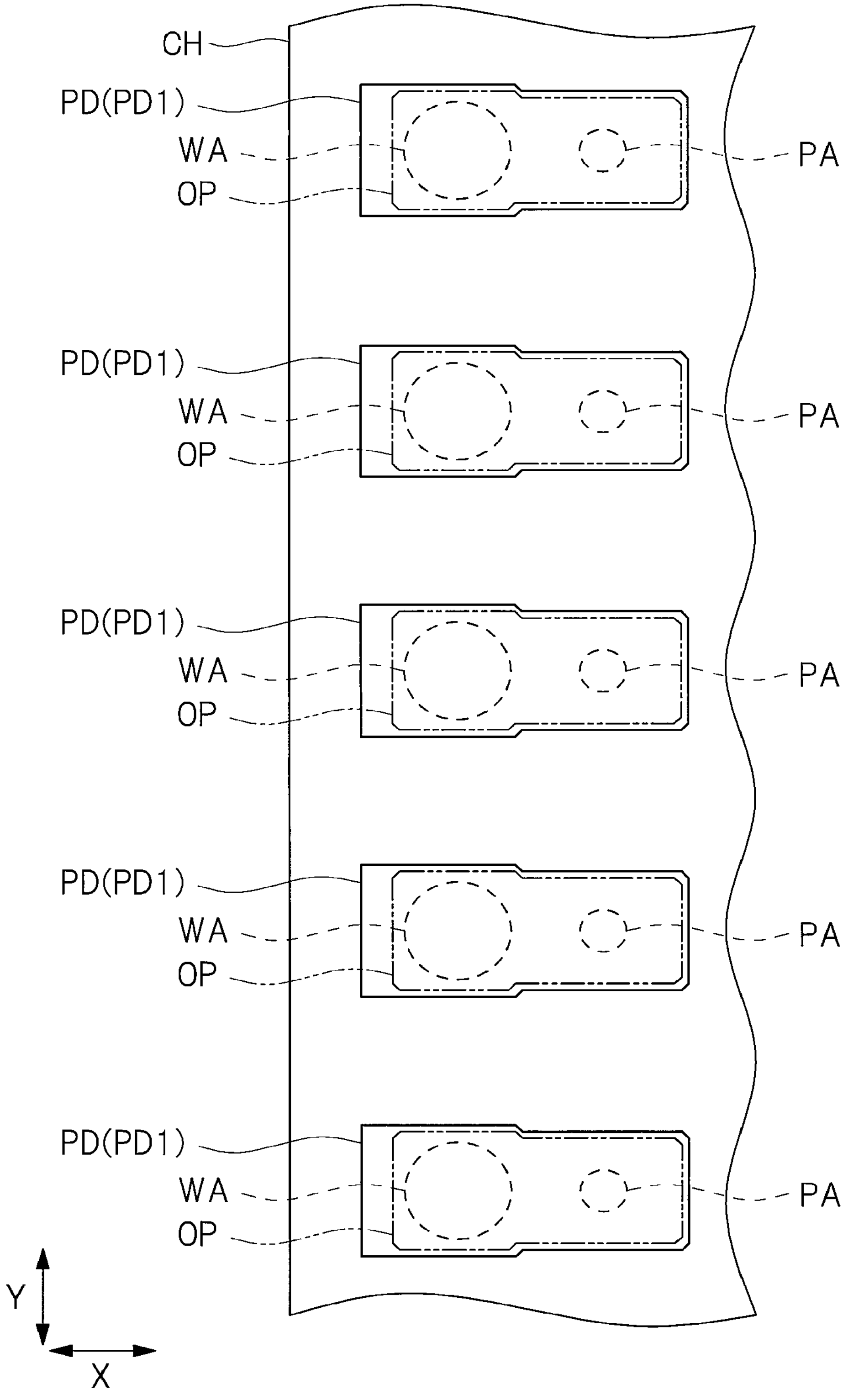
FIG. 24 is a plan view of the principle part of the semiconductor device according to one embodiment.
Figure 25:
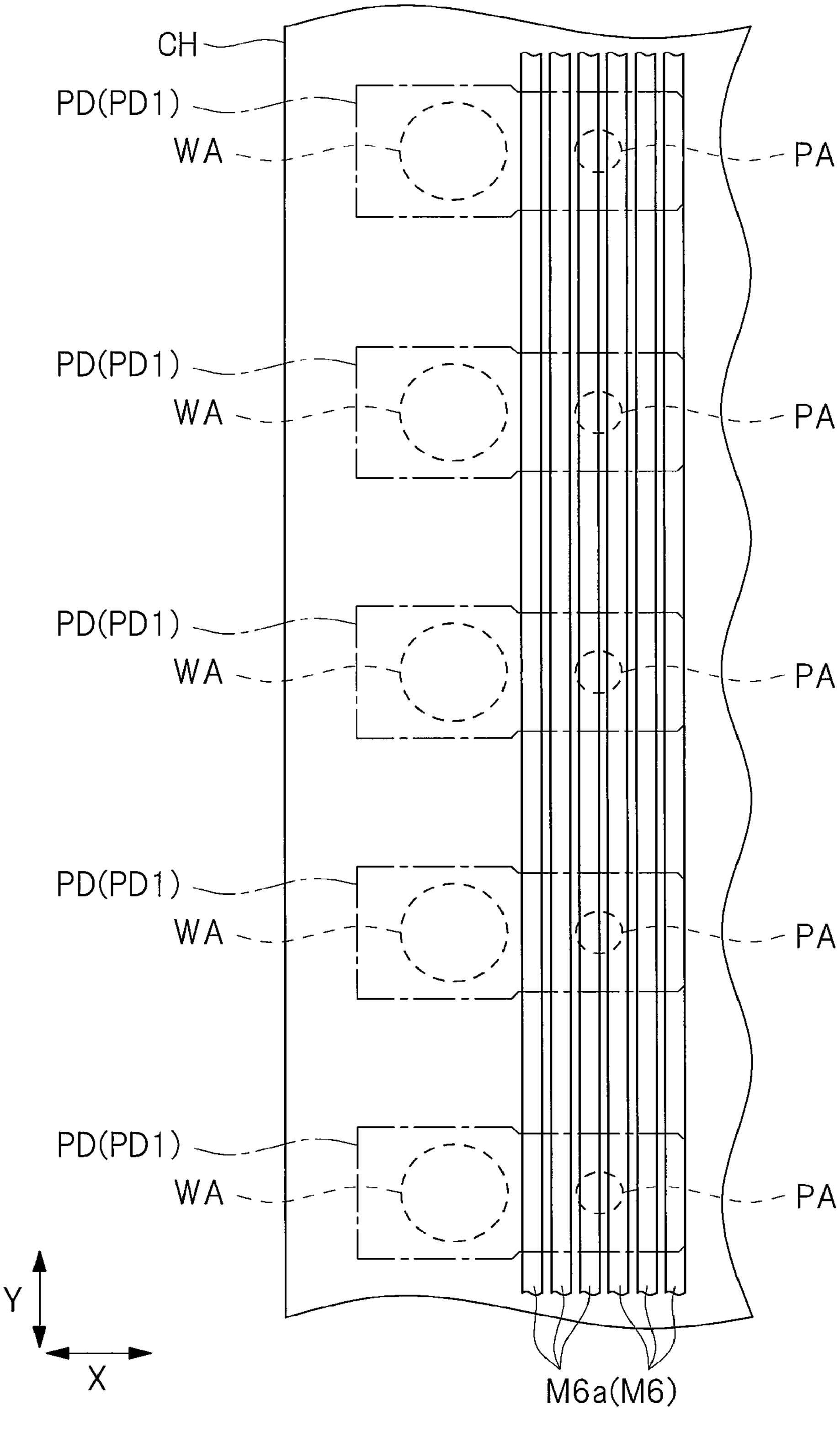
FIG. 25 is a plan view of the principle part of the semiconductor device according to one embodiment.

Each of FIGS. 24 and 25 is a plan view of a principle part of the semiconductor device CP according to the present embodiment, and shows the first layout example of the pads PD and the wiring lines M6.

FIG. 24 shows the plurality of pads PD arranged along the chip side CH of the semiconductor device CP but does not show the wiring line M6. FIG. 25 shows the same plane region as that in FIG. 24, and shows the plurality of pads PD arranged along the chip side CH of the semiconductor device CP and the wiring line M6 (M6*a*) passing below the plurality of pads PD. In FIGS. 24 and 25, a reference symbol CH denotes one side of the four sides making up the periphery of the upper surface of the semiconductor chip CP, and this one side is referred to as chip side CH. The X and Y directions shown in FIGS. 24 to 31 are directions parallel to the upper surface of the semiconductor chip CP, the Y direction is a direction along the chip side CH, that is, a direction parallel to the chip side CH, and the X direction is a direction intersecting the Y direction, more specifically, a direction perpendicular to the Y direction.

In the case of FIGS. 24 and 25, the plurality of pads PD are arranged (arrayed) along the chip side CH on the upper surface of the semiconductor chip CP. The plurality of pads PD lined along the chip side CH are oriented in the same direction as one another so that the wire bonding region WA is close to the chip side CH (i.e., close to the chip side CH) while the probe contact region PA is close to an opposite side of the wire bonding region WA (i.e., far from the chip side CH). As a result, in the case of FIGS. 24 and 25, the wire bonding regions WA of the plurality of pads PD are lined in a row (linearly) in the Y direction, and the probe contact regions PA of the plurality of pads PD are lined in a row (linearly) in the Y direction.

In the case of FIGS. 24 and 25, the plurality of wiring lines M6*a* extend in the Y direction along the chip side CH, and the plurality of wiring lines M6*a* are lined in the X direction. That is, the plurality of wiring lines M6*a* are in parallel to one another along the chip side CH, and each of the plurality of wiring lines M6*a* linearly extends along the chip side CH. The plurality of wiring lines M6*a* pass (extend) below the plurality of pads PD that are lined along the chip side CH, but do not extend immediately below the wire bonding region WA of each pad PD.

Also in the case of FIGS. 24 and 25, the region immediately below the wire bonding region WA of each pad PD is used as the arrangement prohibited region for the wiring line M6, while the region immediately below the probe contact region PA of each pad PD is used as the arrangement allowed region for the wiring line M6. These usages are also common to FIGS. 26 to 31 described later. Therefore, in all of FIGS. 24 to 31, no wiring line M6 is arranged immediately below the wire bonding region WA of each pad PD.

In the case of FIGS. 24 and 25, in a plan view, the plurality of wiring lines M6*a* pass below a region not including the wire bonding region WA of each pad PD but including the probe contact region PA of the same. In other words, in the case of FIGS. 24 and 25, all of the wire bonding regions WA of the plurality of pads PD are lined in a row along the chip side CH, and the plurality of wiring lines M6 linearly extend along (are in parallel to) the chip side CH at a position closer to the probe contact region PA than the lined wire bonding regions WA. Therefore, the wiring line M6*a* is arranged immediately below the probe contact region PA of each pad PD.

Subsequently, the second layout example will be described with reference to FIGS. 26 and 27.

Figure 26:
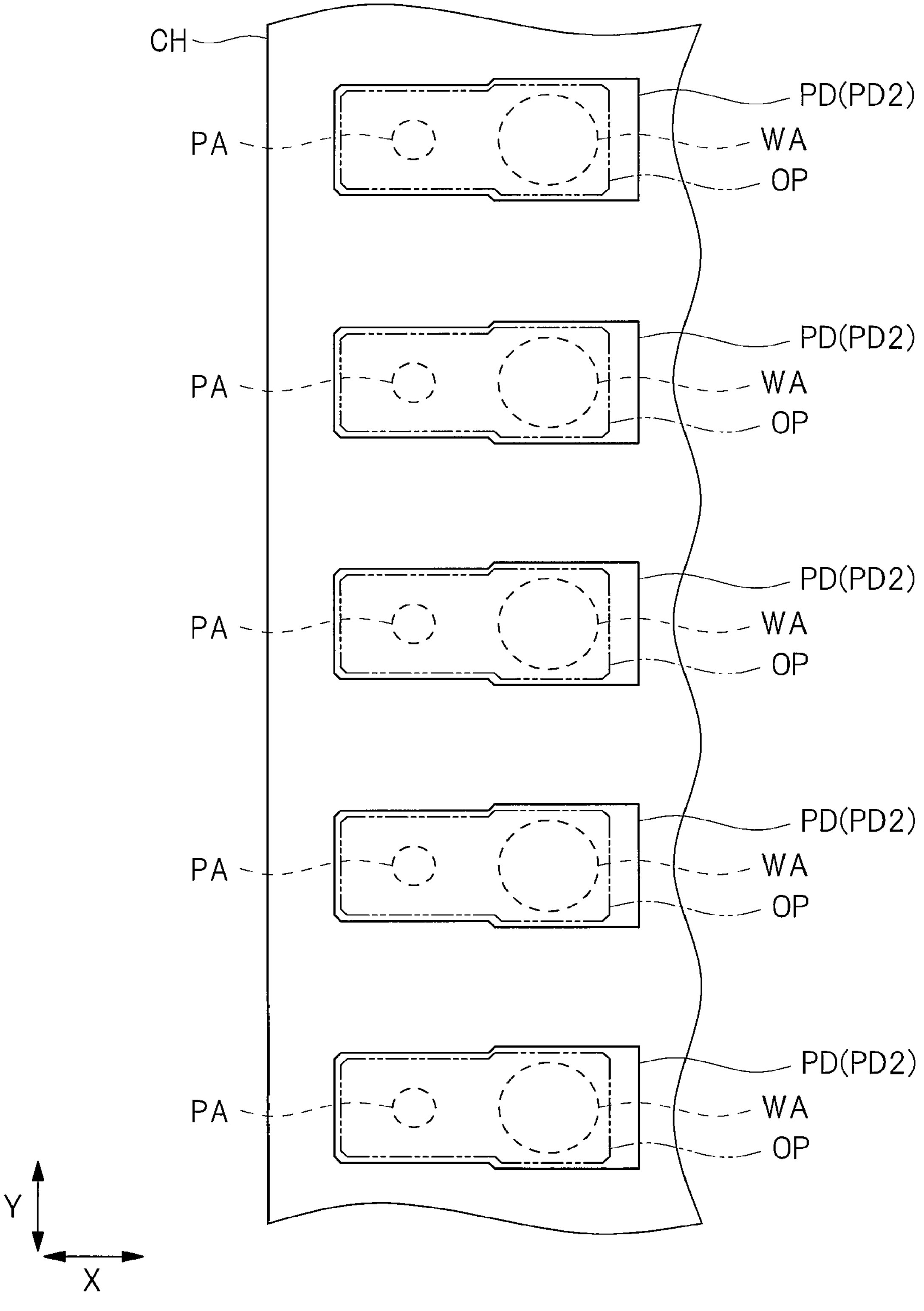
FIG. 26 is a plan view of the principle part of the semiconductor device according to one embodiment.
Figure 27:
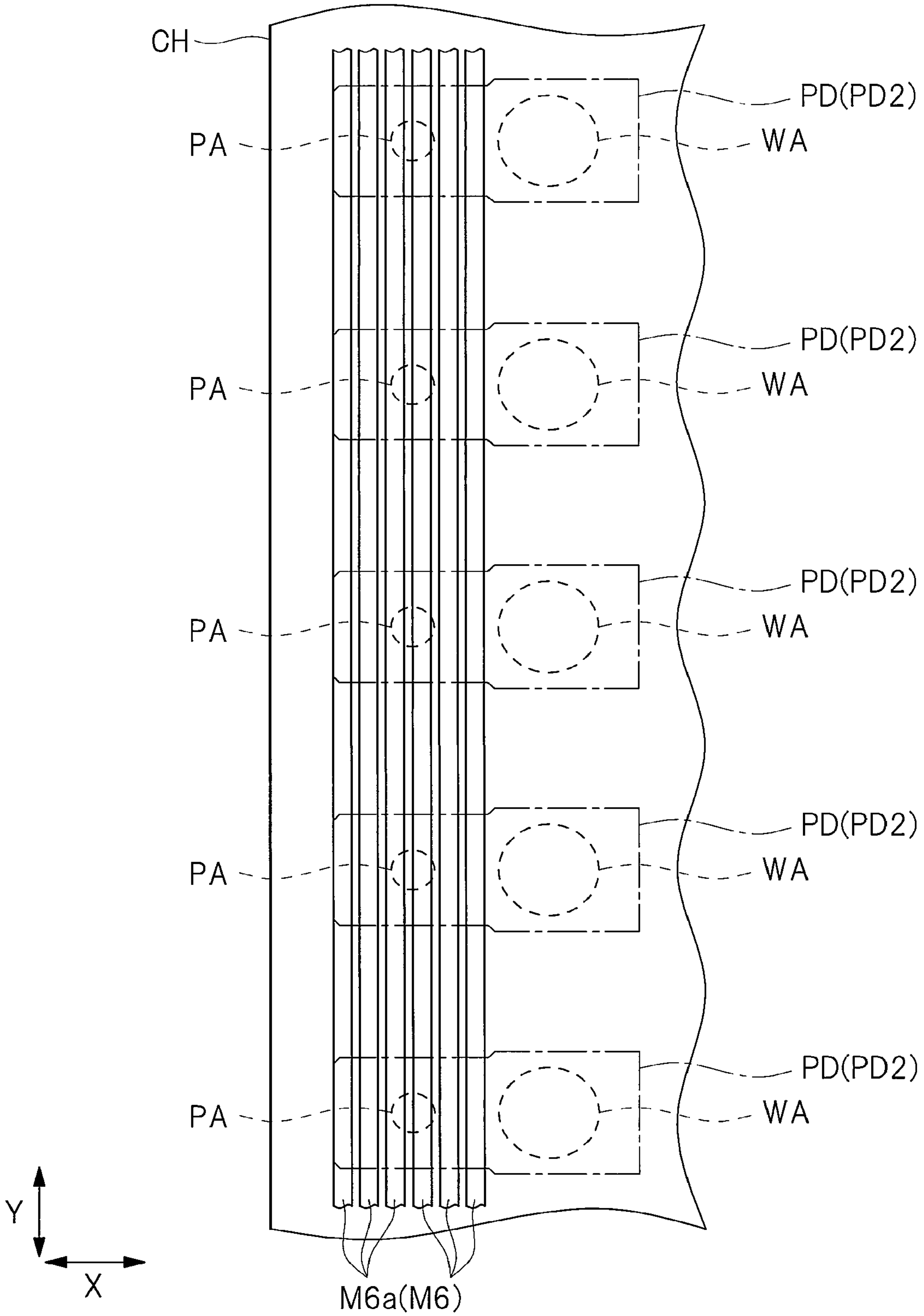
FIG. 27 is a plan view of the principle part of the semiconductor device according to one embodiment.

Each of FIGS. 26 and 27 is a plan view of a principle part of the semiconductor device CP according to the present embodiment, and shows the second layout example of the pads PD and the wiring lines M6. FIGS. 26 and 27 correspond to FIGS. 24 and 25, respectively.

The second layout example shown in FIGS. 26 and 27 is different from the first layout example shown in FIGS. 24 and 25 in that the orientation of the pad PD of FIGS. 26 and 27 reverses. That is, in the case of FIGS. 26 and 27, the plurality of pads PD are arranged (arrayed) along the chip side CH on the upper surface of the semiconductor chip CP so that the pads PD are oriented in the same direction as one another while the probe contact region PA is close to the chip side CH but the wire bonding region WA is opposite to the wire bonding region WA. Therefore, also in the case of FIGS. 26 and 27, the wire bonding regions WA of the plurality of pads PD are lined in a row (linearly) in the Y direction, and the probe contact regions PA of the plurality of pads PD are also lined in a row (linearly) in the Y direction. However, while the wire bonding region WA is close to the chip side CH but the probe contact region PA is far from the chip side CH in the case of FIGS. 24 and 25, the probe contact region PA is close to the chip side CH but the wire bonding region WA is far from the chip side CH in the case of FIGS. 26 and 27.

Also in the case of FIGS. 26 and 27, the plurality of wiring lines M6*a* extend in the Y direction along the chip side CH, and the plurality of wiring lines M6*a* are lined in the X direction. In other words, the plurality of wiring lines M6*a* extend in parallel to the chip side CH, and each of the plurality of wiring lines M6*a* linearly extends along the chip side CH. The plurality of wiring lines M6*a* pass (extend) below the plurality of pads PD lined along the chip side CH, but do not extend immediately below the wire bonding region WA of each pad PD.

Also in the case of FIGS. 26 and 27, in a plan view, the plurality of wiring lines M6*a* pass in the region not including the wire bonding region WA of each pad PD but including the probe contact region PA of the same. In other words, also in the case of FIGS. 26 and 27, while the wire bonding regions WA of the plurality of pads PD are lined in a row along the chip side CH, the plurality of wiring lines M6*a* linearly extend along (are in parallel to) the chip side CH at a position closer to the probe contact regions PA than the lined wire bonding region WA. Therefore, the wiring line M6*a* is arranged immediately below the probe contact region PA of each pad PD.

In the first layout example shown in FIGS. 24 and 25 and the second layout example shown in FIGS. 26 and 27, the plurality of wiring lines M6*a* passing below the pads PD extend along the chip side CH, and therefore, the resistance of the wiring lines M6*a* can be reduced. For example, the resistance of the wiring lines M6*a* can be smaller in the first layout example (FIGS. 24 and 25) and the second layout example (FIGS. 26 and 27) in which the wiring lines M6*a* passing below the pads PD linearly extend than a case in which the wiring lines M6*a* passing below the pads PD extends to wind. In this manner, the performance of the semiconductor device can be improved.

Subsequently, the third layout example will be described with reference to FIGS. 28 and 29.

Figure 28:
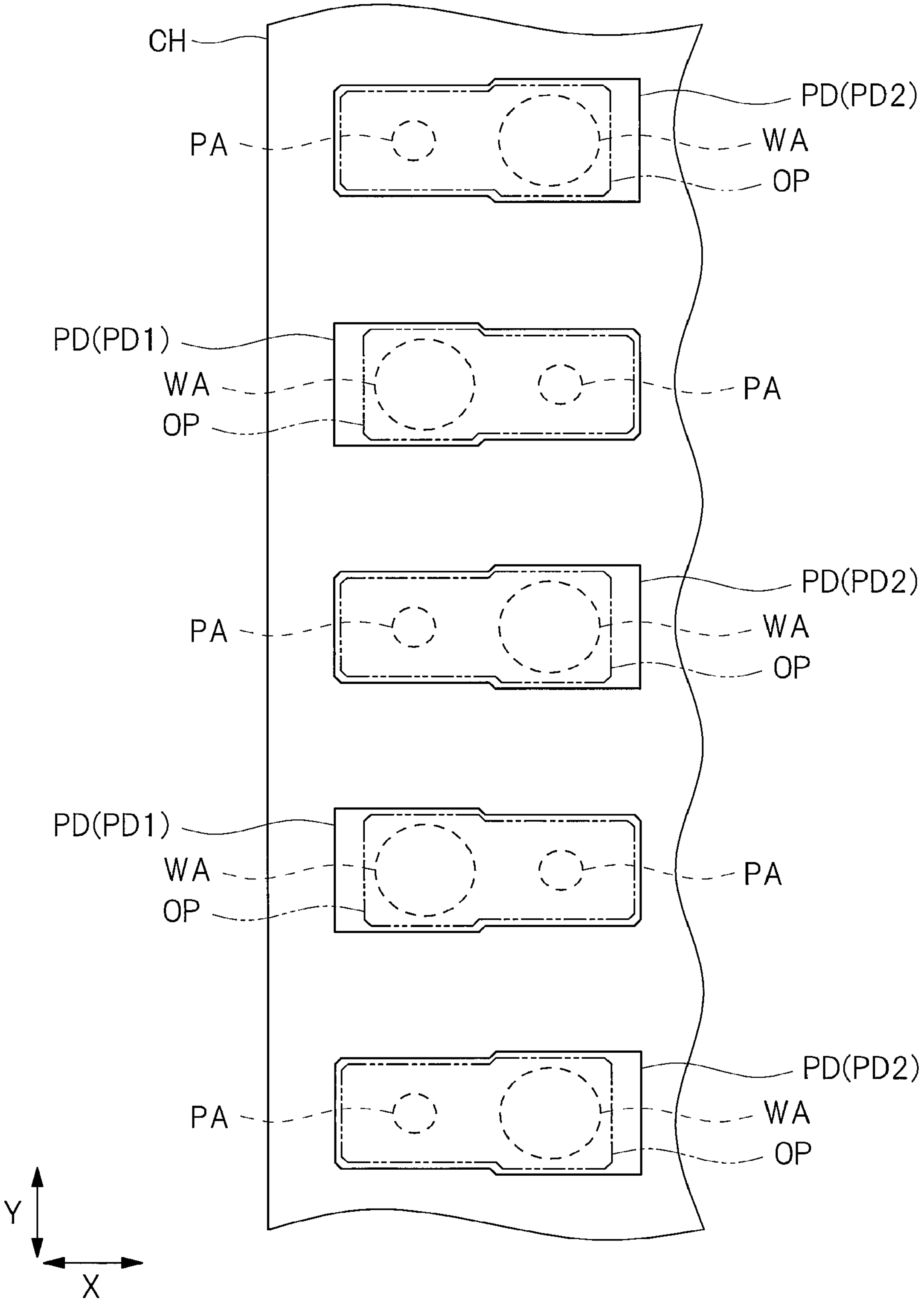
FIG. 28 is a plan view of the principle part of the semiconductor device according to one embodiment.
Figure 29:
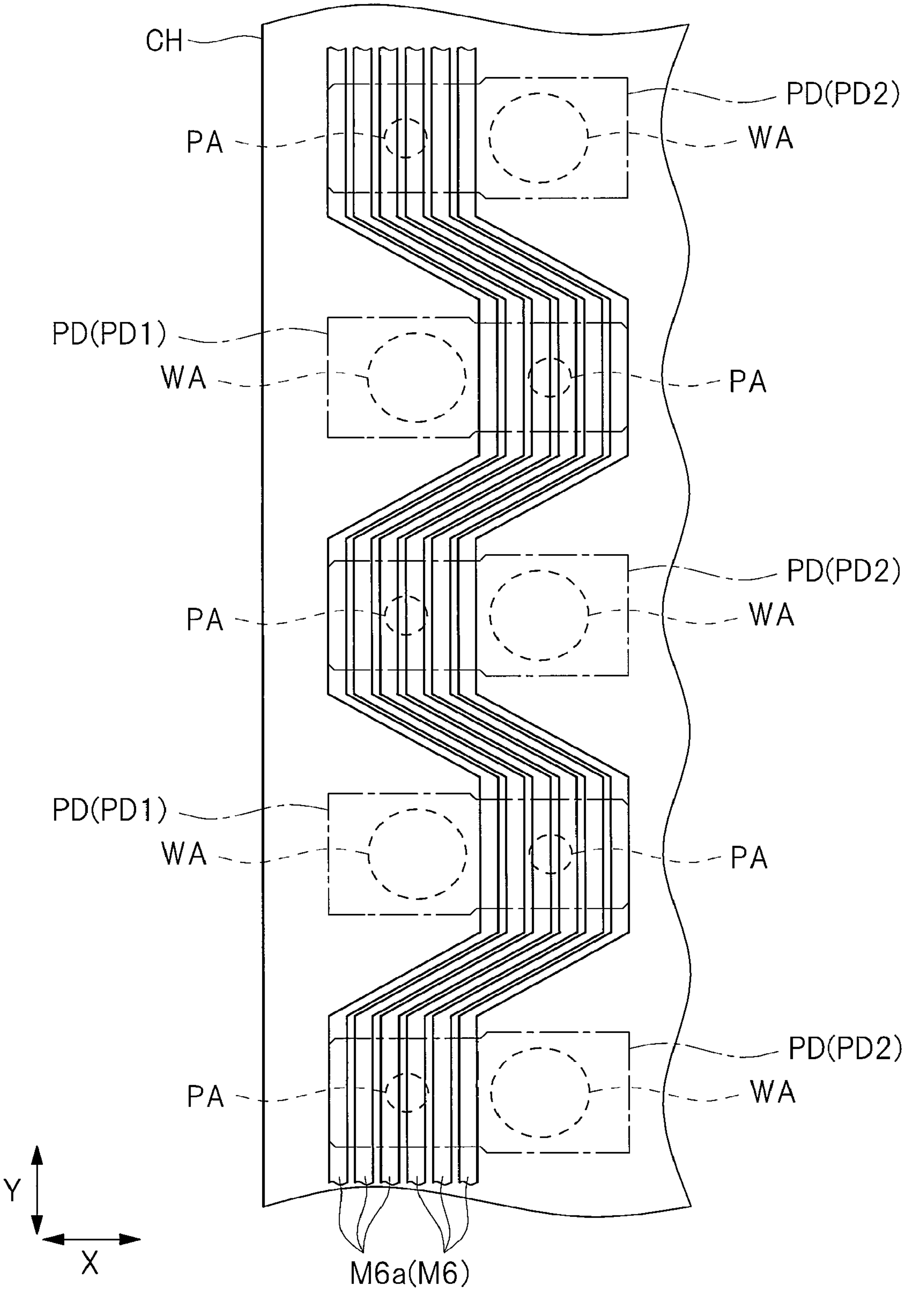
FIG. 29 is a plan view of the principle part of the semiconductor device according to one embodiment.

Each of FIGS. 28 and 29 is a plan view of a principle part of the semiconductor device CP according to the present embodiment, and shows the third layout example of the pads PD and the wiring lines M6. FIGS. 28 and 29 correspond to FIGS. 24 and 25, respectively.

The third layout example shown in FIGS. 28 and 29 is different mainly in the orientations of the pads PD from the first layout example shown in FIGS. 24 and 25 and the second layout example shown in FIGS. 26 and 27. That is, in the case of FIGS. 28 and 29, the plurality of pads PD are arranged (arrayed) along the chip CH on the upper surface of the semiconductor device CP so that the respective orientations of the pads PD are not in the same direction as one another and so as to include mixture of two types of pads PD1 and PD2 whose orientations are opposite to each other. That is, the plurality of pads PD lined along the chip CH are formed of mixture of the pad PD1 having the wire bonding region WA close to the chip side CH and the probe contact region PA opposite to the wire bonding region WA and the pad PD2 having the probe contact region PA close to the chip side CH and the wire bonding region WA opposite to the probe contact region PA. The pads PD1 and pads PD2 are lined, for example, alternately along the chip side CH.

In this case, the pad PD having the wire bonding region WA close to the chip side CH and the probe contact region PA far from the chip side CH is denoted by a reference symbol PD1 and is referred to as pad PD1. And, the pad PD having the probe contact region PA close to the chip side CH and the wire bonding region WA far from the chip side CH is denoted by a reference symbol PD2 and is referred to as pad PD2.

In the case of FIGS. 28 and 29, the plurality of pads PD lined along the chip CH are formed of mixture of the pad PD1 having the wire bonding region WA closer to the chip side CH than the probe contact region PA and the pad PD2 having the probe contact region PA closer to the chip side CH than the wire bonding region WA. On the other hand, in the case of FIGS. 24 and 25, all of the plurality of pads PD lined along the chip CH are the pads PD1. In the case of FIGS. 26 and 27, all of the plurality of pads PD lined along the chip CH are the pads PD2.

In the case of FIGS. 28 and 29, the wire bonding region WA of the pad PD1 and the probe contact region PA of the pad PD2 of the plurality of pads PD lined along the chip CH are lined in a row (linearly) in the Y direction. And, the probe contact region PA of the pad PD1 and the wire bonding region WA of the pad PD2 of the plurality of pads PD lined along the chip CH are lined in a row (linearly) in the Y direction. Note that the row of the lines of the wire bonding region WA of the pad PD1 and the probe contact region PA of the pad PD2 is close to the chip side CH, while the row of the lines of the probe contact region PA of the pad PD1 and the wire bonding region WA of the pad PD2 is far from the chip side CH. Therefore, in the case of FIGS. 28 and 29, the wire bonding regions WA of the plurality of pads PD are lined into two rows along the chip side CH. And, on these two rows, the probe contact regions PA of the plurality of pads PD are also lined.

In the case of FIGS. 28 and 29, the plurality of wiring lines M6*a* extend along (are in parallel to) the chip side CH so that the plurality of wiring lines M6*a* do not linearly extend along the chip side CH but extend to wind. This is because the wire bonding regions WA of the plurality of pads PD are lined in two rows along the chip side CH, and therefore, it is required to extend the wiring lines M6 to wind as shown in FIG. 29 in order to extend the wiring lines M6*a* below the pads PD so as to avoid the wire bonding regions WA. Specifically, while the plurality of wiring lines M6*a* extend (pass) below the plurality of pads PD lined along the chip side CH, they do not extend immediately below the respective wire bonding regions WA of the pads PD but extend to wind so as to avoid the respective wire bonding regions WA of the pads PD in a plan view. Note that the wiring lines M6*a* are arranged immediately below the respective probe contact regions PA of the pads PD.

In the case of FIGS. 28 and 29, the plurality of wiring lines M6*a* passing below the pads PD do not linearly extend, and therefore, the case shown in FIGS. 24 and 25 and the case shown in FIGS. 26 and 27 are more advantageous than the case shown in FIGS. 28 and 29 from the viewpoint of reducing the resistance of the wiring lines M6*a*. On the other hand, while the wire bonding regions WA of the plurality of pads PD are lined in a row in the case shown in FIGS. 24 and 25 and the case shown in FIGS. 26 and 27, the wire bonding regions WA of the plurality of pads PD are lined in two rows in the case shown in FIGS. 28 and 29. Therefore, when the wires (BW) are connected to the plurality of pads PD, respectively, a distance between the wires (BW) can be made larger in the case shown in FIGS. 28 and 29 than the case shown in FIGS. 24 and 25 and the case shown in FIGS. 26 and 27, and thus, the wire bonding process is easily performed, and short circuit between the adjacent wires (BW) is easily prevented.

Subsequently, the fourth layout example will be described with reference to FIGS. 30 and 31.

Figure 30:
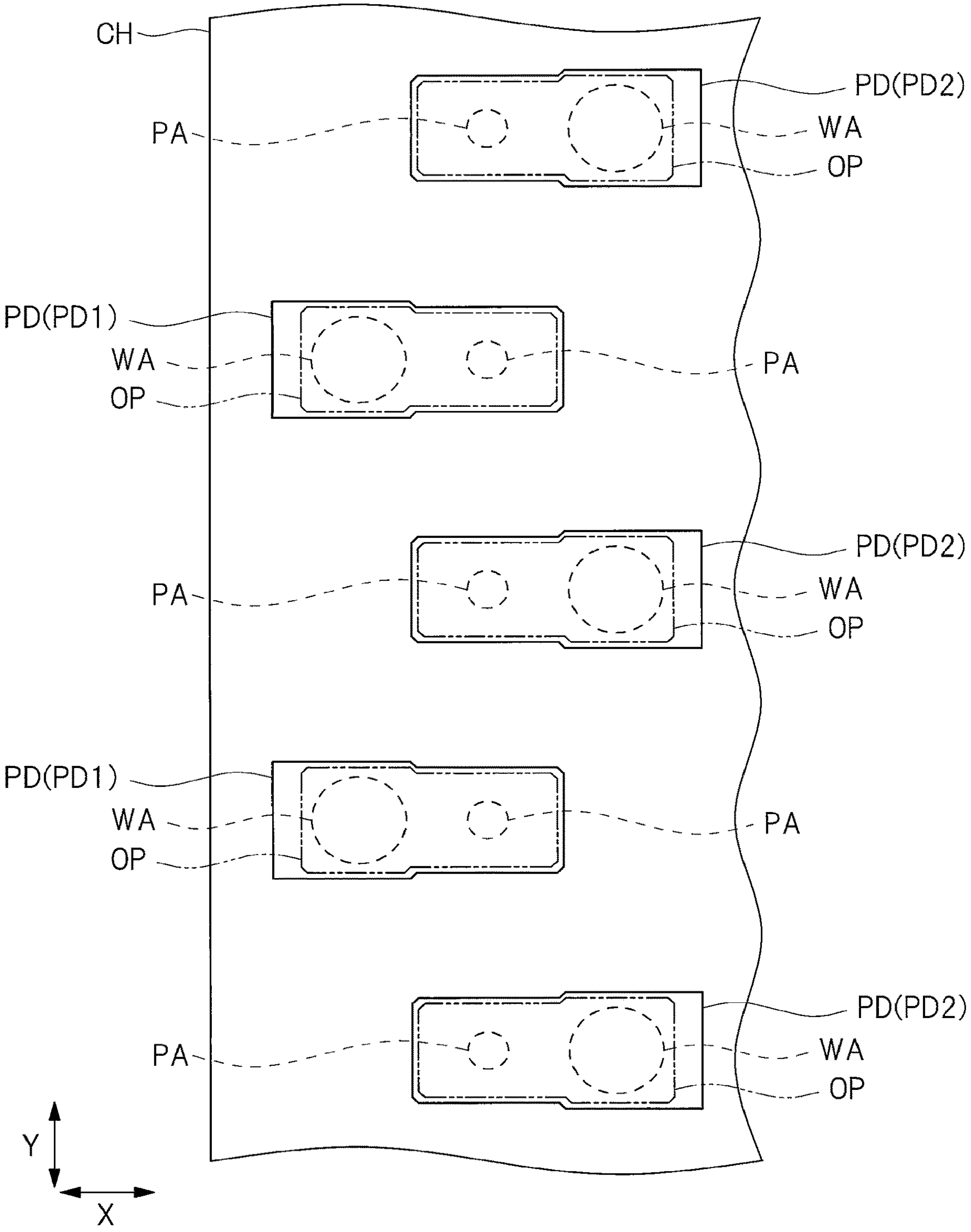
FIG. 30 is a plan view of the principle part of the semiconductor device according to one embodiment.
Figure 31:
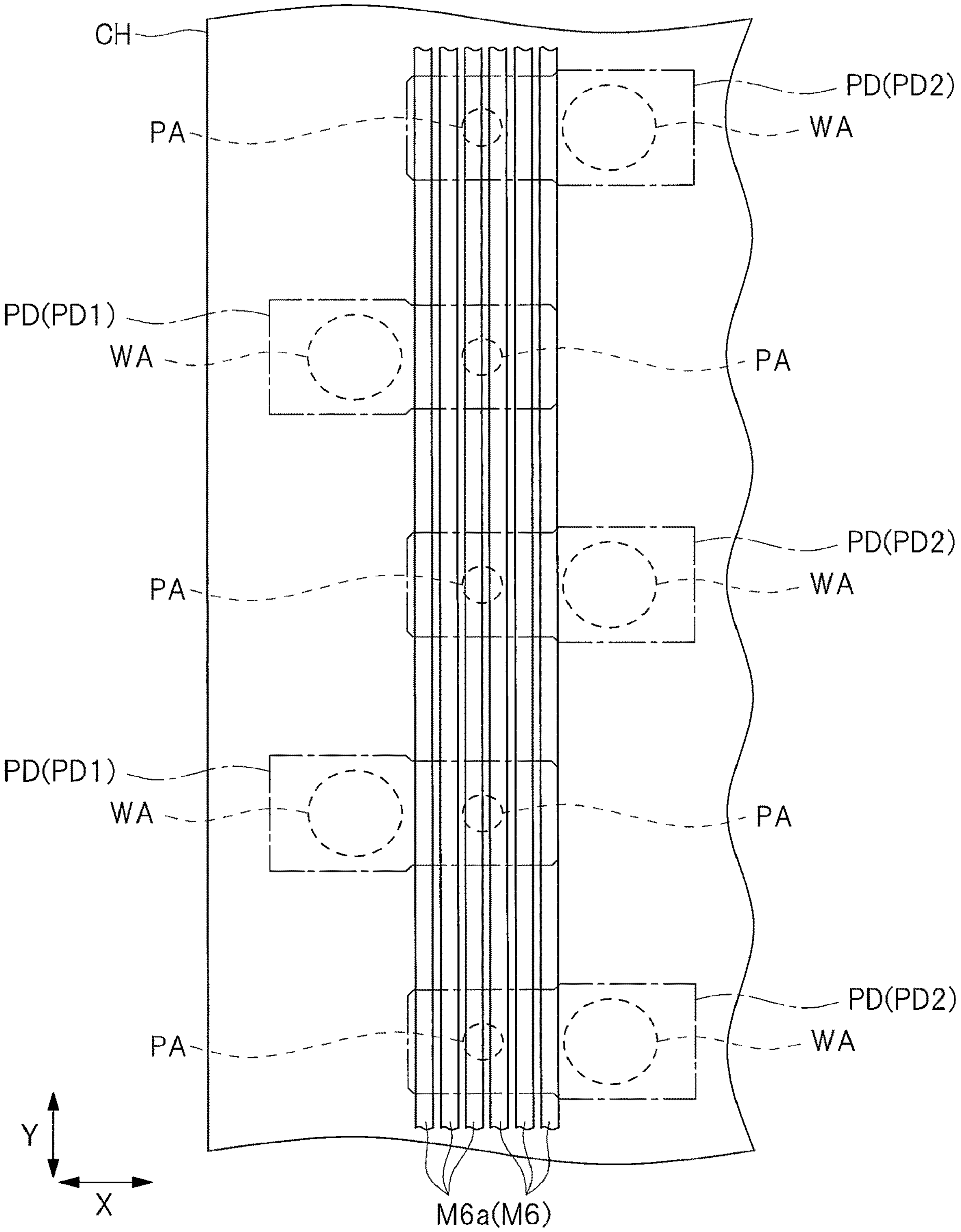
FIG. 31 is a plan view of the principle part of the semiconductor device according to one embodiment.

Each of FIGS. 30 and 31 is a plan view of a principle part of the semiconductor device CP according to the present embodiment, and shows the fourth layout example of the pads PD and the wiring lines M6. FIGS. 30 and 31 correspond to FIGS. 24 and 25, respectively.

Also in FIGS. 30 and 31 as similar to the case shown in FIGS. 28 and 29, the plurality of pads PD are arranged (arrayed) along the chip CH on the upper surface of the semiconductor device CP so that the respective orientations of the pads PD are not in the same direction as one another and so as to include mixture of two types of pads PD1 and PD2 whose orientations are opposite to each other. That is, also in the case of FIGS. 30 and 31, the plurality of pads PD lined along the chip CH are formed of mixture of the pad PD1 having the wire bonding region WA closer to the chip side CH than the probe contact region PA and the pad PD2 having the probe contact region PA closer to the chip side CH than the wire bonding region WA.

However, in the case of FIGS. 30 and 31, the probe contact region PA of the pad PD1 and the probe contact region PA of the pad PD2 of the plurality of pads PD lined along the chip CH are lined in a row (linearly) in the Y direction. Thus, in the case shown in FIGS. 30 and 31, the probe contact regions PA of the plurality of pads PD lined along the chip CH are lined in a row (linearly) in the Y direction. Meanwhile, the wire bonding regions WA of the pads PD1 of the plurality of pads PD lined along the chip CH are lined in a row (linearly) in the Y direction. The wire bonding regions WA of the pads PD2 of the plurality of pads PD lined along the chip CH are also lined in a row (linearly) in the Y direction. Thus, in the case of FIGS. 30 and 31, the wire bonding regions WA of the plurality of pads PD lined along the chip CH are lined in two rows. In the case of FIGS. 30 and 31, note that the row of the lines of the wire bonding regions WA of the pads PD1 is close to the chip side CH than the row of the lines of the probe contact region PA of the pads PD1 and the probe contact regions PA of the pads PD2, while the row of the lines of the wire bonding regions WA of the pads PD2 is far from the chip side CH than the row of the lines of the probe contact regions PA of the pads PD1 and the probe contact regions PA of the pads PD2.

Therefore, in the case shown in FIGS. 30 and 31, distances of the pads PD1 and pads PD2 from the chip side CH are different from each other so that the distance (interval) from the pad PD2 to the chip side CH is larger than the distance (interval) from the pad PD1 to the chip side CH. In other words, in the case shown in FIGS. 30 and 31, the pad PD1 and the pad PD2 are shifted from each other in a position in the X direction in a plan view.

In this manner, while the distance between the pad PD1 and the chip side CH and the distance between the pad PD2 and the chip side CH are substantially the same as each other in the case shown in FIGS. 28 and 29, the distance between the pad PD2 and the chip side CH is larger than the distance between the pad PD1 and the chip side CH in the case shown in FIGS. 30 and 31.

In the case shown in FIGS. 30 and 31, the plurality of wiring lines M6*a* extend along the chip side CH in the Y direction, and the plurality of wiring lines M6*a* are lined in the X direction. In other words, the plurality of wiring lines M6*a* are in parallel to the chip side CH, and each of the plurality of wiring lines M6 linearly a extends along the chip side CH. The plurality of wiring lines M6*a* pass (extend) below the plurality of pads PD lined along the chip side CH, but do not extend immediately below the respective wire bonding regions WA of the pads PD.

Also in the case shown in FIGS. 30 and 31, in a plan view, the plurality of wiring lines M6 pass below the region not including of the wire bonding region WA but including the probe contact region PA of each pad PD. In other words, in the case shown in FIGS. 30 and 31, while the plurality of probe contact regions RA of the plurality of pads PD are lined in a row along the chip side CH, the plurality of wiring lines M6 linearly extend along the chip side CH so as to pass below the lined probe contact regions PA. Therefore, the wiring lines M6 are arranged immediately below the respective probe contact regions PA of the pads PD.

Also in the case shown in FIGS. 30 and 31 (fourth layout example), each of the plurality of wiring lines M6*a* passing below the pads PD linearly extends along the chip side CH as similar to the case shown in FIGS. 24 and 25 (first layout example) and the case shown in FIGS. 26 and 27 (second layout example), and therefore, the resistance of the wiring lines M6*a* can be reduced. In this manner, the performance of the semiconductor device can be improved.

That is, in the first, second, and fourth layout examples, the probe contact regions PA of the plurality of pads PD lined along the chip side CH are lined in a row in the direction along the chip side CH (i.e., Y direction), and therefore, the wiring line M6*a* can linearly extend below the probe contact regions PA of the plurality of pads PD, so that the resistance of the wiring lines M6*a* can be reduced.

In the case shown in FIGS. 30 and 31, the wire bonding regions WA of the plurality of pads PD lined along the chip side CH are lined in two rows. Therefore, when the wires (BW) are connected to the plurality of pads PD, respectively, a distance between the wires (BW) can be made larger in the case shown in FIGS. 30 and 31 than the case shown in FIGS. 24 and 25 and the case shown in FIGS. 26 and 27, and thus, the wire bonding process is easily performed, and short circuit between the adjacent wires (BW) is easily prevented.

In this manner, the fourth layout example shown in FIGS. 30 and 31 can offer the advantages of the first to third layout examples.

In the fourth layout example shown in FIGS. 30 and 31, note that an area required for arranging the plurality of pads PD along the chip side CH is larger than those of the first to third layout examples. For this reason, from the viewpoint of reducing the plane dimension (area) of the semiconductor device as much as possible, the first to third layout examples are more advantageous than the fourth layout example shown in FIGS. 30 and 31.

As shown in the first, second, and third layout examples, when each of the plurality of wiring lines M6*a* passing below the pads PD linearly extends along the chip side CH, the resistance of the wiring lines M6*a* can be reduced. Accompanying effects resulting from this resistance reduction will be described with reference to FIGS. 32 and 33.

Figure 32:
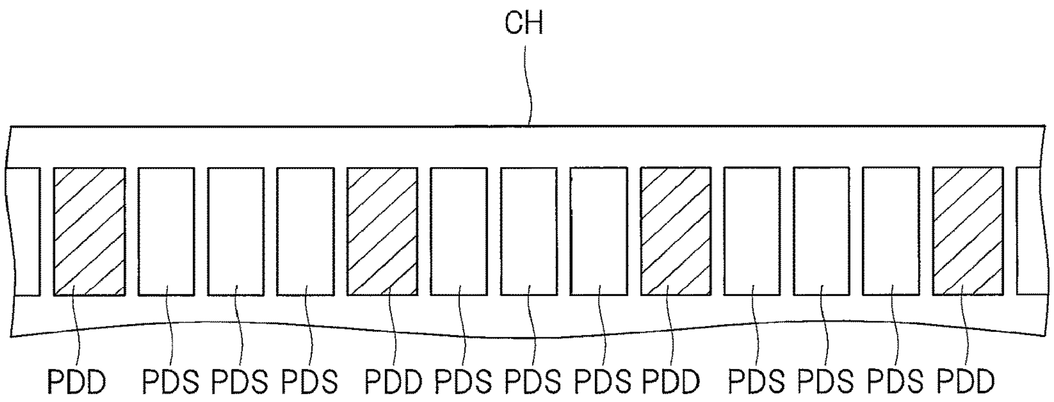
FIG. 32 is a plan view showing an example of arrangement of pad regions.
Figure 33:
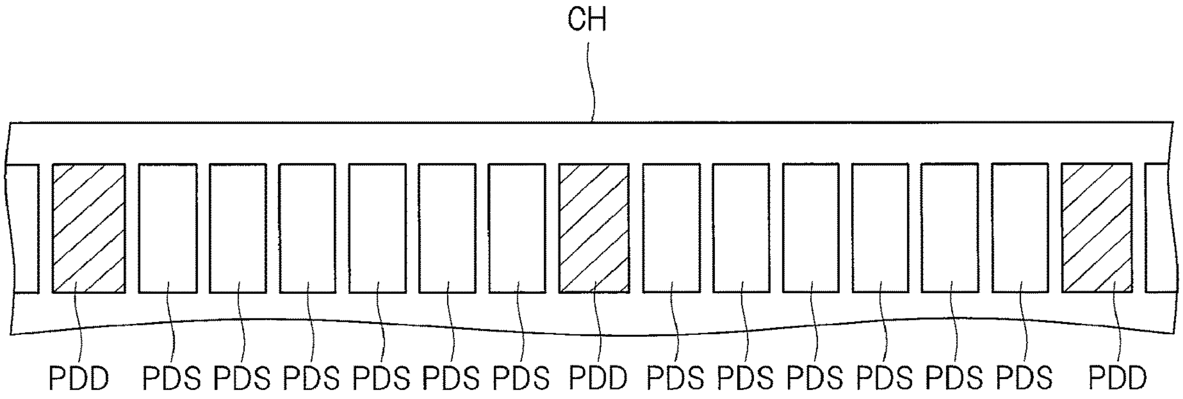
FIG. 33 is a plan view showing an example of arrangement of pad regions.

Each of FIGS. 32 and 33 is a plan view of an example of arrangement of pad regions. Each of FIGS. 32 and 33 shows an example of arrangement of signal pad regions PDS and power supply pad regions PDD. Although FIG. 32 is a plan view, hatching is added to the power supply pad regions PDD, but hatching is not added to the signal pad regions PDS in order to facilitate understanding of the plan view.

In this case, the signal pad region PDS corresponds to a region where a signal pad (PD) and an input/output circuit (I/O circuit) electrically connected to the signal pad are formed. The power supply pad region PDD corresponds to a region where a power supply pad (PD) an input/output circuit (I/O circuit) electrically connected to the power supply pad are formed. A signal is input from the pad (signal pad) of the signal pad region PDS into the semiconductor chip, or a signal is output from the pad (signal pad) of the signal pad region PDS to outside of the semiconductor chip. A power supply potential is supplied from the pad (power supply pad) of the power supply pad region PDD into the semiconductor chip.

In both cases of FIGS. 32 and 33, a plurality of the signal pad regions PDS and power supply pad regions PDD are arranged along the chip side CH of the semiconductor chip so that the power supply pad region PDD is arranged for each arrangement of a predetermined number of signal pad regions PDS. For example, the power supply pad region PDD is arranged for each arrangement of three signal pad regions PDS in the case of FIG. 32, and the power supply pad region PDD is arranged for each arrangement of six signal pad regions PDS in the case of FIG. 33. Note that the arrangement of FIG. 32 and that of FIG. 33 are examples, and the pad region arrangement is not limited to these examples. What is important is that the number (which is six in FIG. 33) of signal pad regions PDS arranged between the power supply pad regions PDD in FIG. 33 is larger than the number (which is three in FIG. 32) of signal pad regions PDS arranged between the power supply pad regions PDD in FIG. 32.

The pads (power supply pads) of the power supply pad regions PDD are electrically to each other through a power supply wiring line extending along the chip side CH of the semiconductor chip. According to the ESD (Electrostatic Discharge) standard, it is required to set a resistance (electric resistance) between adjacent power supply pads to be equal to or lower than a predetermined resistance value (e.g., 2Ω). Therefore, when the resistance (wiring line resistance) of the power supply wiring line is large, it is required to set an interval between the adjacent power supply pads to be small so that a length of the power supply wiring line electrically connecting the adjacent power supply pads is short.

On the other hand, when the resistance of the power supply wiring line (wiring line resistance) is small, the length of the power supply wiring line electrically connecting the adjacent power supply pads can be large, and therefore, the interval between the adjacent power supply pads can be made large. Thus, the small resistance of the power supply wiring line leads to the large interval between the adjacent power supply pads.

As described above, according to the present embodiment, the wiring line M6 is allowed to extend below the pad PD, and therefore, the wiring line M6 can be used as the power supply wiring line. A thickness of the wiring line M6 is large than each thickness of the wiring lines M1, M2, M3, M4, and M5, and therefore, the usage of the wiring line M6 as the power supply wiring line can reduce the resistance of the power supply wiring line (wiring resistance). Therefore, the present embodiment is applied so that the wiring line M6 (M6*a*) is extended below the pad PD and so that the wiring line M6 (M6*a*) is used as the power supply wiring line, so that the resistance of the power supply wiring line can be reduced, and thus, the interval between the adjacent power supply pads can be made large. For example, when not the wiring line M6 but the wiring line M5 is used as the power supply wiring line, it is required to set the interval between the adjacent power supply wiring lines to be small so that the power supply pad region PDD is arranged for each arrangement of three signal pad regions PDS as shown in FIG. 32. On the other hand, when the wiring line M6 is used as the power supply wiring line, the interval between the adjacent power supply wiring lines can be made large so that the power supply pad region PDD is arranged for each arrangement of six signal pad regions PDS as shown in FIG. 33. Therefore, the present embodiment is applied so that the wiring line M6 (M6*a*) is extended below the pad PD and so that the wiring line M6 (M6*a*) extending below the pad PD is used as the power supply wiring line, and therefore, the number of power supply pads can be reduced, which results in increase in the number of signal pads. In this manner, the number of signal pads in the semiconductor chip can be increased, which meets a demand for a multi-terminal configuration. In addition, the number of required power supply pads can be reduced, so that the plane dimension (plane area) of the semiconductor chip can be reduced.

In the foregoing, the invention made by the present inventors has been concretely described based on the embodiments. However, it is needless to say that the present invention is not limited to the foregoing embodiments, and various modifications and alterations can be made within the scope of the present invention.

EXPLANATION OF REFERENCE CHARACTERS

1 MISFET
AM1 Al-content conductive film
BD1, BD2 bonding material
BL solder ball
BLD connection terminal
BR1, BR2 barrier conductor film
BW wire
BW101, BW201 copper wire
CH chip side
CR crack
CP, CP101, CP201 semiconductor device
DL conductive land
DP die pad
GE gate electrode
IL1, IL2, IL3, IL4, IL5, IL6, IL7, IL8 interlayer insulating film
LD lead
M1, M2, M3, M4, M5, M6, M6*a*, M6*b* wiring line
MR1, MR2 sealing portion
OP opening
PA, PA101, PA201 probe contact region
PV insulating film
PC wiring board
PD, PD1, PD2, PD101, PD201 pad
PKG, PKG1, PKG2 semiconductor device
SB semiconductor substrate
SD source/drain region
SH opening
ST element isolating region
V1 plug
V2, V3, V4, V5, V6, V7 via
WA, WA101, WA201 wire bonding region

The invention claimed is:

1. A semiconductor device comprising:
a semiconductor chip having a pad;
a copper wire electrically connected to the pad of the semiconductor chip; and
a sealing resin portion sealing the semiconductor chip and the copper wire,
wherein the semiconductor chip includes:
a semiconductor substrate;
a plurality of semiconductor elements formed on a main surface of the semiconductor substrate; and
a wiring structure formed on the main surface of the semiconductor substrate, the wiring structure including a plurality of insulating films and a plurality of wiring layers,
wherein the plurality of wiring layers includes:
a first wiring layer; and
a second wiring layer,
wherein the first wiring layer is an uppermost layer among the plurality of wiring layers,
wherein the first wiring layer includes the pad,
wherein the pad has:
a first region for bonding the copper wire; and
a second region for bringing a probe into contact with the pad,
wherein the second wiring layer is one layer below the first wiring layer,
wherein the second wiring layer includes a first wiring line arranged immediately below the second region of the pad,
wherein the second wiring layer has no conductor pattern at a region overlapping with the first region of the pad, and
wherein an element region of the main surface of the semiconductor substrate is overlapped with each of the first region and the second region, the plurality of semiconductor elements being formed in the element region.

2. The semiconductor device according to claim 1,
wherein the plurality of wiring layers includes a third wiring layer,
wherein the third wiring layer is one layer below the second wiring layer, and
wherein the third wiring layer includes:
a second wiring line arranged immediately below the first region of the pad; and
a third wiring line arranged immediately below a region other than the first region of the pad.

3. The semiconductor device according to claim 2,
wherein the third wiring line is arranged immediately below the second region of the pad.

4. The semiconductor device according to claim 1,
wherein the first wiring line is a power supply wiring line or a ground wiring line.

5. The semiconductor device according to claim 1,
wherein, in the semiconductor chip, a plurality of the pads is arranged along a first side of an upper surface of the semiconductor chip, and
wherein the first wiring line extends below the plurality of pads.

6. The semiconductor device according to claim 5,
wherein the second regions of the plurality of pads are lined in a row in a direction along the first side, and
wherein the first wiring line linearly extends below the second regions of the plurality of pads.

7. The semiconductor device according to claim 6,
wherein the first regions of the plurality of pads are lined in a row in the direction along the first side.

8. The semiconductor device according to claim 6,
wherein the plurality of pads is formed of mixture of a first pad having the first region closer to the first side than the second region and a second pad having the second region closer to the first side than the first region, and
wherein a distance between the second pad and the first side is larger than a distance between the first pad and the first side.

9. The semiconductor device according to claim 5,
wherein the plurality of pads is formed of mixture of a first pad having the first region closer to the first side than the second region and a second pad having the second region closer to the first side than the first region.

10. A semiconductor device comprising:
a semiconductor substrate;
a plurality of semiconductor elements formed on a main surface of the semiconductor substrate; and
a wiring structure formed on the main surface of the semiconductor substrate, the wiring structure including a plurality of insulating films and a plurality of wiring layers,
wherein the plurality of wiring layers includes:
a first wiring layer; and
a second wiring layer,
wherein the first wiring layer is an uppermost layer among the plurality of wiring layers,
wherein the first wiring layer includes a pad,
wherein the pad has:
a first region for bonding the copper wire; and
a second region for bringing a probe into contact with the pad,
wherein the second wiring layer is one layer below the first wiring layer,
wherein the second wiring layer includes a first wiring line arranged immediately below the second region of the pad,
wherein the second wiring layer has no conductor pattern at a region overlapping with the first region of the pad, and
wherein an element region of the main surface of the semiconductor substrate is overlapped with each of the first region and the second region, the plurality of semiconductor elements being formed in the element region.

11. The semiconductor device according to claim 10,
wherein the plurality of wiring layers includes a third wiring layer,
wherein the third wiring layer is one layer below the second wiring layer, and
wherein the third wiring layer includes:
a second wiring line arranged immediately below the first region of the pad; and
a third wiring line arranged immediately below a region other than the first region of the pad.

12. The semiconductor device according to claim 11,
wherein the third wiring line is arranged immediately below the second region of the pad.

13. The semiconductor device according to claim 10,
wherein the wiring structure has a first insulating film having an opening at which the first region and the second region of the pad are exposed.

14. A method of manufacturing a semiconductor device comprising the steps of:
(a) preparing a semiconductor substrate;
(b) forming a plurality of semiconductor elements in an element region of a main surface of the semiconductor substrate;
(c) forming a wiring structure on the main surface of the semiconductor substrate, the wiring structure including a plurality of insulating films and a plurality of wiring layers,
wherein the plurality of wiring layers includes:
a first wiring layer; and
a second wiring layer, and
wherein the first wiring layer is an uppermost layer among the plurality of wiring layers;
(d) performing a probing check by bringing a probe into contact with a pad included in the first wiring layer; and
(e) electrically connecting a copper wire to the pad,
wherein the pad has:
a first region for bonding the copper wire; and
a second region for bringing the probe into contact with the pad,
wherein the second wiring layer is one layer below the first wiring layer,
wherein the second wiring layer includes a first wiring line arranged immediately below the second region of the pad,
wherein the second wiring layer has no conductor pattern in the same layer as a layer of the first wiring line is formed immediately below the first region of the pad, and
wherein the element region in which the plurality of semiconductor elements is formed is overlapped with each of the first region and the second region.

15. The method of manufacturing the semiconductor device according to claim 14,
wherein the plurality of wiring layers includes a third wiring layer, wherein the third wiring layer is one layer below the second wiring layer, and wherein the third wiring layer includes:

a second wiring line arranged immediately below the first region of the pad; and a third wiring line arranged immediately below a region other than the first region of the pad.

16. The method of manufacturing the semiconductor device according to claim 15, wherein the third wiring line is arranged immediately below the second region of the pad.

17. The method of manufacturing the semiconductor device according to claim 14, wherein, in the step (d), a vertical type probe card is used.

* * * * *